(12) United States Patent
Horibata et al.

(10) Patent No.: US 7,692,620 B2
(45) Date of Patent: Apr. 6, 2010

(54) DISPLAY

(75) Inventors: Hiroyuki Horibata, Gifu (JP); Michiru Senda, Yokohama (JP)

(73) Assignee: Sanyo Epson Imaging Devices Corp., Tokyo (JP)

( * ) Notice: Subject to any disclaimer, the term of this patent is extended or adjusted under 35 U.S.C. 154(b) by 1048 days.

(21) Appl. No.: 11/387,792

(22) Filed: Mar. 24, 2006

(65) Prior Publication Data

US 2006/0221043 A1     Oct. 5, 2006

(30) Foreign Application Priority Data

Mar. 25, 2005   (JP) .............................. 2005-087463

(51) Int. Cl.
*G09G 3/36*   (2006.01)
(52) U.S. Cl. ..................... 345/100; 345/98; 345/204; 348/569
(58) Field of Classification Search ................. 345/100, 345/98, 204; 348/569
See application file for complete search history.

(56) References Cited

U.S. PATENT DOCUMENTS

| | | | |
|---|---|---|---|
| 6,339,451 B1* | 1/2002 | Tults | ........................... 348/569 |
| 6,476,790 B1 | 11/2002 | Tanaka | |
| 6,552,709 B1 | 4/2003 | Yamaguchi | |
| 6,559,824 B1 | 5/2003 | Kubota et al. | |
| 6,813,332 B2 | 11/2004 | Nagao et al. | |
| 6,856,083 B2 | 2/2005 | Okuda | |
| 2001/0011987 A1 | 8/2001 | Kubota et al. | |
| 2003/0174118 A1* | 9/2003 | Sato et al. | .................... 345/100 |
| 2003/0184535 A1 | 10/2003 | Okuda | |
| 2003/0227433 A1* | 12/2003 | Moon | ......................... 345/100 |
| 2004/0189584 A1* | 9/2004 | Moon | ......................... 345/100 |

FOREIGN PATENT DOCUMENTS

| | | |
|---|---|---|
| EP | 1 498 871 A2 | 1/2005 |
| GB | 2 022 953 A | 12/1979 |
| JP | 8-220506 | 8/1996 |

(Continued)

OTHER PUBLICATIONS

European Search Report issued in European Patent Application No. EP 06 25 1178, mailed Oct. 18, 2007.

*Primary Examiner*—Amare Mengistu
*Assistant Examiner*—Premal Patel
(74) *Attorney, Agent, or Firm*—McDermott Will & Emery LLP

(57) ABSTRACT

A display capable of inhibiting a logic composition circuit from outputting a signal to a gate line or a drain line at unintentional timing is obtained. This display comprises a shift register circuit including a logic composition circuit portion constituted of a plurality of first conductive type transistors turned on with a first voltage supply source for receiving a first shift signal and a second shift signal and outputting a shift output signal by logically compositing the first shift signal and the second shift signal with each other. At least either a first shift register circuit portion or a second shift register circuit portion includes a reset transistor for resetting the voltage supply source of a node outputting the first shift signal or the second shift signal to a second voltage supply source not turning on the transistors of the logic composition circuit portion in response to a prescribed drive signal.

15 Claims, 18 Drawing Sheets

FOREIGN PATENT DOCUMENTS

| | | |
|---|---|---|
| JP | 2001-134229 | 5/2001 |
| JP | 2001-134246 | 5/2001 |
| JP | 2001-159877 | 6/2001 |
| JP | 2001-216796 | 8/2001 |
| JP | 2002-006791 | 1/2002 |
| JP | 2004-133026 | 4/2004 |
| JP | 2004-226429 | 8/2004 |
| JP | 2004-264361 | 9/2004 |
| JP | 2005-017908 | 1/2005 |
| JP | 2005-017937 | 1/2005 |
| JP | 2005-017969 | 1/2005 |
| JP | 2005-017973 | 1/2005 |
| JP | 2005-62397 | 3/2005 |

* cited by examiner

DISPLAY

CROSS-REFERENCE TO RELATED APPLICATIONS

The priority application number JP2005-87463 upon which this patent application is based is hereby incorporated by reference.

BACKGROUND OF THE INVENTION

1. Field of the Invention

The present invention relates to a display, and more particularly, it relates to a display comprising a shift register circuit.

2. Description of the Background Art

A display comprising a shift register circuit is known in general, as disclosed in Japanese Patent Laying-Open No. 2005-17973, for example.

FIG. 18 is a circuit diagram for illustrating the circuit structure of a shift register circuit driving drain lines of the exemplary conventional display disclosed in the aforementioned Japanese Patent Laying-Open No. 2005-17973. Referring to FIG. 18, the shift register circuit driving the drain lines of the exemplary conventional display is provided with a plurality of stages of shift register circuit portions 1001 to 1003. The first-stage shift register circuit portion 1001 is constituted of a precedent first circuit portion 1001a and a subsequent second circuit portion 1001b. The first circuit portion 1001a of the first-stage shift register circuit portion 1001 includes n-channel transistors NT501 to NT503, a diode-connected n-channel transistor NT504 and a capacitor C501. The second circuit portion 1001b of the first-stage shift register circuit portion 1001 includes n-channel transistors NT505 to NT507, a diode-connected n-channel transistor NT508 and a capacitor C502. The n-channel transistors NT501 to NT508 are hereinafter referred to as transistors NT501 to NT508 respectively.

In the first circuit portion 1001a, the drain and the source of the transistor NT501 are connected to a higher voltage supply source VDD and the drain of the transistor NT502 respectively. The gate of the transistor NT501 is connected to a node ND501. The source of the transistor NT502 is connected to a lower voltage supply source VBB. The gate of the transistor NT502 is supplied with a start signal ST. The transistor NT503 is connected between the node ND501 connected with the gate of the transistor NT501 and the lower voltage supply source VBB. The gate of the transistor NT503 is supplied with the start signal ST. The capacitor C501 is connected between the gate and the source of the transistor NT501. The diode-connected transistor NT504 is connected between the node ND501 connected with the gate of the transistor NT501 and a clock signal line CLK1.

In the second circuit portion 1001b, the drain of the transistor NT505 is connected to the higher voltage supply source VDD. The source of the transistor NT505 is connected with the drain of the transistor NT506. The gate of the transistor NT505 is connected to a node ND503. The source of the transistor NT506 is connected to the lower voltage supply source VBB. The gate of the transistor NT506 is connected to a node ND502 provided between the transistors NT501 and NT502 of the first circuit portion 1001a.

The transistor NT507 is connected between the node ND503 connected with the gate of the transistor NT505 and the lower voltage supply source VBB. The gate of the transistor NT507 is connected to the node ND502 of the first circuit portion 1001a. The capacitor C502 is connected between the gate and the source of the transistor NT505. The diode-connected transistor NT508 is connected between the node ND503 connected with the gate of the transistor NT505 and the clock signal line CLK1.

The first-stage shift register circuit portion 1001 outputs a shift output signal SR501 from a node ND504 (output node) provided between the source of the transistor NT505 and the drain of the transistor NT506. The second- and third-stage shift register circuit portions 1002 and 1003 have circuit structures similar to that of the first-stage shift register circuit portion 1001. In other words, the second-stage shift register circuit portion 1002 includes first and second circuit portions 1002a and 1002b having circuit structures similar to those of the first and second circuit portions 1001a and 1001b of the first-stage shift register circuit portion 1001 respectively. The first circuit portion 1002a of the second-stage shift register circuit portion 1002 is connected to the node ND504 (output node) of the second circuit portion 1001b of the first-stage shift register circuit portion 1001. Thus, the first circuit portion 1002a of the second-stage shift register circuit portion 1002 receives the shift output signal SR501 from the first-stage shift register circuit portion 1001. A clock signal line (CLK2) supplying a clock signal CLK2 different in timing from a clock signal CLK1 supplied to the first-stage shift register circuit portion 1001 is connected to the second-stage shift register circuit portion 1002. The second-stage shift register circuit portion 1002 outputs a shift output signal SR502 from a node ND504 (output node) of the second circuit portion 1002b.

The third-stage shift register circuit portion 1003 includes first and second circuit portions 1003a and 1003b having circuit structures similar to those of the first and second circuit portions 1001a and 1001b of the first-stage shift register circuit portion 1001 respectively. The first circuit portion 1003a of the third-stage shift register circuit portion 1003 is connected to the node ND504 (output node) of the second circuit portion 1002b of the second-stage shift register circuit portion 1002. Thus, the first circuit portion 1003a of the third-stage shift register circuit portion 1003 receives the shift output signal SR502 from the second-stage shift register circuit portion 1002. The clock signal line (CLK1) supplying the same clock signal CLK1 as that supplied to the first-stage shift register circuit portion 1001 is connected to the third-stage shift register circuit portion 1003. The third-stage shift register circuit portion 1003 outputs a shift output signal SR503 from a node ND504 (output node) of the second circuit portion 1003b. This shift output signal SR503 is input in a first circuit portion of a subsequent shift register circuit portion (not shown).

The nodes ND504 of the shift register circuit portions 1001 to 1003 are connected to a horizontal switch 1100. More specifically, the horizontal switch 1100 includes a plurality of transistors NT510 to NT512. The gates of the transistors NT510 to NT512 are connected to the nodes ND504 of the first- to third-stage shift register circuit portions 1001 to 1003 respectively. Thus, the shift output signals SR501 to SR503 from the first- to third-stage shift register circuit portions 1001 to 1003 are input in the gates of the transistors NT510 to NT512 of the horizontal switch 1100 respectively. The drains of the transistors NT510 to NT512 are connected to drain lines respectively. The sources of the transistors NT510 to NT512 are connected to a video signal line Video.

According to the aforementioned structure, the shift register circuit driving the drain lines of the exemplary conventional display inputs the shift output signals SR501 to SR503 shifted in timing for rising to high levels from each other in the gates of the transistors NT510 to NT512 of the horizontal switch 1100 respectively. Thus, the transistors NT510 to NT512 of the horizontal switch 1100 sequentially enter ON-states, whereby the display sequentially outputs video signals from the video signal line Video to the drain lines.

In the exemplary conventional display comprising the shift register circuit shown in FIG. 18, however, the voltage supply sources of the nodes ND504, i.e., the output nodes of the shift register circuit portions 1001 to 1003 disadvantageously reach instable levels between the higher and lower voltage supply sources VDD and VBB before the shift register circuit supplied with the higher and lower voltage supply sources VDD and VBB starts scanning. Thus, the transistors NT510 to NT512 of the horizontal switch 1100 having the gates connected to the nodes ND504 may disadvantageously enter ON-states at unintentional timing. In this case, the shift register circuit disadvantageously outputs the video signals from the video signal line Video to the drain lines through the ON-state transistors NT510 to NT512 at unintentional timing.

SUMMARY OF THE INVENTION

The present invention has been proposed in order to solve the aforementioned problem, and an object of the present invention is to provide a display capable of inhibiting a logic composition circuit portion from outputting a signal to a gate line or a drain line at unintentional timing.

In order to attain the aforementioned object, a display according to an aspect of the present invention comprises a shift register circuit including a first shift register circuit portion outputting a first shift signal, a second shift register circuit portion arranged subsequently to the first shift register circuit portion for outputting a second shift signal and a logic composition circuit portion, constituted of a plurality of first conductive type transistors turned on with a first voltage supply source, receiving the first shift signal and the second shift signal and outputting a shift output signal by logically compositing the first shift signal and the second shift signal with each other. At least either the first shift register circuit portion or the second shift register circuit portion includes a reset transistor for resetting the voltage supply source of a node outputting the first shift signal or the second shift signal to a second voltage supply source not turning on the transistors of the logic composition circuit portion in response to a prescribed drive signal.

According to this aspect, as hereinabove described, at least either the first or second shift register circuit portion is formed to include the reset transistor for resetting the voltage supply source of the node outputting the first or second shift signal to the second voltage supply source not turning on the transistors of the logic composition circuit portion in response to the prescribed drive signal as hereinabove described, whereby the display can fix at least either the first shift signal or the second shift signal output to the logic composition circuit portion to the second voltage supply source not turning on the transistors of the logic composition circuit portion by inputting the prescribed drive signal and resetting the voltage supply source of the node outputting the first or second shift signal to the second voltage supply source with the reset transistor after supplying power to the shift register circuit. Thus, the display, capable of fixing at least either the first shift signal or the second shift signal to the second voltage supply source not turning on the transistors of the logic composition circuit portion when inputting the first and second shift signals in the gates of two transistors of the logic composition circuit portion respectively and employing a signal output through the two transistors as the shift output signal obtained by logically compositing the first and second shift signals with each other, can hold at least one of the two transistors of the logic composition circuit portion in an OFF-state. Therefore, the display, outputting no shift output signal through the two transistors of the logic composition circuit portion, can inhibit the logic composition circuit portion from outputting a signal to a gate line or a drain line at unintentional timing.

In the display according to the aforementioned aspect, both of the first shift register circuit portion and the second shift register circuit portion preferably include the reset transistors. According to this structure, the display can fix both of the first and second shift signals output from the first and second shift register circuit portions respectively to the second voltage supply source not turning on the transistors of the logic composition circuit portion with the reset transistors. Thus, the display can hold both of two transistors of the logic composition circuit portion in OFF-states when inputting the first and second shift signals in the gates of the two transistors of the logic composition circuit portion respectively and employing a signal output through the two transistors as the shift output signal obtained by logically compositing the first and second shift signals with each other. Therefore, the display can more reliably inhibit the logic composition circuit portion from outputting a signal to the gate line or the drain line at unintentional timing.

In the display according to the aforementioned aspect, the prescribed drive signal is preferably a start signal for starting scanning by the shift register circuit. According to this structure, no signal generation circuit may be separately formed for generating the prescribed drive signal, whereby the circuit structure of the display can be inhibited from complication.

In the display according to the aforementioned aspect, at least either the first shift register circuit portion or the second shift register circuit portion preferably includes a precedent first circuit portion and a subsequent second circuit portion, the second circuit portion preferably includes a first conductive type first transistor connected between the second voltage supply source and the node outputting the first shift signal or the second shift signal with the gate connected to an output node of the first circuit portion and the reset transistor preferably has a function of resetting the output node of the first circuit portion to the first voltage supply source in response to the prescribed drive signal, so that the display preferably resets the node of the second circuit portion outputting the first shift signal or the second shift signal to the second voltage supply source by turning on the first transistor in response to an operation of the reset transistor resetting the output node of the first circuit portion to the first voltage supply source. According to this structure, the display, capable of turning on the first conductive type first transistor having the gate connected to the output node of the first circuit portion by resetting the output node of the first circuit portion to the first voltage supply source with the reset transistor in response to the prescribed drive signal, can supply the second voltage supply source to the node outputting the first or second shift signal from the second voltage supply source through the first transistor. Thus, the display can easily reset the voltage supply source of the node outputting the first or second shift signal to the second voltage supply source in response to the prescribed drive signal.

In the aforementioned structure provided with the reset transistor having the function of resetting the output node of the first circuit portion to the first voltage supply source, the reset transistor is preferably connected between the first voltage supply source and the output node of the first circuit portion with the gate connected to a first drive signal line supplying the prescribed drive signal. According to this structure, the display can easily provide the reset transistor with the function of resetting the output node of the first circuit portion to the first voltage supply source in response to the prescribed drive signal.

In the aforementioned structure including the first drive signal line, the first drive signal line is preferably a start signal line supplying the start signal for starting scanning by the shift register circuit as the prescribed drive signal. According to this structure, the display can employ the start signal as the prescribed drive signal, whereby no signal generation circuit may be separately formed for generating the prescribed drive signal. Thus, the circuit structure of the display can be inhibited from complication. Further, no wire may be separately provided as a first drive signal line for supplying the prescribed drive signal due to the start signal line supplying the start signal employed as the first drive signal line, whereby the circuit scale of the display can be inhibited from increase.

In the display according to the aforementioned aspect, the transistors of the logic composition circuit portion preferably include a second transistor having either the source or the drain connected to a first signal line supplying a first signal switched between the first voltage supply source and the second voltage supply source with the gate receiving the first shift signal and a third transistor having either the source or the drain connected to either the drain or the source of the second transistor with the gate receiving the second shift signal, so that the display outputs the shift output signal of the first voltage supply source through the second transistor and the third transistor by turning on the second transistor and the third transistor and supplying the first signal of the first voltage supply source to either the source or the drain of the second transistor from the first signal line when the first shift signal and the second shift signal are at the first voltage supply source and outputs the shift output signal of the second voltage supply source through the second transistor and the third transistor by supplying the first signal of the second voltage supply source to either the source or the drain of the second transistor from the first signal line when changing the first shift signal from the first voltage supply source to the second voltage supply source. According to this structure, the display can output the shift output signal of the first voltage supply source obtained by logically compositing the first and second shift signals of the first voltage supply source with each other through the second and third transistors of the logic composition circuit portion when the first and second shift signals are at the first voltage supply source, while outputting the shift output signal of the second voltage supply source obtained by logically compositing the first shift signal of the second voltage supply source and the second shift signal of the first voltage supply source with each other through the second and third transistors of the logic composition circuit portion when changing the first shift signal from the first voltage supply source to the second voltage supply source. Thus, the display can easily output the shift output signal obtained by logically compositing the first and second shift signals with each other from the logic composition circuit portion.

In this case, the display preferably forcibly holds the shift output signal at the second voltage supply source while the first signal is at the second voltage supply source. According to this structure, the display can forcibly set both of shift output signals output from precedent and subsequent logic composition circuit portions to the second voltage supply source (low level) while the first signal is at the second voltage supply source (low level) when the voltage supply sources of shift output signals output from a plurality of stages of logic composition circuit portions sequentially change from the second voltage supply source (low level, for example) to the first voltage supply source (high level, for example). Thus, the display can set both of the shift output signals output from the precedent and subsequent logic composition circuit portions respectively to the second voltage supply source (low level) by setting the first signal to the second voltage supply source (low level) when the shift output signal output from the precedent logic composition circuit portion is at the first voltage supply source (high level) and the shift output signal output from the subsequent logic composition circuit portion is at the second voltage supply source (low level). When changing only the shift output signal output from the subsequent logic composition circuit portion to the first voltage supply source (high level) after the period when the first signal is at the second voltage supply source (low level), the display can suppress overlapping of timing for changing the shift output signal output from the precedent logic composition circuit portion from the first voltage supply source (high level) to the second voltage supply source (low level) and that for changing the shift output signal output from the subsequent logic composition circuit portion from the second voltage supply source (low level) to the first voltage supply source (high level). Thus, the display can suppress occurrence of noise resulting from overlapping of the timing for changing the shift output signal output from the precedent logic composition circuit portion from the first voltage supply source (high level) to the second voltage supply source (low level) and that for changing the shift output signal output from the subsequent logic composition circuit portion from the second voltage supply source (low level) to the first voltage supply source (high level).

In the aforementioned structure outputting the shift output signal of the second voltage supply source when changing the first shift signal from the first voltage supply source to the second voltage supply source, the logic composition circuit portion preferably includes a voltage supply source fixing circuit portion for fixing the shift output signal to the second voltage supply source after changing the first shift signal from the first voltage supply source to the second voltage supply source. According to this structure, the display, capable of fixing the shift output signal to the second voltage supply source with the voltage supply source fixing circuit portion after changing the first shift signal from the first voltage supply source to the second voltage supply source, can fix the shift output signal to the second voltage supply source when the first shift signal is at the second voltage supply source and the second shift signal is at the first voltage supply source. Also when the second shift signal thereafter changes to the second voltage supply source so that both of the first and second shift signals are at the second voltage supply source, the display can fix the shift output signal to the second voltage supply source.

In the aforementioned structure provided with the logic composition circuit portion including the second and transistors receiving the first and second shift signals in the gates thereof respectively, the first shift register circuit portion preferably includes a fourth transistor having the drain supplied with at least the first voltage supply source with the gate connected to the node outputting the first shift signal and a first capacitor connected between the gate and the source of the fourth transistor, and the second shift register circuit portion preferably includes a fifth transistor having the drain supplied with at least the first voltage supply source with the gate connected to the node outputting the second shift signal and a second capacitor connected between the gate and the source of the fifth transistor. According to this structure, the display, capable of raising the gate voltage supply source of the fourth transistor (fifth transistor) to a level higher than VDD by a prescribed voltage (Vα) of at least the threshold voltage (Vt) of the fourth transistor (fifth transistor) when supplying a higher voltage supply source VDD to the drain of the fourth transistor (fifth transistor) formed by an n-channel transistor, for example, can supply the first and second shift signals having a voltage supply source (VDD+Vα) higher than VDD+Vt to the gates of the second and third transistors of the logic composition circuit portion respectively. Thus, the display can inhibit the voltage supply source of the shift output signal output through the second and third transistors of the logic composition circuit portion from going down from VDD by the threshold voltage (Vt) of the second and third transistors. Further, the display, capable of lowering the gate voltage supply source of the fourth transistor (fifth transistor) to a level lower than VBB by the prescribed voltage (Vα) of at least the threshold voltage (Vt) of the fourth transistor (fifth transistor) when supplying a lower voltage supply source VBB to the drain of the fourth transistor (fifth transistor) formed by a p-channel transistor, can supply the first and second shift signals having a voltage supply source (VDD−Vα) lower than VBB−Vt to the gates of the second and third transistors of the logic composition circuit portion respectively. Thus, the display can inhibit the voltage supply source of the shift output signal output through the second and third transistors of the logic composition circuit portion from going up from VBB by the threshold voltage (Vt) of the second and third transistors.

In the aforementioned structure including the fourth and fifth transistors, the display preferably connects the first signal line supplying the first signal switched between the first voltage supply source and the second voltage supply source to the drain of the fourth transistor and supplies a first clock signal to the gate of the fourth transistor, connects the first signal line supplying the first signal to the drain of the fifth transistor and supplies a second clock signal to the gate of the fifth transistor, and switches the first signal from the second voltage supply source to the first voltage supply source after changing the first clock signal from the second voltage supply source to the first voltage supply source and after changing the second clock signal from the second voltage supply source to the first voltage supply source respectively. According to this structure, the display can change the source voltage supply source of the fourth transistor (fifth transistor) from the second voltage supply source to the first voltage supply source with the first signal after turning on the fourth transistor (fifth transistor) following the operation of changing the gate voltage supply source of the fourth transistor (fifth transistor) from the second voltage supply source to the first voltage supply source with the first clock signal (second clock signal). Thus, the display can raise or lower the gate voltage supply source of the fourth transistor (fifth transistor) along with the current change of the source voltage supply source of the fourth transistor (fifth transistor). In other words, the display can further raise or lower the gate voltage supply source of the fourth transistor (fifth transistor) along with the change of the source voltage supply source from the second voltage supply source to the first voltage supply source in addition to rise or fall of the gate voltage supply source of the fourth transistor (fifth transistor) caused by the first capacitor (second capacitor) provided between the gate and the source of the fourth transistor (fifth transistor) when supplying the fixed first voltage supply source to the drain of the fourth transistor (fifth transistor). Thus, the display can more easily set the voltage supply sources of the first and second shift signals to the level higher than VDD by at least the threshold voltage (Vt) or the level lower than VBB by at least the threshold voltage (Vt). Therefore, the display, capable of more easily supplying the first and second shift signals having the voltage supply source of at least VDD+Vt or not more than VBB−Vt to the gates of the second and third transistors of the logic composition circuit portion, can further inhibit the voltage supply source of the shift output signal output through the second and third transistors from going down or going up by the threshold voltage (Vt).

In the aforementioned structure including the fourth and fifth transistors, the display preferably connects a second signal line supplying a second signal switched between the first voltage supply source and the second voltage supply source to the drain of the fourth transistor and supplies a first clock signal to the gate of the fourth transistor, connects a third signal line supplying a third signal switched between the first voltage supply source and the second voltage supply source to the drain of the fifth transistor and supplies a second clock signal to the gate of the fifth transistor, switches the second signal from the second voltage supply source to the first voltage supply source after changing the first clock signal from the second voltage supply source to the first voltage supply source, and switches the third signal from the second voltage supply source to the first voltage supply source after changing the second clock signal from the second voltage supply source to the first voltage supply source. According to this structure, the display can change the source voltage supply sources of the fourth and fifth transistors from the second voltage supply source to the first voltage supply source at the timing for turning on the fourth transistor of the first shift register circuit portion and the fifth transistor of the second shift register circuit portion in response to the first and second clock signals respectively. Further, the display can hold the source voltage supply sources of the fourth and fifth transistors at the first voltage supply source respectively until the fourth transistor of the first shift register circuit portion and the fifth transistor of the second shift register circuit portion enter OFF-states in response to the first and second clock signals respectively. Thus, the display can suppress occurrence of such inconvenience that the gate voltage supply sources of the fourth and fifth transistors fluctuate due to change of the source voltage supply sources of the fourth and fifth transistors to the second voltage supply source before the fourth and fifth transistors enter OFF-states in response to the first and second clock signals respectively. In this case, the display, capable of suppressing fluctuation of the first and second shift signals output from the nodes connected with the gates of the fourth transistor of the first shift register circuit portion and the fifth transistor of the second shift register circuit portion respectively, can suppress destabilization of operations of the second and third transistors of the logic composition circuit portion receiving the first and second shift signals in the gates thereof respectively.

In the aforementioned structure including the fourth and fifth transistors, the reset transistor preferably also has a function of resetting the voltage supply source of the source of the fourth transistor or the fifth transistor to the second voltage supply source in response to the prescribed drive signal. According to this structure, the display can reliably raise the gate voltage supply source of the fourth transistor (fifth transistor) by voltage supply source difference in the voltage supply source of the source of the fourth transistor (fifth transistor) going up from the lower voltage supply source VBB to the higher voltage supply source VDD by resetting the voltage supply source of the source of the fourth transistor (fifth transistor) to the lower voltage supply source VBB (second voltage supply source) before raising the voltage supply source of the source of the fourth transistor (fifth transistor) by supplying the higher voltage supply source VDD (first voltage supply source) to the drain of the fourth transistor (fifth transistor) formed by an n-channel transistor, for example. Thus, the display, capable of further raising the gate voltage supply source of the fourth transistor (fifth transistor) as compared with a case of raising the voltage supply source of the source of the fourth transistor (fifth transistor) from an instable level between the higher and lower voltage Supply sources VDD and VBB, can more reliably raise the gate voltage supply source of the fourth transistor (fifth transistor) to the level higher than VDD by the prescribed voltage (Vα) of at least the threshold voltage (Vt) of the fourth transistor (fifth transistor). Further, the display can lower the gate voltage supply source of the fourth transistor (fifth transistor) by voltage supply source difference in the voltage supply source of the source of the fourth transistor (fifth transistor) going down from the higher voltage supply source VDD to the lower voltage supply source VBB by resetting the voltage supply source of the source of the fourth transistor (fifth transistor) to the higher voltage supply source VDD (second voltage supply source) before lowering the voltage supply source of the source of the fourth transistor (fifth transistor) by supplying the lower voltage supply source VBB (first voltage supply source) to the drain of the fourth transistor (fifth transistor) formed by a p-channel transistor. Thus, the display, capable of further lowering the gate voltage supply source of the fourth transistor (fifth transistor) as compared with a case of lowering the voltage supply source of the source of the fourth transistor (fifth transistor) from an instable level between the higher and lower voltage supply sources VDD and VBB, can more reliably lower the gate voltage supply source of the fourth transistor (fifth transistor) to the level lower than VBB by the prescribed voltage (Vα) of at least the threshold voltage (Vt) of the fourth transistor (fifth transistor).

The display according to the aforementioned aspect preferably applies the shift register circuit to at least either a shift register circuit for driving a gate line or a shift register circuit for driving a drain line. According to this structure, the display can easily inhibit the shift register circuit from outputting a signal to at least either the gate line or the drain line at unintentional timing.

In the display according to the aforementioned aspect, transistors constituting the first shift register circuit portion and the second shift register circuit portion and the transistors constituting the logic composition circuit portion as well as the reset transistor are preferably of a first conductive type. According to this structure, the numbers of ion implantation steps and ion implantation masks for forming these transistors can be reduced as compared with a case of forming the transistors constituting the first shift register circuit portion, the second shift register circuit portion and the logic composition circuit portion and the reset transistor by transistors having two conductive types, i.e., first and second conductive types. Thus, complication of a manufacturing process as well as the manufacturing cost can be suppressed.

The display according to the aforementioned aspect may be formed by either a liquid crystal display or an EL display.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
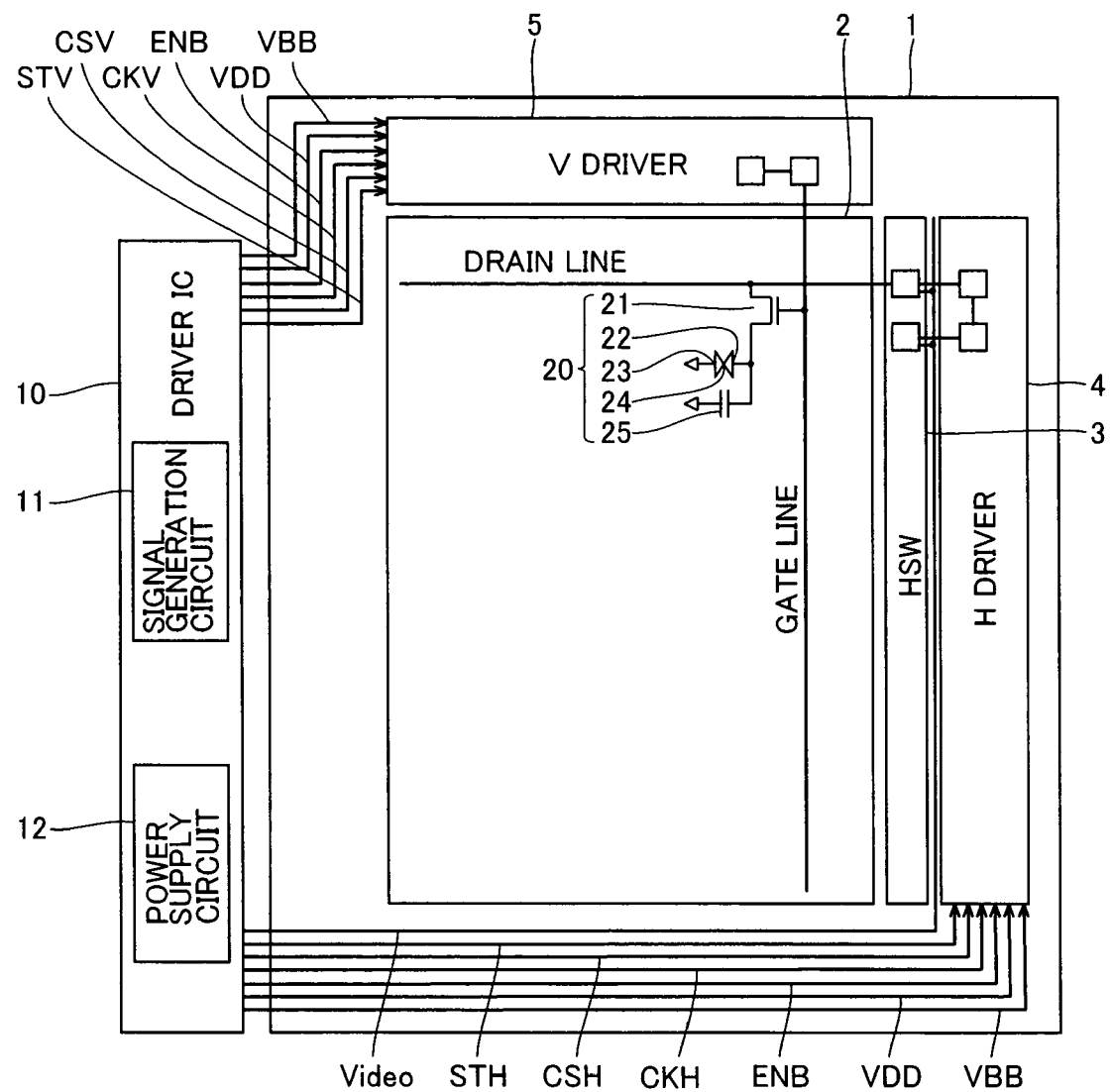
FIG. 1 is a plan view showing a liquid crystal display according to a first embodiment of the present invention.

FIG. 1 is a plan view showing a liquid crystal display according to a first embodiment of the present invention. Referring to FIG. 1, a display portion 2 is provided on a substrate 1 in the liquid crystal display according to the first embodiment. Pixels 20 are arranged on the display portion 2 in the form of a matrix. FIG. 1 shows only one of the pixels 20, in order to simplify the illustration. Each pixel 20 is constituted of an n-channel transistor 21 (hereinafter referred to as a transistor 21), a pixel electrode 22, a common electrode 23, opposed to the pixel electrode 22, common to each pixel 20, a liquid crystal 24 held between the pixel electrode 22 and the common electrode 23 and a subsidiary capacitor 25. The source of the transistor 21 is connected to the pixel electrode 22 and the subsidiary capacitor 25, while the drain thereof is connected to a drain line. The gate of the transistor 21 is connected to a gate line.

Horizontal switches (HSW) 3 and an H driver 4 for driving (scanning) drain lines of the display portion 2 are provided on the substrate 1 along one side of the display portion 2. A V driver 5 for driving (scanning) gate lines of the display portion 2 is provided on the substrate 1 along another side of the display portion 2. While FIG. 1 illustrates only two horizontal switches 3, the horizontal switches 3 are arranged in a number responsive to the number of the pixels 20 in practice. While FIG. 1 illustrates only two shift register circuit portions in each of the H driver 4 and the V driver 5, the shift register circuit portions are arranged in the number responsive to the number of the pixels 20 in each of the H driver 4 and the V driver 5 in practice.

A driver IC 10 is set outside the substrate 1. This driver IC 10 includes a signal generation circuit 11 and a power supply circuit 12. The driver IC 10 supplies a video signal Video, a start signal STH, a scanning direction switching signal CSH, a clock signal CKH, an enable signal ENB, a higher voltage supply source VDD and a lower voltage supply source VBB to the H driver 4. The driver IC 10 further supplies a start signal STV, the enable signal ENB, a scanning direction switching signal CSV, a clock signal CKV, the higher voltage supply source VDD and the lower voltage supply source VBB to the V driver 5.

Figure 2:
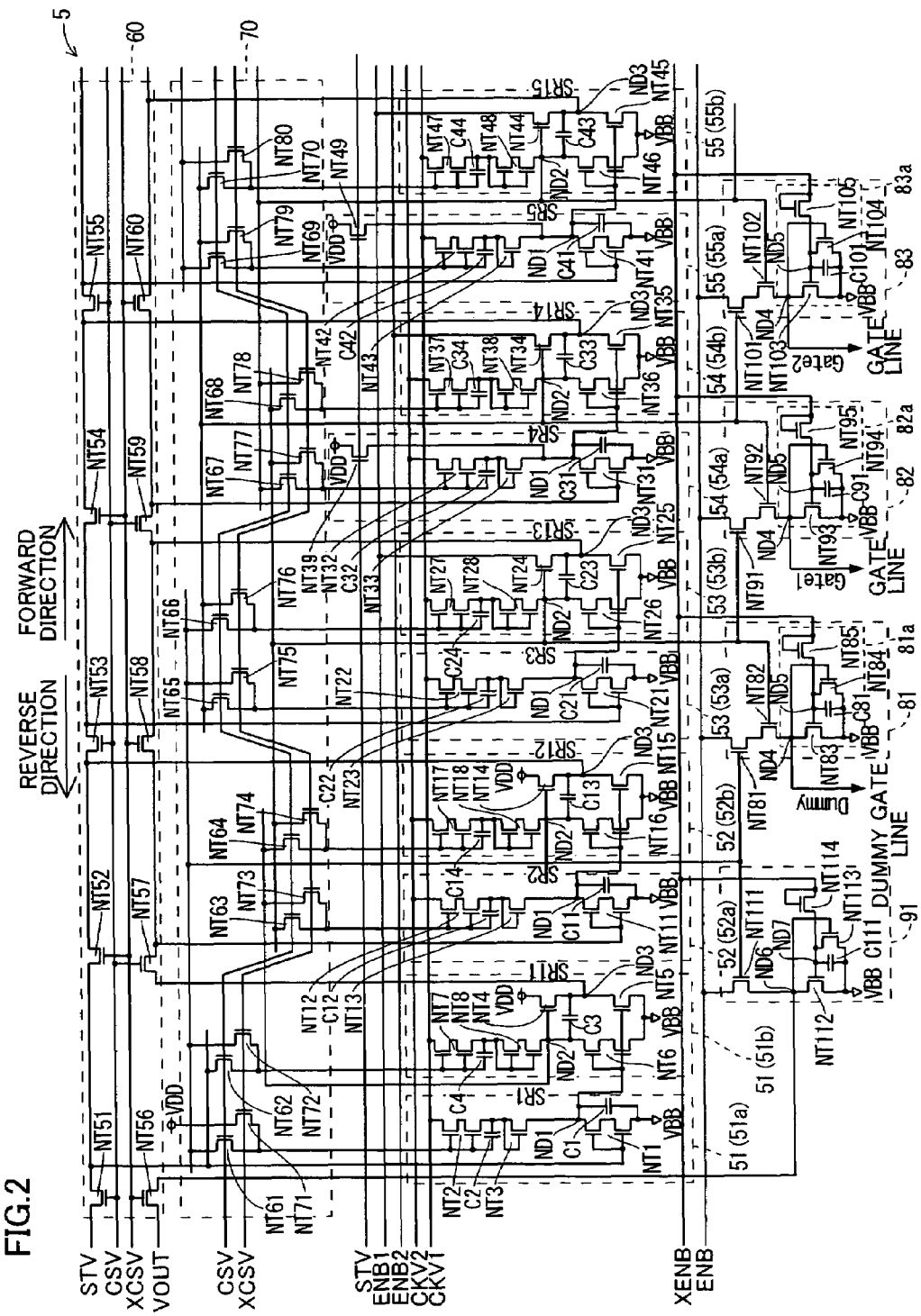
FIG. 2 is a circuit diagram in a V driver of the liquid crystal display according to the first embodiment shown in FIG. 1.

As shown in FIG. 2, a plurality of stages of shift register circuit portions 51 to 55, a scanning direction switching circuit portion 60, an input signal switching circuit portion 70, a plurality of stages of logic composition circuit portions 81 to 83 and a circuit portion 91 are provided in the V driver 5 according to the first embodiment. While FIG. 2 shows only five stages of shift register circuit portions 51 to 55 and three stages of logic composition circuit portions 81 to 83 in order to simplify the illustration, the shift register circuit portions and the logic composition circuit portions are provided in the numbers responsive to the number of the pixels 20 respectively in practice.

The first-stage shift register circuit portion 51 is constituted of a precedent first circuit portion 51a and a subsequent second circuit portion 51b. The first circuit portion 51a includes n-channel transistors NT1 and NT2, a diode-connected n-channel transistor NT3 and capacitors C1 and C2. The second circuit portion 51b includes n-channel transistors NT4, NT5, NT6 and NT7, a diode-connected n-channel transistor NT8 and capacitors C3 and C4. The n-channel transistors NT1 to NT8 are hereinafter referred to as transistors NT1 to NT8 respectively.

All of the transistors NT1 to NT8 provided on the first-stage shift register circuit portion 51 are constituted of TFTs (thin-film transistors) formed by n-type MOS transistors (field-effect transistors). Each of the transistors NT1, NT2, NT6, NT7 and NT8 has two gate electrodes electrically connected with each other. In the first circuit portion 51a, the source of the transistor NT1 is connected to the lower voltage supply source VBB, and the drain thereof is connected to a node ND1, i.e., an output node of the first circuit portion 51a. First and second electrodes of the capacitor C1 are connected to the lower voltage supply source VBB and the node ND1 respectively. The source of the transistor NT2 is connected to the node ND1 through the transistor NT3, while the drain thereof is connected to a clock signal line (CKV1). The capacitor C2 is connected between the gate and the source of the transistor NT2.

In the second circuit portion 51b, the source of the transistor NT4 is connected to a node ND3, while the drain thereof is connected to the higher voltage supply source VDD. The gate of this transistor NT4 is connected to a node ND2. The source of the transistor NT5 is connected to the lower voltage supply source VBB, while the drain thereof is connected to the node ND3. The gate of this transistor NT5 is connected to the node ND1 of the first circuit portion 51a. The source of the transistor NT6 is connected to the lower voltage supply source VBB, while the drain thereof is connected to the node ND2. The gate of this transistor NT6 is connected to the node ND1 of the first circuit portion 51a. The transistor NT6 is provided for turning off the transistor NT4 when the transistor NT5 is in an ON-state. The source of the transistor NT7 is connected to the node ND2 through the transistor NT8, and the drain thereof is connected to the clock signal line (CKV1). The capacitor C3 is connected between the gate and the source of the transistor NT4. The capacitor C4 is connected between the gate and the source of the transistor NT7.

The second- to fifth-stage shift register circuit portions 52 to 55 have circuit structures similar to that of the aforementioned first-stage shift register circuit portion 51. More specifically, the second- to fifth-stage shift register circuit portions 52 to 55 are constituted of first circuit portions 52a to 55a and second circuit portions 52b to 55b having circuit structures substantially similar to those of the first and second circuit portions 51a and 51b of the first-stage shift register circuit portion 51 respectively.

The second-stage shift register circuit portion 52 includes n-channel transistors NT11 to NT18 and capacitors C11 to C14 corresponding to the transistors NT1 to NT8 and the capacitors C1 to C4 of the first-stage shift register circuit portion 51 respectively. The n-channel transistor NT14 is an example of the "fourth transistor" or the "fifth transistor" in the present invention, and the n-channel transistor NT16 is an example of the "first transistor" in the present invention. The capacitor C13 is an example of the "first capacitor" or the "second capacitor" in the present invention. The n-channel transistors NT11 to NT18 are hereinafter referred to as transistors NT11 to NT18 respectively. The third-stage shift register circuit portion 53 includes n-channel transistors NT21 to NT28 and capacitors C21 to C24 corresponding to the transistors NT1 to NT8 and the capacitors C1 to C4 of the first-stage shift register circuit portion 51 respectively. The n-channel transistor NT24 is an example of the "fourth transistor" or the "fifth transistor" in the present invention, and the n-channel transistor NT26 is an example of the "first transistor" in the present invention. The capacitor C23 is an example of the "first capacitor" or the "second capacitor" in the present invention. The n-channel transistors NT21 to NT28 are hereinafter referred to as transistors NT21 to NT28 respectively.

The fourth-stage shift register circuit portion 54 includes n-channel transistors NT31 to NT38 and capacitors C31 to C34 corresponding to the transistors NT1 to NT8 and the capacitors C1 to C4 of the first-stage shift register circuit portion 51 respectively. The n-channel transistor NT34 is an example of the "fourth transistor" or the "fifth transistor" in the present invention, and the n-channel transistor NT36 is an example of the "first transistor" in the present invention. The capacitor C33 is an example of the "first capacitor" or the "second capacitor" in the present invention. The n-channel transistors NT31 to NT38 are hereinafter referred to as transistors NT31 to NT38 respectively. The fifth-stage shift register circuit portion 55 includes n-channel transistors NT41 to NT48 and capacitors C41 to C44 corresponding to the transistors NT1 to NT8 and the capacitors C1 to C4 of the first-stage shift register circuit portion 51 respectively. The n-channel transistor NT44 is an example of the "fourth transistor" or the "fifth transistor" in the present invention, and the n-channel transistor NT46 is an example of the "first transistor" in the present invention. The capacitor C43 is an example of the "first capacitor" or the "second capacitor" in the present invention. The n-channel transistors NT41 to NT48 are hereinafter referred to as transistors NT41 to NT48 respectively.

According to the first embodiment, the first circuit portion 54a of the fourth-stage shift register circuit portion 54 includes an n-channel transistor NT39 for resetting the voltage supply source of a node ND2 outputting a shift signal SR4 to the lower voltage supply source VBB. The first circuit portion 55a of the fifth-stage shift register circuit portion 55 includes an n-channel transistor NT49 for resetting the voltage supply source of a node ND2 outputting a shift signal SR5 to the lower voltage supply source VBB. The n-channel transistors NT39 and NT49 are hereinafter referred to as reset transistors NT39 and NT49 respectively.

The drain of the reset transistor NT39 is supplied with the higher voltage supply source VDD, while the source thereof is connected to a node ND1 serving as an output node of the first circuit portion 54a of the fourth-stage shift register circuit portion 54. A start signal line (STV) for supplying the start signal STV is connected to the gate of the reset transistor NT39. The start signal STV is an example of the "prescribed drive signal" in the present invention, and the start signal line (STV) is an example of the "first drive signal line" in the present invention. When turning on the reset transistor NT39 in response to a high-level start signal STV, therefore, the liquid crystal display sets the node ND1 of the first circuit portion 54a to the higher voltage supply source VDD (high level) by supplying the higher voltage supply source VDD through the reset transistor NT39. The liquid crystal display turns on the transistor NT36 of the second circuit portion 54b by setting the node ND1 of the first circuit portion 54a to the higher voltage supply source VDD (high level), thereby resetting the node ND2 of the second circuit portion 54b outputting the shift signal SR4 to the lower voltage supply source VBB by supplying the lower voltage supply source VBB through the transistor NT36.

The drain of the reset transistor NT49 is supplied with the higher voltage supply source VDD, while the source thereof is connected to a node ND1 serving as an output node of the first circuit portion 55a of the fifth-stage shift register circuit portion 55. The start signal line (STV) for supplying the start signal STV is connected to the gate of the reset transistor NT49. Thus, the liquid crystal display resets the node ND2 of the second circuit portion 55b outputting the shift signal SR5 to the lower voltage supply source VBB in the fifth-stage shift register circuit portion 55, similarly to the aforementioned operation on the fourth-stage shift register circuit portion 54.

The transistors NT12 and NT17 of the second-stage shift register circuit portion 52 and the transistors NT32 and NT37 of the fourth-stage shift register circuit portion 54 are connected to another clock signal line (CKV2). The transistors NT22 and NT27 of the third-stage shift register circuit portion 53 and the transistors NT42 and NT47 of the fifth-stage shift register circuit portion 55 are connected to the clock signal line (CKV1). In other words, the clock signal lines (CKV1 and CKV2) are alternately connected every stage.

According to the first embodiment, enable signal lines (ENB1 and ENB2) are alternately connected to the third- to fifth-stage shift register circuit portions 53 to 55. The enable signal lines (ENB1 and ENB2) are examples of the "second signal line" and the "third signal line" in the present invention respectively. The liquid crystal display supplies an enable signal ENB1 whose voltage supply source is switched from a low level to a high level at prescribed timing through the enable signal line (ENB1) while supplying another enable signal ENB2 whose voltage supply source is switched from a low level to a high level at timing different from that for the enable signal ENB1 through the enable signal line (ENB2). The enable signal line (ENB1) is connected to the drains of the transistors NT24 and NT44 of the third- and fifth-stage shift register circuit portions 53 and 55 respectively. The enable signal line (ENB2) is connected to the drain of the transistor NT34 of the fourth-stage shift register circuit portion 54.

The scanning direction switching circuit portion 60 includes n-channel transistors NT51 to NT60. The n-channel transistors NT51 to NT60 are hereinafter referred to as transistors NT51 to NT60 respectively. All of the transistors NT51 to NT60 are constituted of TFTs formed by n-type MOS transistors.

Either the sources or drains and either the drains or the sources of the transistors NT1 to NT55 are connected with each other in this order. A scanning direction switching signal line (CSV) is connected to the gates of the transistors NT51, NT53 and NT55, while an inverted scanning direction switching signal line (XCSV) is connected to the gates of the transistors NT52 and NT54. In other words, the scanning direction switching signal line (CSV) and the inverted scanning direction switching signal line (XCSV) are alternately connected to the gates of the transistors NT51 to NT55 respectively.

The transistor NT56 is connected to a node D6 of the circuit portion 91 described later. Either the sources or the drains and either the drains or the sources of the transistors NT57 to NT60 are connected with each other in this order. The inverted scanning direction switching signal line (XCSV) is connected to the gates of the transistors NT56, NT58 and NT60, while the scanning direction switching signal line (CSV) is connected to the gates of the transistors NT57 and NT59. In other words, the inverted scanning direction switching signal line (XCSV) and the scanning direction switching signal line (CSV) are alternately connected to the gates of the transistors NT56 to NT60 respectively.

When the scanning direction is forward, the liquid crystal display controls the scanning direction switching signal CSV and an inverted scanning direction switching signal XCSV to high and low levels (VDD and VBB) respectively. When the scanning direction is forward, therefore, the liquid crystal display controls the transistors NT51, NT53, NT55, NT57 and NT59 and the transistors NT52, NT54, NT56, NT58 and NT60 to enter ON- and OFF-states respectively. When the scanning direction is reverse, on the other hand, the liquid crystal display controls the scanning direction switching signal CSV and the inverted scanning direction switching signal XCSV to low and high levels (VBB and VDD) respectively. When the scanning direction is reverse, therefore, the liquid crystal display controls the transistors NT51, NT53, NT55, NT57 and NT59 and the transistors NT52, NT54, NT56, NT58 and NT60 to enter OFF- and ON-states respectively.

The gate of the transistor NT1 of the first-stage shift register circuit portion 51 is connected to either the drain or the source of the transistor NT51 (either the source or the drain of the transistor NT52) of the scanning direction switching circuit portion 60, while the node ND3 of the first-stage shift register circuit portion 51 is connected to either the source or the drain of the transistor NT57 of the scanning direction switching circuit portion 60.

The gate of the transistor NT11 of the second-stage shift register circuit portion 52 is connected to either the drain or the source of the transistor NT57 (either the source or the drain of the transistor NT58) of the scanning direction switching circuit portion 60, while the node ND3 of the second-stage shift register circuit portion 52 is connected to either the drain or the source of the transistor NT52 (either the source or the drain of the transistor NT53) of the scanning direction switching circuit portion 60.

The gate of the transistor NT21 of the third-stage shift register circuit portion 53 is connected to either the drain or the source of the transistor NT53 (either the source or the drain of the transistor NT54) of the scanning direction switching circuit portion 60, while the node ND3 of the third-stage shift register circuit portion 53 is connected to either the drain or the source of the transistor NT58 (either the source or the drain of the transistor NT59) of the scanning direction switching circuit portion 60.

The gate of the transistor NT31 of the fourth-stage shift register circuit portion 54 is connected to either the drain or the source of the transistor NT59 (either the source or the drain of the transistor NT60) of the scanning direction switching circuit portion 60, while the node ND3 of the fourth-stage shift register circuit portion 54 is connected to either the drain or the source of the transistor NT54 (either the source or the drain of the transistor NT55) of the scanning direction switching circuit portion 60.

The gate of the transistor NT41 of the fifth-stage shift register circuit portion 55 is connected to either the drain or the source of the transistor NT55 of the scanning direction switching circuit portion 60, while the node ND3 of the fifth-stage shift register circuit portion 55 is connected to either the drain or the source of the transistor NT60 of the scanning direction switching circuit portion 60.

The shift register circuit portions 51 to 55 and the scanning direction switching circuit portion 60 are connected with each other in the aforementioned manner, so that the liquid crystal display inputs a precedent output signal (any of SR11 to SR15) in the first circuit portion of a prescribed stage shift register circuit portion with respect to the scanning direction. When the scanning direction is forward, the liquid crystal display inputs the start signal STV in the first circuit portion 51a of the first-stage shift register circuit portion 51.

The input signal switching circuit portion 70 includes n-channel transistors NT61 to NT70 having the gates connected to the scanning direction switching signal line (CSV) respectively and n-channel transistors NT71 to NT80 having the gates connected to the inverted scanning direction switching signal line (XCSV) respectively. The n-channel transistors NT61 to NT80 are hereinafter referred to as transistors NT61 to NT80 respectively. All of the transistors NT61 to NT80 constituting the input signal switching circuit portion 70 are constituted of TFTs formed by n-type MOS transistors.

Pairs of the n-channel transistors NT61 to NT70 having the gates connected to the scanning direction switching signal line (CSV) and the n-channel transistors NT71 to NT80 having the gates connected to the inverted scanning direction switching signal line (XCSV) respectively are arranged with respect to the shift register circuit portions 51 to 55 respectively. More specifically, the transistors NT61 and NT62 having the gates connected to the scanning direction switching signal line (CSV) and the transistors NT71 and NT72 having the gates connected to the inverted scanning direction switching signal line (XCSV) are arranged in correspondence to the first-stage shift register circuit portion 51. Either the sources or the drains of the transistors NT61 and NT71 are connected to the gate of the transistor NT2 of the first-stage shift register circuit portion 51. Either the drain or the source of the transistor NT61 is connected to the node ND2 of the second-stage shift register circuit portion 52, while either the drain or the source of the transistor NT71 is connected to the higher voltage supply source VDD. Either the sources or the drains of the transistors NT62 and NT72 are connected to the gate of the transistor NT7 of the first-stage shift register circuit portion 51. Either the drain or the source of the transistor NT62 is connected to either the drain or the source of the transistor NT51 (either the source or the drain of the transistor NT52) of the scanning direction switching circuit portion 60 supplied with the start signal STV and the gate of the transistor NT1, while either the drain or the source of the transistor NT72 is connected to the node ND2 of the second-stage shift register circuit portion 52.

The transistors NT63 and NT64 having the gates connected to the scanning direction switching signal line (CSV) and the transistors NT73 and NT74 having the gates connected to the inverted scanning direction switching signal line (XCSV) respectively are arranged in correspondence to the second-stage shift register circuit portion 52. Either the sources or the drains of the transistors NT63 and NT73 are connected to the gate of the transistor NT12 of the second-stage shift register circuit portion 52. Either the drain or the source of the transistor NT63 is connected to the node ND2 of the third-stage shift register circuit portion 53, while either the drain or the source of the transistor NT73 is connected to the node ND2 of the first-stage shift register circuit portion 51. Either the sources or the drains of the transistors NT64 and NT74 are connected to the gate of the transistor NT17 of the second-stage shift register circuit portion 52. Either the drain or the source of the transistor NT64 is connected to the node ND2 of the first-stage shift register circuit portion 51, while either the drain or the source of the transistor NT74 is connected to the node ND2 of the third-stage shift register circuit portion 53.

The transistors NT65 and NT66 having the gates connected to the scanning direction switching signal line (CSV) and the transistors NT75 and NT76 having the gates connected to the inverted scanning signal switching signal line (XCSV) respectively are arranged in correspondence to the third-stage shift register circuit portion 53. Either the sources or the drains of the transistors NT65 and NT75 are connected to the gate of the transistor NT22 of the third-stage shift register circuit portion 53. Either the drain or the source of the transistor NT65 is connected to the node ND2 of the fourth-stage shift register circuit portion 54, while either the drain or the source of the transistor NT75 is connected to the node ND2 of the second-stage shift register circuit portion 52. Either the sources or the drains of the transistors NT66 and NT76 are connected to the gate of the transistor NT27 of the third-stage shift register circuit portion 53. Either the drain or the source of the transistor NT66 is connected to the node ND2 of the second-stage shift register circuit portion 52, while either the drain or the source of the transistor NT76 is connected to the node ND2 of the fourth-stage shift register circuit portion 54.

The transistors NT67 and NT68 having the gates connected to the scanning direction switching signal line (CSV) and the transistors NT77 and NT78 having the gates connected to the inverted scanning direction switching signal line (XCSV) respectively are arranged in correspondence to the fourth-stage shift register circuit portion 54. Either the sources or the drains of the transistors NT67 and NT77 are connected to the gate of the transistor NT32 of the fourth-stage shift register circuit portion 54. Either the drain or the source of the transistor NT67 is connected to the node ND2 of the fifth-stage shift register circuit portion 55, while either the drain or the source of the transistor NT77 is connected to the node ND2 of the third-stage shift register circuit portion 53. Either the sources or the drains of the transistors NT68 and NT78 are connected to the gate of the transistor NT37 of the fourth-stage shift register circuit portion 54. Either the drain or the source of the transistor NT68 is connected to the node ND2 of the third-stage shift register circuit portion 53, while either the drain or the source of the transistor NT78 is connected to the node ND2 of the fifth-stage shift register circuit portion 55.

The transistors NT69 and NT70 having the gates connected to the scanning direction switching signal line (CSV) and the transistors NT79 and NT80 having the gates connected to the inverted scanning direction switching signal line (XCSV) respectively are arranged in correspondence to the fifth-stage shift register circuit portion 55. Either the sources or the drains of the transistors NT69 and NT79 are connected to the gate of the transistor NT42 of the fifth-stage shift register circuit portion 55. Either the drain or the source of the transistor NT69 is connected to a node ND2 of a sixth-stage shift register circuit portion (not shown), while either the drain or the source of the transistor NT79 is connected to the node ND2 of the fourth-stage shift register circuit portion 54. Either the sources or the drains of the transistors NT70 and NT80 are connected to the gate of the transistor NT47 of the fifth-stage shift register circuit portion 55. Either the drain or the source of the transistor NT70 is connected to the node ND2 of the fourth-stage shift register circuit portion 54, while either the drain or the source of the transistor NT80 is connected to the node ND2 of the sixth-stage shift register circuit portion (not shown).

The transistors NT61 to NT80 constituting the input signal switching circuit portion 70 are formed in the aforementioned manner, so that the liquid crystal display controls the transistors NT61 to NT70 and the transistors NT71 to NT80 to enter ON- and OFF-states respectively when the scanning direction is forward. The shift register circuit portions 51 to 55 and the input signal switching circuit portion 70 are connected with each other in the aforementioned manner, so that the liquid crystal display inputs a subsequent shift signal (any of SR1 to SR5) with respect to the scanning direction in the first circuit portion of a prescribed shift register circuit portion while inputting a precedent shift signal (any of SR1 to SR5) with respect to the scanning direction in the second circuit portion of the prescribed shift register circuit portion in response to the scanning direction. The liquid crystal display inputs the start signal STV in the first circuit portion 51a of the first-stage shift register circuit portion 51.

The logic composition circuit portions 81 to 83 are connected to a dummy gate line (Dummy), a first-stage gate line (Gate1) and a second-stage gate line (Gate2) respectively. The dummy gate line (Dummy) is not connected to the pixels 20 (see FIG. 1) provided on the display portion 2. Each of the logic composition circuit portions 81 to 83 logically composites the shift signals output from the corresponding prescribed shift register circuit portion and the subsequent shift register circuit portion respectively with each other and outputs a shift output signal to the corresponding gate line. The logic composition circuit portion 81 connected to the dummy gate line (Dummy) includes n-channel transistors NT81 to NT84, a diode-connected n-channel transistor NT85 and a capacitor C81. The n-channel transistor NT81 is an example of the "second transistor" in the present invention, and the n-channel transistor NT82 is an example of the "third transistor" in the present invention. The n-channel transistors NT81 to NT85 are hereinafter referred to as transistors NT81 to NT85 respectively.

The transistors NT83 to NT85 and the capacitor C81 constitute a voltage supply source fixing circuit portion 81a. This voltage supply source fixing circuit portion 81a is provided for fixing a low-level voltage supply source of a low-level shift output signal output from the logic composition circuit portion 81 to the dummy gate line (Dummy). All of the transistors NT81 to NT85 constituting the logic composition circuit portion 81 are constituted of TFTs formed by n-type MOS transistors. The drain of the transistor NT81 is connected to the enable signal line (ENB), while the source thereof is connected to the drain of the transistor NT82. The source of the transistor NT82 is connected to a node ND4 (dummy gate line). The gate of the transistor NT81 is connected to the node ND2 of the second-stage shift register circuit portion 52 outputting the shift signal SR2, while the gate of the transistor NT82 is connected to the node ND2 of the third-stage shift register circuit portion 53 outputting the shift signal SR3.

The source of the transistor NT83 is connected to the lower voltage supply source VBB, while the drain thereof is connected to the node ND4 (dummy gate line). The gate of the transistor NT83 is connected to a node ND5. The source of the transistor NT84 is connected to the lower voltage supply source VBB, while the drain thereof is connected to the node ND5. The gate of the transistor NT84 is connected to the node ND4 (dummy gate line). First and second electrodes of the capacitor C81 are connected to the lower voltage supply source VBB and the node ND5 respectively. The node ND5 is connected to an inverted enable signal line (XENB) through the transistor NT85.

The logic composition circuit portion 82 connected to the first-stage gate line (Gate1) has a circuit structure similar to that of the logic composition circuit portion 81 connected to the dummy gate line (Dummy). More specifically, the logic composition circuit portion 82 connected to the first-stage gate line (Gate1) includes n-channel transistors NT91 to NT95 and a capacitor C91 corresponding to the transistors NT81 to NT85 and the capacitor C81 of the logic composition circuit portion 81 connected to the dummy gate line (Dummy) respectively. The n-channel transistor NT91 is an example of the "second transistor" in the present invention, and the n-channel transistor NT92 is an example of the "third transistor" in the present invention. The n-channel transistors NT91 to NT95 are hereinafter referred to as transistors NT91 to NT95 respectively. The transistors NT93 to NT95 and the capacitor C91 constitute a voltage supply source fixing circuit portion 82a corresponding to the voltage supply source fixing circuit portion 81a of the logic composition circuit portion 81 connected to the dummy gate line (Dummy).

In the logic composition circuit portion 82 connected to the first-stage gate line (Gate1), the gate of the transistor NT91 is connected to the node ND2 of the third-stage shift register circuit portion 53 outputting the shift signal SR3, while the gate of the transistor NT92 is connected to the node ND2 of the fourth-stage shift register circuit portion 54 outputting the shift signal SR4. A node ND5 is connected to the inverted enable signal line (XENB) through the transistor NT95.

The logic composition circuit portion 83 connected to the second-stage gate line (Gate2) has a circuit structure similar to that of the logic composition circuit portion 81 connected to the dummy gate line (Dummy). More specifically, the logic composition circuit portion 83 connected to the second-stage gate line (Gate2) includes n-channel transistors NT101 to NT105 and a capacitor C101 corresponding to the transistors NT81 to NT85 and the capacitor C81 of the logic composition circuit portion 81 connected to the dummy gate line (Dummy) respectively. The n-channel transistor NT101 is an example of the "second transistor" in the present invention, and the n-channel transistor NT102 is an example of the "third transistor" in the present invention. The n-channel transistors NT101 to NT105 are hereinafter referred to as transistors NT101 to NT105 respectively. The transistors NT103 to NT105 and the capacitor C101 constitute a voltage supply source fixing circuit portion 83a corresponding to the voltage supply source fixing circuit portion 81a of the logic composition circuit portion 81 connected to the dummy gate line (Dummy).

In the logic composition circuit portion 83 connected to the second-stage gate line (Gate2), the gate of the transistor NT101 is connected to the node ND2 of the fourth-stage shift register circuit portion 54 outputting the shift signal SR4, while the gate of the transistor NT102 is connected to the node ND2 of the fifth-stage shift register circuit portion 55 outputting the shift signal SR5. A node ND5 is connected to the inverted enable signal line (XENB) through the transistor NT105.

The circuit portion 91 includes n-channel transistors NT111 to NT113, a diode-connected n-channel transistor NT114 and a capacitor C111. The n-channel transistors NT111 to NT114 are hereinafter referred to as transistors NT111 to NT114 respectively. All of the transistors NT111 to NT114 constituting the circuit portion 91 are constituted of TFTs formed by n-type MOS transistors.

The drain of the transistor NT111 is connected to the enable signal line (ENB), while the source thereof is connected to a node ND6. The gate of this transistor NT111 is connected to the node ND2 of the second-stage shift register circuit portion 52. The source of the transistor NT112 is connected to the lower voltage supply source VBB, while the drain thereof is connected to the node ND6. The gate of this transistor NT112 is connected to a node ND7. The source of the transistor NT113 is connected to the lower voltage supply source VBB, while the drain thereof is connected to the node ND7. The gate of this transistor NT113 is connected to the node ND6. First and second electrodes of the capacitor C111 are connected to the lower voltage supply source VBB and the node ND7 respectively. The node ND6 is connected to either the drain or the source of the transistor NT56 of the scanning direction switching circuit portion 60. The node ND7 is connected to the inverted enable signal (XENB) through the transistor NT114.

Figure 3:
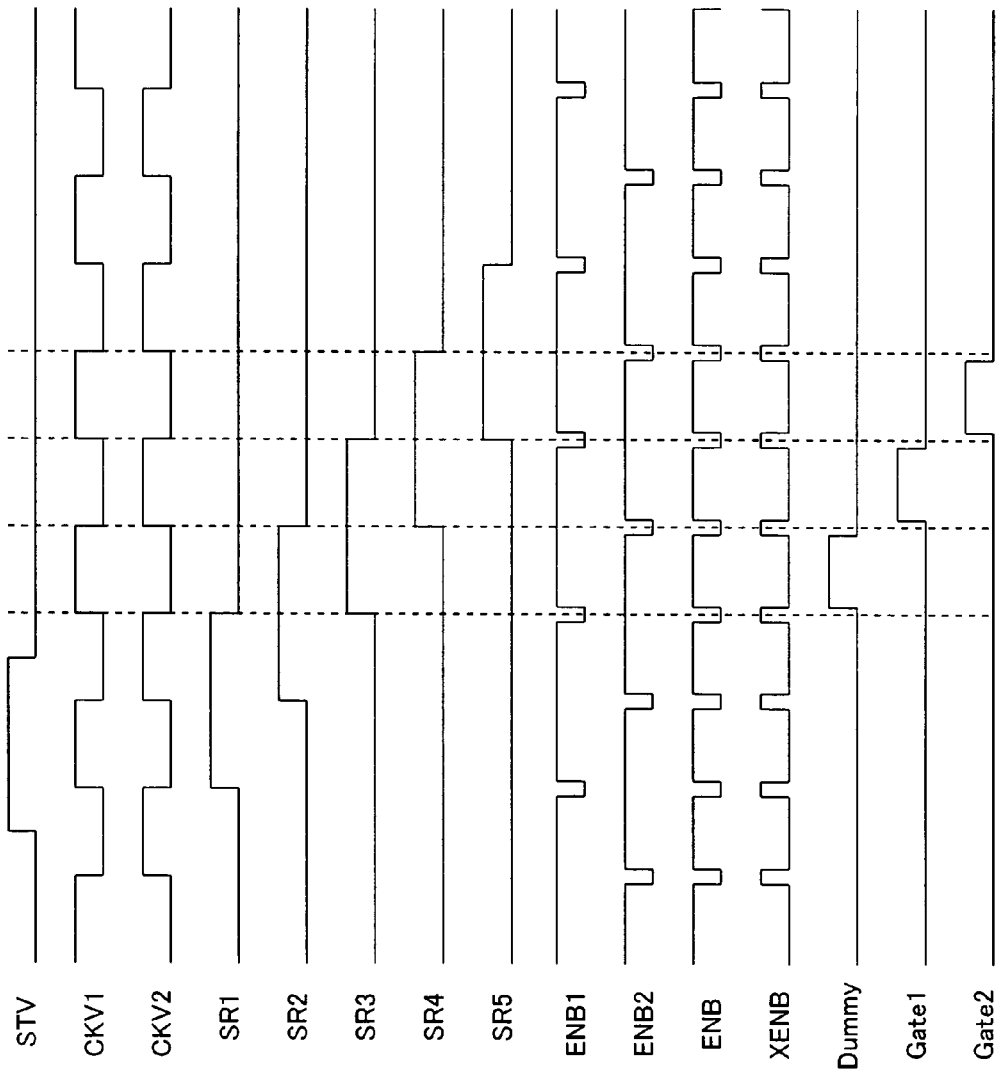
FIG. 3 is a voltage waveform diagram for illustrating operations of the V driver of the liquid crystal display according to the first embodiment of the present invention.

Operations of the V driver 5 of the liquid crystal display according to the first embodiment are now described with reference to FIGS. 1 to 3.

A case of sequentially outputting timing-shifted shift output signals to the gate lines along the forward direction in FIG. 2 (forward scanning) is described. First, the liquid crystal display is supplied with power, for supplying the higher and lower voltage supply sources VDD and VBB to the shift register circuit portions 51 to 55 of the V driver 5. In the forward scanning, the V driver 5 holds the scanning direction switching signal CSV and the inverted scanning direction switching signal XCSV at high and low levels respectively. Thus, the V driver 5 holds the transistors NT51, NT53, NT55, NT57, NT59 and NT61 to NT70 receiving the scanning direction switching signal CSV in the gates thereof respectively in ON-states in the forward scanning. The V driver 5 further holds the transistors NT52, NT54, NT56, NT58, NT60 and NT71 to NT80 receiving the inverted scanning direction switching signal XCSV in the gates thereof respectively in OFF-states. In the initial state, the voltage supply sources of the nodes ND1 to ND3 of the shift register circuit portions 51 to 55 are at instable levels between the higher and lower voltage supply sources VDD and VBB. Thus, the shift signals SR1 to SR5 and the output signals SR11 to SR15 output from the shift register circuit portions 51 to 55 are at instable levels between the higher and lower voltage supply sources VDD and VBB in the initial state. In this state, the V driver 5 raises the start signal STV to a high level as shown in FIG. 3.

Thus, the V driver 5 of the liquid crystal display according to the first embodiment inputs the high-level start signal STV in the gate of the reset transistor NT39 of the first circuit portion 54a of the fourth-stage shift register circuit portion 54. Therefore, the reset transistor NT39 enters an ON-state, so that the V driver 5 supplies the higher voltage supply source VDD to the node ND1 of the first circuit portion 54a of the fourth-stage shift register circuit portion 54 through the reset transistor NT39. Thus, the V driver 5 resets the voltage supply source of the node ND1 of the first circuit portion 54a having been at the instable level between the higher and lower voltage supply sources VDD and VBB to the higher voltage supply source VDD (high level). Therefore, the V driver 5 applies the higher voltage supply source VDD (high level) to the gates of the transistors NT36 and NT35 of the second circuit portion 54b linked to the node ND1 of the first circuit portion 54a respectively. Thus, the transistors NT36 and NT35 enter ON-states, so that the V driver 5 supplies the lower voltage supply source VBB to the nodes ND2 and ND3 of the fourth-stage shift register circuit portion 54 through the transistors NT36 and NT35 respectively.

Therefore, the V driver 5 resets the voltage supply sources of the nodes ND2 and ND3 of the fourth-stage shift register circuit portion 54, having been at the instable levels between the higher and lower voltage supply sources VDD and VBB in the initial state, to the lower voltage supply source VBB while the start signal STV is at the high level. Thus, the V driver 5 resets both of the shift signal SR4 and the output signal SR14 output from the nodes ND2 and ND3 of the fourth-stage shift register circuit portion 54 respectively to the lower voltage supply source VBB (low level).

The V driver 5 inputs the low-level shift signal SR4 in the gates of the transistors NT92 and NT101 of the logic composition circuit portions 82 and 83 respectively, thereby fixing the transistors NT92 and NT101 in OFF-states. The V driver 5 further inputs the low-level shift signal SR4 in the gate of the transistor NT22 of the third-stage shift register circuit portion 53 through the ON-state transistor NT65 of the input signal switching circuit portion 70. Thus, the V driver 5 fixes the transistor NT22 of the third-stage shift register circuit portion 53 in an OFF-state. The V driver 5 further inputs the low-level shift signal SR4 in the gate of the transistor NT47 of the fifth-stage shift register circuit portion 55 through the ON-state transistor NT70 of the input signal switching circuit portion 70. Thus, the V driver 5 fixes the transistor NT47 of the fifth-stage shift register circuit portion 55 in an OFF-state.

The V driver 5 inputs the low-level output signal SR14 output from the node ND3 of the fourth-stage shift register circuit portion 54 in the gate of the transistor NT41 of the fifth-stage shift register circuit portion 55 through the ON-state transistor NT55 of the scanning direction switching circuit portion 60. Thus, the V driver 5 fixes the transistor NT41 of the fifth-stage shift register circuit portion 55 in an OFF-state.

In the fifth-stage shift register circuit portion 55, the V driver 5 inputs the high-level start signal STV in the gate of the reset transistor NT49 of the first circuit portion 55a, thereby resetting the voltage supply source of the node ND1 to the higher voltage supply source VDD (high level) while resetting the voltage supply sources of the nodes ND2 and ND3 to the lower voltage supply source VBB (low level) similarly to the aforementioned operation on the fourth-stage shift register circuit portion 54. Thus, the V driver 5 also resets the shift signal SR5 and the output signal SR15 output from the nodes ND2 and ND3 of the fifth-stage shift register circuit portion 55 respectively to the lower voltage supply source VBB (low level). The V driver 5 inputs the low-level shift signal SR5 in the gates of the transistor NT102 of the logic composition circuit portion 83 and an n-channel transistor of a subsequent logic composition circuit portion corresponding to the transistor NT101 of the logic composition circuit portion 83. Thus, the V driver 5 fixes these transistors in OFF-states. The V driver 5 also inputs the low-level shift signal SR5 in the gate of the transistor NT32 of the fourth-stage shift register circuit portion 54 through the ON-state transistor NT67 of the input signal switching circuit portion 70. Thus, the V driver 5 fixes the transistor NT32 in an OFF-state.

In the high-level period of the start signal STV, the V driver 5 collectively resets the voltage supply sources of the nodes ND1 and those of the nodes ND2 and ND3 to the higher and lower voltage supply sources VDD and VBB respectively in all of the fourth-stage and subsequent shift register circuit portions in the aforementioned manner. Then, the V driver 5 resets shift signals and output signals output from the fourth-stage and subsequent shift register circuit portions to the lower voltage supply source VBB (low level). Thus, the V driver 5 fixes the transistors of the shift register circuit portions receiving the low-level shift signals or the low-level output signals in the gates thereof and the transistors, performing logic composition, of the logic composition circuit portions in OFF-states.

The V driver 5 inputs the high-level start signal STV in the gate of the transistor NT1 of the first-stage shift register circuit portion 51 through the ON-state transistor NT51 of the scanning direction switching circuit portion 60, thereby turning on the transistor NT1. Thereafter a clock signal CKV1 input in the drain of the transistor NT2 goes up to a high level.

At this time, the V driver 5 inputs the shift signal SR2 output from the second-stage shift register circuit portion 52 in the gate of the transistor NT2 of the first-stage shift register circuit portion 51 through the ON-state transistor NT61. The shift signal SR2 input in the gate of the transistor NT2 at this time is at the level between the higher and lower voltage supply sources VDD and VBB, instable but capable of turning off the transistor NT2. Thus, the transistor NT2 is in an OFF-state.

The transistors NT1 and NT2 of the first-stage shift register circuit portion 51 are in the ON- and OFF-states respectively, whereby the voltage supply source of the node ND1 supplied with a low-level voltage supply source from the lower voltage supply source VBB through the transistor NT1 goes down to a low level. Thus, the transistors NT5 and NT6 of the first-stage shift register circuit portion 51 having the gates connected to the node ND1 enter OFF-states. The V driver 5 also inputs the high-level start signal STV in the gate of the transistor NT7 of the first-stage shift register circuit portion 51 through the ON-state transistors NT51 and NT62. Thus, the transistor NT7 is in an ON-state. The voltage supply source of the clock signal CKV1 input in the drain of the transistor NT7 goes up to a high level.

At this time, no through current flows between the clock signal line (CKV1) and the lower voltage supply source VBB through the transistors NT7, NT8 and NT6 despite the ON-state of the transistor NT7, since the transistor NT6 is in the OFF-state. The voltage supply source of the node ND2 of the first-stage shift register circuit portion 51 receiving the high-level clock signal CKV1 through the transistor NT7 and the diode-connected transistor NT8 goes up to a high level. Thus, the transistor NT4 enters an ON-state. The V driver 5 supplies a high-level voltage supply source (VDD) to the node ND3 from the higher voltage supply source VDD through the transistor NT4.

At this time, no through current flows between the higher and lower voltage supply sources VDD and VBB through the transistors NT4 and NT5 since the transistor NT5 is in an OFF-state although the transistor NT4 is in an ON-state. The voltage supply source of the node ND3 of the first-stage shift register circuit portion 51 supplied with the high-level voltage supply source (VDD) from the higher voltage supply source VDD goes up toward VDD. At this time, the V driver 5 boots the voltage supply source of the node ND2 of the first-stage shift register circuit portion 51 following rise of the voltage supply source of the node ND3 in order to maintain the gate-to-source voltage of the transistor NT4 with the capacitor C3, thereby raising the same. Thus, the voltage supply source of the node ND2 goes up to a level higher than VDD by the prescribed voltage (V$\alpha$) of at least the threshold voltage (Vt) of the transistor NT4. Consequently, the first-stage shift register circuit portion 51 outputs the high-level shift signal SR1 having the voltage supply source (VDD+V$\alpha$) of at least VDD+Vt from the node ND2. At the same time, the first-stage shift register circuit portion 51 outputs the high-level output signal SR11 (VDD) from the node ND.

The V driver 5 inputs the high-level output signal SR11 (VDD) from the first-stage shift register circuit portion 51 in the gate of the transistor NT11 of the second-stage shift register circuit portion 52 through the ON-state transistor NT57, thereby turning on the transistor NT11. The V driver 5 inputs the high-level shift signal SR1 (VDD+V$\alpha$) from the first-stage shift register circuit portion 51 in the drain of the ON-state transistor NT64. Since the gate voltage of the transistor NT64 is equal to the voltage supply source (VDD) of the scanning direction switching signal CSV, the V driver 5 charges the gate voltage of the transistor NT17 connected to the source of the transistor NT64 to (VDD−Vt). Thus, the transistor NT17 enters an ON-state.

The V driver 5 inputs the shift signal SR3 output from the node ND2 of the third-stage shift register circuit portion 53 in the gate of the transistor NT12 of the second-stage shift register circuit portion 52 through the ON-state transistor NT63. The voltage supply source of the shift signal SR3 input in the gate of the transistor NT12 at this time is at the level between the higher and lower voltage supply sources VDD and VBB, instable but capable of turning off the transistor NT12. Thus, the transistor NT12 is in an OFF-state.

Thereafter the voltage supply source of a clock signal CKV2 input in the drain of the transistor NT17 of the second-stage shift register circuit portion 52 goes up from a low level (VBB) to a high level (VDD). Thus, the gate voltage supply source of the transistor NT17 goes up from VDD−Vt by the difference between VDD and VBB while the gate-to-source voltage is held through the function of the capacitor C14. Therefore, the voltage supply source of the node ND2 of the second-stage shift register circuit portion 52 goes up to a high level (VDD) without going down by the threshold voltage (Vt) of the transistor NT17. Thereafter the second-stage shift register circuit portion 52 outputs a high-level shift signal SR2 having the voltage supply source (VDD+V$\alpha$) of at least VDD+Vt from the node ND2, similarly to the aforementioned operation of the first-stage shift register circuit portion 51. At the same time, the second-stage shift register circuit portion 52 outputs a high-level output signal SR12 (VDD) from the node ND3.

The V driver inputs the high-level shift signal SR2 (VDD+V$\alpha$>VDD+Vt) from the second-stage shift register circuit portion 52 in the gate of the transistor NT81 of the logic composition circuit portion 81 linked to the dummy gate line (Dummy). The V driver 5 further inputs the high-level shift signal SR2 (VDD+V$\alpha$>VDD+Vt) in the drains of the transistors NT61 and NT66 turned on through the scanning direction switching signal CSV of VDD received in the gates thereof. Thus, the source voltage supply sources of the transistors NT61 and NT66 reach (VDD−Vt), whereby the V driver 5 inputs the voltage supply source (VDD−Vt) in the gates of the transistors NT2 and NT27 of the first- and third-stage shift register circuit portions 51 and 53. The V driver 5 inputs the high-level output signal SR12 (VDD) in the gate of the transistor NT21 of the third-stage shift register circuit portion 53 through the ON-state transistor NT53.

The transistor NT81 of the logic composition circuit portion 81 linked to the dummy gate line (Dummy) enters an ON-state through the high-level shift signal SR2 (VDD+Vα) received in the gate thereof. At this time, the V driver 5 supplies the lower voltage supply source VBB to the node ND4 through the transistor NT83 held in an ON-state. At this time, further, the V driver 5 inputs the shift signal SR3 of the instable voltage supply source between the higher and lower voltage supply sources VDD and VBB in the gate of the transistor NT82 from the node ND2 of the third-stage shift register circuit portion 53. Thus, the transistor NT82 may unintentionally enter an ON-state.

If the transistor NT82 unintentionally enters an ON-state, the voltage supply source of the node ND4 goes up to a level higher than VBB due to the enable signal ENB supplied through the transistors NT81 and NT82. Thus, the logic composition circuit portion 81 may output a shift output signal Dummy having a voltage supply source higher than VBB from the node ND4 to the dummy gate line (Dummy) at unintentional timing. However, display of images is not influenced by the shift output signal Dummy of the voltage supply source higher than VBB output to the dummy gate line (Dummy) at unintentional timing, since the dummy gate line (Dummy) is connected to none of the pixels 20 (see FIG. 1).

The transistor NT2 of the first-stage shift register circuit portion 51 enters an ON-state through the voltage supply source (VDD−Vt) received in the gate thereof from the transistor NT61. The voltage supply source of the clock signal CKV1 input in the drains of the transistors NT2 and NT7 goes down to a low level. At this time, the V driver 5 holds the voltage supply source of the node ND1 of the first-stage shift register circuit portion 51 at a low level. Thus, the V driver 5 holds the transistors NT5 and NT6 of the first-stage shift register circuit portion 51 in OFF-states.

The gate voltage of the transistor NT8 goes down to a low level due to the fall of the clock signal CKV1 to a low level, whereby the transistor NT8 enters an OFF-state. Thus, the V driver 5 holds the voltage supply source of the node ND2 of the first-stage shift register circuit portion 51 at the high level (VDD+Vα), whereby the first-stage shift register circuit portion 51 continuously outputs the high-level shift signal SR1 (VDD+Vα). The V driver 5 holds the transistor NT4 in an ON-state by holding the voltage supply source of the node ND2 of the first-stage shift register circuit portion 51 at the high level (VDD+Vα), whereby the first-stage shift register circuit portion 51 continuously outputs the high-level output signal SR11 (VDD) from the node ND3.

The transistor NT27 of the third-stage shift register circuit portion 53 enters an ON-state through the voltage supply source (VDD−Vt) received from the transistor NT66 in the gate thereof. Further, the transistor NT21 enters an ON-state through the high-level output signal SR12 (VDD) received in the gate thereof. At this time, the V driver 5 fixes the transistor NT22 of the third-stage shift register circuit portion 53 in an OFF-state. The V driver 5 fixes the voltage supply source of the node ND1 of the third-stage shift register circuit portion 53 to the lower voltage supply source VBB (low level) by turning on the transistor NT21 thereby supplying the lower voltage supply source VBB through the transistor NT21. Thus, the transistors NT25 and NT26 enter OFF-states.

At this time, the clock signal CKV1 supplied from the clock signal line (CKV1) to the gate of the transistor NT28 through the ON-state transistor NT27 goes down from the high level (VDD) to the low level (VBB), whereby the transistor NT28 enters an OFF-state. Thus, the V driver 5 holds the voltage supply source of the node ND2 of the third-stage shift register circuit portion 53 at an instable level between the higher and lower voltage supply sources VDD and VBB. Therefore, the third-stage shift register circuit portion 53 continuously outputs the shift signal SR3 of the instable voltage supply source between the higher and lower voltage supply sources VDD and VBB from the node ND2. At this time, the V driver 5 also holds the voltage supply source of the node ND3 of the third-stage shift register circuit portion 53 at the instable level between the higher and lower voltage supply sources VDD and VBB, whereby the third-stage shift register circuit portion 53 continuously outputs the output signal SR13 of the instable voltage supply source between the higher and lower voltage supply sources VDD and VBB from the node ND3.

The voltage supply source of the start signal STV goes down to a low level. Thus, the transistor NT1 of the first-stage shift register circuit portion 51 enters an OFF-state. Therefore, the V driver 5 holds the voltage supply source of the node ND1 of the first-stage shift register circuit portion 51 at a low level, thereby holding the transistors NT5 and NT6 in OFF-states. Further, the transistor NT7 receiving the start signal STV in the gate thereof through the transistors NT51 and NT62 also enters an OFF-state due to the fall of the voltage supply source of the start signal STV to the low level. Thus, the V driver 5 holds the voltage supply source of the node ND2 of the first-stage shift register circuit portion 51 at a high level (VDD+Vα), while holding the voltage supply source of the node ND3 at another high level (VDD).

Therefore, the first-stage shift register circuit portion 51 continuously outputs the high-level shift signal SR1 (VDD+Vα) and the high-level output signal SR11 (VDD).

The V driver 5 also inputs the start signal STV going down to the low level in the gates of the reset transistors NT39 and NT49 of the fourth- and fifth-stage shift register circuit portions 54 and 55 and n-channel transistors of sixth-stage and subsequent shift register circuit portions (not shown) corresponding to the aforementioned reset transistors NT39 and NT49 respectively, thereby turning off these transistors. Thus, the V driver 5 brings the nodes ND1 of the fourth-stage shift register circuit portion 54 and the subsequent shift register circuit portions into floating states while holding high-level voltage supply sources, and holds the voltage supply sources of the nodes ND2 and ND3 at low levels. Therefore, the V driver 5 holds the shift signals and the output signals output from the nodes ND2 and ND3 of the fourth-stage shift register circuit portion 54 and the subsequent shift register circuit portions at low levels.

Thereafter the clock signal CKV1 input in the drain of the transistor NT27 of the third-stage shift register circuit portion 53 goes up to a high level. Thus, the voltage supply source of the node ND2 of the third-stage shift register circuit portion 53 goes up to a high level (VDD), whereby the voltage supply source of the shift signal SR3 also goes up to a high level. The transistor NT24 having the gate connected to the node ND2 of the third-stage shift register circuit portion 53 enters an ON-state. At this time, the V driver 5, supplying a low-level enable signal ENB1 to the drain of the transistor NT24, holds the source voltage supply source of the transistor NT24 (voltage supply source of the node ND3) at a low level.

Thereafter the voltage supply source of the enable signal ENB1 goes up from the low level to a high level according to the first embodiment. Thus, the voltage supply source of the node ND3 of the third-stage shift register circuit portion 53 goes up to a high level (VDD), whereby the voltage supply source of the output signal SR13 also goes up to a high level (VDD). At this time, the V driver 5 boots the voltage supply source of the node ND2 of the third-stage shift register circuit portion 53 following rise of the voltage supply source of the node ND3 in order to maintain the gate-to-source voltage of the transistor NT24 with the capacitor C23, thereby further raising the same from VDD. Thus, the voltage supply source of the node ND2 of the third-stage shift register circuit portion 53 goes up to a level (VDD+Vβ>VDD+Vt) higher than VDD by a prescribed voltage (Vβ) of at least the threshold voltage (Vt). At this time, the voltage supply source (VDD+Vβ) of the node ND2 is higher than the raised voltage supply source (VDD+Vα) of the nodes ND2 of the aforementioned first- and second-stage shift register circuit portions 51 and 52. Then, the third-stage shift register circuit portion 53 outputs a high-level shift signal SR3 having the voltage supply source (VDD+Vβ) of at least VDD+Vt from the node ND2.

The V driver 5 inputs the high-level shift signal SR3 (VDD+Vβ>VDD+Vt) in the gates of the transistors NT82 and NT91 of the logic composition circuit portions 81 and 82 linked to the dummy gate line (Dummy) and the first-stage gate line (Gate1) respectively. The V driver 5 further inputs the high-level shift signal SR3 (VDD+Vβ>VDD+Vt) in the drains of the ON-state transistors NT63 and NT68. The V driver 5 inputs the high-level output signal SR13 (VDD) in the gate of the transistor NT31 of the fourth-stage shift register circuit portion 54 through the ON-state transistor NT59.

At this time, both of the shift signals SR2 and SR3 input in the gates of the transistors NT81 and NT82 respectively go high in the logic composition circuit portion 81 linked to the dummy gate line (Dummy), whereby both of the transistors NT81 and NT82 enter ON-states. Thus, the V driver 5 supplies the enable signal ENB to the node ND4 from the enable signal line (ENB) through the transistors NT81 and NT82. This enable signal ENB is at a low level when both of the shift signals SR1 and SR2 go high, and the voltage supply source thereof is switched from the low level to a high level after a short period. Thus, the voltage supply source of the node ND4 of the logic composition circuit portion 81 linked to the dummy gate line (Dummy) goes up from the low level to a high level, whereby the logic composition circuit portion 81 outputs a high-level shift output signal Dummy to the dummy gate line (Dummy). In other words, the V driver 5 forcibly holds the voltage supply source of the shift output signal Dummy at a low level while the enable signal ENB is at a low level, and raises the former to a high level as the latter goes up from the low level to a high level.

At this time, the transistor NT84 having the gate connected to the node ND4 of the logic composition circuit portion 81 linked to the dummy gate line (Dummy) enters an ON-state as the voltage supply source of the node ND4 (voltage supply source of the shift output signal Dummy) goes up to the high level. Thus, the V driver 5 supplies a low-level voltage supply source to the gate of the transistor NT83 from the lower voltage supply source VBB through the transistor NT84, thereby turning off the transistor NT83. Therefore, the transistor NT83 enters an OFF-state also when both of the transistors NT81 and NT82 enter ON-states, whereby the V driver 5 inhibits through current from flowing between the enable signal line (ENB) and the lower voltage supply source VBB through the transistors NT81, NT82 and NT83.

According to the first embodiment, the V driver 5 inputs the high-level shift signals SR2 and SR3 of the voltage supply sources (VDD+Vα and VDD+Vβ) higher than VDD by the prescribed voltage supply sources (Vα and Vβ) of at least the threshold voltage (Vt) in the gates of the transistors NT81 and NT82 respectively. Thus, the V driver 5 inhibits a voltage supply source appearing on the node ND4 of the logic composition circuit portion 81 linked to the dummy gate line (Dummy) from going down from VDD by the threshold voltage (Vt) of the transistors NT81 and NT82 when supplying the high-level enable signal ENB having the voltage supply source VDD to the drain of the transistor NT81. Therefore, the V driver 5 inhibits the voltage supply source of the shift output signal Dummy output from the logic composition circuit portion 81 to the dummy gate line (Dummy) from going down from the high level.

In the logic composition circuit portion 82 linked to the first-stage gate line (Gate1), the V driver 5 inputs the high-level shift signal SR3 (VDD+Vβ) from the third-stage shift register circuit portion 53 in the gate of the transistor NT91, thereby turning on the transistor NT91. At this time, the V driver 5 holds the transistor NT92 in an OFF-state, thereby supplying no enable signal ENB to the node ND4 from the enable signal line (ENB) through the transistors NT91 and NT92.

In a precedent high-level period of the inverted enable signal XENB, the V driver 5 turns on the transistor NT95 having the gate connected to the inverted enable signal line (XENB). Thus, the V driver 5 supplies the high-level inverted enable signal XENB to the node ND5 of the logic composition circuit portion 82 through the transistor NT95. Therefore, the V driver 5 turns on the transistor NT93 having the gate connected to the node ND5, and charges the capacitor C91. Thus, the V driver 5 supplies the lower voltage supply source VBB (low level) to the node ND4 of the logic composition circuit portion 82 through the transistor NT93. Therefore, the logic composition circuit portion 82 outputs a low-level shift output signal Gate1 to the first-stage gate line (Gate1).

At this time, the voltage supply source of the node ND4 of the logic composition circuit portion 82 goes low, whereby the transistor NT94 having the gate connected to the node ND4 enters an OFF-state. Thus, the V driver 5 holds the voltage supply source of the node ND5 of the logic composition circuit portion 82 at a high level.

When switching the voltage supply source of the inverted enable signal XENB from the high level to a low level, the V driver 5 turns off the transistor NT95, not to supply the low-level inverted enable signal XENB to the node ND5 through the transistor NT95. Thus, the V driver 5 holds the transistor NT93 in an ON-state, thereby continuously supplying the lower voltage supply source VBB to the node ND4 through the transistor NT93. Also in the low-level period of the inverted enable signal XENB, therefore, the logic composition circuit portion 82 outputs the low-level shift output signal Gate1 to the first-stage gate line (Gate1) from the node ND4 in addition to the high-level period of the inverted enable signal XENB.

The V driver 5 inputs the high-level shift signal SR3 (VDD+Vβ>VDD+Vt) in the drain of the transistor NT63 turned on through the scanning direction switching signal CSV of VDD received in the gate thereof, thereby setting the source voltage supply source of the transistor NT63 to (VDD−Vt). Thus, the V driver 5 inputs the voltage supply source (VDD−Vt) in the gate of the transistor NT12 of the second-stage shift register circuit portion 52.

Therefore, the transistor NT12 enters an ON-state. At this time, the voltage supply source of the clock signal CKV2 is at a low level. Thus, the V driver 5 holds the voltage supply source of the node ND1 of the second-stage shift register circuit portion 52 at a low level, thereby holding the transistors NT15 and NT16 in OFF-states. At this time, further, the gate voltage supply source of the transistor NT18 goes low through the clock signal CKV2, whereby the transistor NT18 is in an OFF-state. Therefore, the V driver 5 holds the voltage supply source of the node ND2 at the high level (VDD+Vα). Thus, the second-stage shift register circuit portion 52 continuously outputs the high-level shift signal SR2 (VDD+Vα). Further, the V driver 5 holds the transistor NT15 in an OFF-state, thereby holding the voltage supply source of the node ND3 of the second-stage shift register circuit portion 52 at the high level (VDD). Thus, the second-stage shift register circuit portion 52 continuously outputs the high-level output signal SR12 (VDD).

In the first-stage shift register circuit portion 51, the V driver 5 holds the transistor NT2 in an ON-state by continuously inputting the voltage supply source (VDD−Vt) in the gate thereof from the transistor NT61 receiving the high-level shift signal SR2 (VDD+Vα) in the drain thereof. In this state, the clock signal CKV1 rises from the low level (VBB) to the high level (VDD), whereby the source voltage supply source of the transistor NT2 goes up. At this time, the gate voltage supply source of the transistor NT2 goes up from (VDD−Vt) by the difference between VDD and VBB while the gate-to-source voltage is held through the capacitor C2. Thus, the voltage supply source of the node ND1 (source voltage supply source of the transistor NT2) of the first-stage shift register circuit portion 51 goes up to the high-level voltage supply source (VDD) without going down by the threshold voltage (Vt) of the transistor NT2.

The transistors NT5 and NT6 enter ON-states due to the rise of the voltage supply source of the node ND1 of the first-stage shift register circuit portion 51 to the high level. At this time, the transistor NT7 is in an OFF-state, whereby the voltage supply source of the node ND2 of the first-stage shift register circuit portion 51 supplied with a low-level voltage supply source from the lower voltage supply source VBB through the transistor NT6 goes down to a low level. Thus, the voltage supply source of the shift signal SR1 output from the first-stage shift register circuit portion 51 goes down to a low level. Further, the transistor NT4 enters an OFF-state due to the fall of the voltage supply source of the node ND2 to the low level. Thus, the voltage supply source of the node ND3 of the first-stage shift register circuit portion 51 supplied with the low-level voltage supply source from the lower voltage supply source VBB through the transistor NT5 goes down to a low level. Therefore, the voltage supply source of the output signal SR11 output from the first-stage shift register circuit portion 51 goes down to a low level. The V driver 5 charges the capacitor C1 upon the rise of the voltage supply source of the node ND1 of the first-stage shift register circuit portion 51 to the high level. Thus, the V driver 5 holds the voltage supply source of the node ND1 at the high level until the transistor NT1 subsequently enters an ON-state and the V driver 5 supplies a low-level voltage supply source from the lower voltage supply source VBB through the transistor NT1. Therefore, the V driver 5 holds the transistors NT5 and NT6 in the ON-states until the transistor NT1 subsequently enters an ON-state, thereby holding the voltage supply sources of the shift signal SR1 and the output signal SR11 at the low levels.

The voltage supply source of the enable signal ENB goes down from the high level to a low level. Thus, the voltage supply source of the node ND4 supplied with the low-level voltage supply source through the transistors NT81 and NT82 goes down to a low level in the logic composition circuit portion 81 linked to the dummy gate line (Dummy). Therefore, the voltage supply source of the shift output signal Dummy output from the logic composition circuit portion 81 to the dummy gate-line (Dummy) goes down to a low level. When the enable signal ENB goes down from the high level to the low level, the inverted enable signal XENB goes up from the low level to a high level at the same time. Thus, the V driver 5 inputs the high-level inverted enable signal XENB in the gate of the transistor NT83 through the diode-connected transistor NT85 of the logic composition circuit portion 81 linked to the dummy gate line (Dummy), thereby turning on the transistor NT83. Therefore, the V driver 5 fixes the voltage supply source of the node ND4 of the logic composition circuit portion 81 linked to the dummy gate line (Dummy) to a low level by supplying a low-level voltage supply source from the lower voltage supply source VBB through the transistor NT83. Thus, the V driver 5 fixes the voltage supply source of the shift output signal Dummy output from the logic composition circuit portion 81 to the dummy gate line (Dummy) to the low level.

The V driver 5 charges the capacitor C81 when inputting the high-level inverted enable signal XENB in the gate of the transistor NT83. Thus, the V driver 5 holds the voltage supply source of the node ND5 (gate voltage supply source of the transistor NT83) at a high level until the transistor NT84 subsequently enters an ON-state and the V driver 5 supplies a low-level voltage supply source from the lower voltage supply source VBB through the transistor NT84. Therefore, the V driver 5 holds the transistor NT83 in the ON-state until the transistor NT84 subsequently enters an ON-state, thereby holding the voltage supply source of the shift output signal Dummy output from the logic composition circuit portion 81 to the dummy gate line (Dummy) in the state fixed to the low level.

The clock signal CKV2 goes up to a high level, whereby the V driver 5 supplies the high-level clock signal CKV2 to the node ND1 of the second-stage shift register circuit portion 52 through the ON-state transistor NT12. Thus, the transistors NT15 and NT16 having the gates connected to the node ND1 enter ON-states. Therefore, the V driver 5 supplies a low-level voltage supply source to the node ND2 from the lower voltage supply source VBB through the transistor NT16. Thus, the voltage supply source of the shift signal SR2 output from the node ND2 of the second-stage shift register circuit portion 52 goes down to a low level. Further, the voltage supply source of the node ND2 goes down to a low level, thereby turning off the transistor NT14. Thus, the voltage supply source of the node ND3 supplied with the low-level voltage supply source from the lower voltage supply source VBB through the transistor NT15 goes down to a low level. Thus, the voltage supply source of the output signal SR12 output from the node ND3 of the second-stage shift register circuit portion 52 goes down to a low level.

In the fourth-stage shift register circuit portion 54, the V driver 5 inputs the voltage supply source (VDD−Vt) in the gate of the transistor NT37 from the transistor NT68 receiving the high-level shift signal SR3 (VDD+Vβ) in the drain thereof. Further, the V driver 5 inputs the high-level output signal SR13 (VDD) in the gate of the transistor NT31. In addition, the V driver 5 fixes the transistor NT32 in an OFF-state. In this state, the voltage supply source of the enable signal ENB2 input in the drain of the transistor NT34 goes up from the low level (VBB) to a high level (VDD) after the voltage supply source of the clock signal CKV2 input in the drain of the transistor NT37 goes up to the high level (VDD). Thus, the fourth-stage shift register circuit portion 54 outputs a high-level shift signal SR4 having the voltage supply source (VDD+Vβ) of at least VDD+Vt and a high-level output signal SR14 (VDD) similarly to the aforementioned operation of the third-stage shift register circuit portion 53.

In the logic composition circuit portion 82 linked to the first-stage gate line (Gate1), the V driver 5 inputs the high-level shift signals SR3 and SR4 (VDD+Vβ) in the gates of the transistors NT91 and NT92 respectively. Thus, both of the transistors NT91 and NT92 enter ON-states, whereby the V driver 5 supplies the enable signal ENB to the node ND4 from the enable signal line (ENB) through the transistors NT91 and NT92. This enable signal ENB is at a low level when both of the shift signals SR3 and SR4 go high so that both of the transistors NT91 and NT92 enter ON-states, and the voltage supply source thereof is thereafter switched from the low level to a high level after a short period. Thus, the voltage supply source of the node ND4 of the logic composition circuit portion 82 linked to the first-stage gate line (Gate1) goes up to a high level, whereby the logic composition circuit portion 82 outputs a high-level shift output signal Gate1 to the first-stage gate line (Gate1).

In other words, the V driver 5 forcibly holds the voltage supply source of the shift output signal Gate1 at a low level while the enable signal ENB is at a low level, and raises the former from the low level to a high level as the latter goes up from the low level to a high level.

While the enable signal ENB is at a low level, therefore, the V driver 5 also forcibly holds the shift output signal Dummy output from the logic composition circuit portion 81 to the dummy gate line (Dummy) at a low level, thereby suppressing overlapping of timing for lowering the shift output signal Dummy from a high level to a low level and that for raising the shift output signal Gate1 from a low level to a high level. Thus, the V driver 5 suppresses occurrence of noise resulting from overlapping of the timing for lowering the shift output signal Dummy from a high level to a low level and that for raising the shift output signal Gate1 from a low level to a high level.

Thereafter the V driver 5 sequentially operates on the fourth- and fifth-stage shift register circuit portions 54 and 55 similarly to the operation on the aforementioned third-stage shift register circuit portion 53. Further, the V driver 5 operates on the logic composition circuit portions 82 and 83 linked to the first- and second-stage gate lines (Gate1 and Gate2) similarly to the aforementioned operation on the logic composition circuit portion 81 linked to the dummy gate line (Dummy). The V driver 5 shifts timing for outputting a high-level shift signal and a high-level output signal from each shift register circuit portion. Following this, the V driver 5 also shifts timing for setting precedent and subsequent shift signals to high levels toward subsequent stages. Thus, the V driver 5 also shifts timing for outputting a high-level shift output signal from each logic composition circuit portion to the corresponding gate line by raising the enable signal ENB to a high level in a period overlapping precedent and subsequent high-level shift signals with each other. The V driver 5 sequentially drives each gate line with the timing-shifted high-level shift output signal.

The V driver 5 of the liquid crystal display according to the first embodiment sequentially drives (scans) the gate lines in the aforementioned manner. The V driver 5 repeats the aforementioned operations until the same completely scans the final gate line. Thereafter the V driver 5 repeats the aforementioned operations from that on the first-stage shift register circuit portion 51.

In a case of sequentially outputting timing-shifted shift output signals to the gate lines reversely in FIG. 2 (reverse scanning), on the other hand, the V driver 5 holds the scanning direction switching signal CSV and the inverted scanning direction switching signal XCSV at low and high levels respectively. Thus, the V driver 5 holds the transistors NT51, NT53, NT55, NT57, NT59 and NT61 to 70 receiving the scanning direction switching signal CSV in the gates thereof in OFF-states while holding the transistors NT52, NT54, NT56, NT58, NT60 and NT71 to NT80 receiving the inverted scanning direction switching signal XCSV in the gates thereof in ON-states in reverse scanning. In the reverse scanning, the V driver 5 performs operations similar to those in the aforementioned forward scanning on the shift register circuit portions and the logic composition circuit portions linked to the gate lines along the reverse direction in FIG. 2. At this time, the V driver 5 inputs shift signals and output signals from a precedent shift register circuit portion in a subsequent shift register circuit portion and vice versa through the transistors NT52, NT54, NT58, NT60 and NT71 to NT80 entering ON-states through the aforementioned high-level inverted scanning direction switching signal XCSV respectively.

According to the first embodiment, as hereinabove described, the fourth-stage shift register circuit portion 54 is provided with the reset transistor NT39 for resetting the node ND1 of the first circuit portion 54a connected with the gate of the transistor NT36 connected between the node ND2 outputting the shift signal SR4 and the lower voltage supply source VBB to the higher voltage supply source VDD, whereby the V driver 5 supplied with the higher and lower voltage supply sources VDD and VBB can supply the lower voltage supply source VBB to the node ND2 through the transistor NT36 by inputting a high-level start signal STV for resetting the node ND1 of the first circuit portion 54a to the higher voltage supply source VDD with the reset transistor NT39 thereby turning on the transistor NT36. Thus, the V driver 5 can fix the shift signal SR4 to the lower voltage supply source VBB. Further, the fifth-stage shift register circuit portion 55 is provided with the reset transistor NT49 for resetting the node ND1 of the first circuit portion 55a connected with the gate of the transistor NT46 connected between the node ND2 outputting the shift signal SR5 and the lower voltage supply source VBB to the higher voltage supply source VDD, whereby the V driver 5 supplied with the higher and lower voltage supply sources VDD and VBB can supply the lower voltage supply source VBB to the node ND2 through the transistor NT46 by inputting the high-level start signal STV for resetting the node ND1 of the first circuit portion 55a to the higher voltage supply source VDD with the reset transistor NT49 thereby turning on the transistor NT46. Thus, the V driver 5 can fix the shift signal SR5 to the lower voltage supply source VBB, thereby holding both of the transistors NT101 and NT102 of the logic composition circuit portion 83 in OFF-states. Therefore, the V driver 5, not outputting the shift output signal Gate2 through the transistors NT101 and NT102 of the logic composition circuit portion 83, can be inhibited from outputting the shift output signal Gate2 to the gate line at unintentional timing.

According to the first embodiment, the V driver 5 alternately supplies the clock signals CKV1 and CKV2 to the gates of the transistors NT24, NT34 and NT44 of the shift register circuit portions 53 to 55 while alternately supplying the enable signals ENB1 and ENB2 different in timing from each other to the drains thereof so that the source voltage supply source of the transistor NT24 goes up from VBB to VDD through the enable signal ENB1 after the transistor NT24 enters an ON-state through the clock signal CKV1 in the third-stage shift register circuit portion 53, for example, whereby the V driver 5 can raise the gate voltage supply source of the transistor NT24 by the rise (Vβ) of the voltage supply source. Further, the source voltage supply source of the transistor NT34 goes up from VBB to VDD through the enable signal ENB2 after the transistor NT34 enters an ON-state through the clock signal CKV2 in the fourth-stage shift register circuit portion 54, whereby the V driver 5 can raise the gate voltage supply source of the transistor NT34 by the rise (Vi) of the voltage supply source. Thus, the V driver 5, capable of further raising the voltage supply source (VDD+Vβ>VDD+Vt) of the shift signals SR3 and SR4 as compared with a case of connecting the drains of the transistors NT24 and NT34 to a fixed higher voltage supply source VDD, can easily raise the voltage supply sources of the shift signals SR3 and SR3 to the level higher than VDD by at least the threshold voltage (Vt). Therefore, the V driver 5 can easily supply the shift signals SR3 and SR4 having the voltage supply source (VDD+VP) of at least VDD+Vt to the gates of the transistors NT91 and NT92 of the logic composition circuit portion 82 linked to the first-stage gate line (Gate1) respectively. Thus, the V driver 5 can inhibit the voltage supply source of the shift output signal Gate1 output to the first-stage gate line (Gate1) through the transistors NT91 and NT92 of the logic composition circuit portion 82 from lowering down by the threshold voltage (Vt) of the transistors NT91 and NT92.

According to the first embodiment, the V driver 5 inputs the high-level start signal STV in the gates of the reset transistors NT39 and NT49 when resetting the voltage supply sources of the nodes ND2 to the lower voltage supply source VBB with the reset transistors NT39 and NT49 so that no signal generation circuit may be separately formed for generating a drive signal input in the gates of the reset transistors NT39 and NT49, whereby the circuit structure of the liquid crystal display including the V driver 5 can be inhibited from complication.

Second Embodiment

Figure 4:
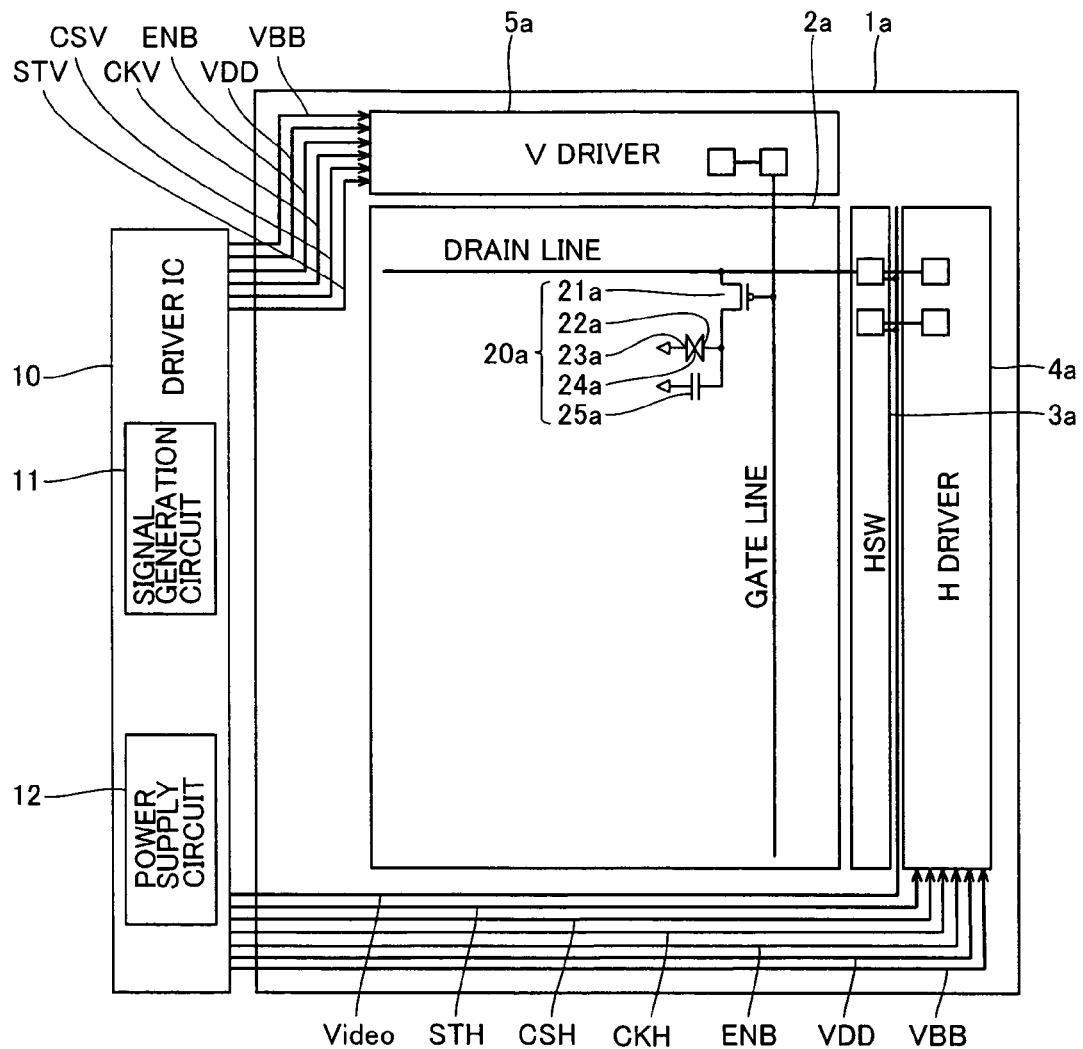
FIG. 4 is a plan view showing a liquid crystal display according to a second embodiment of the present invention.
Figure 5:
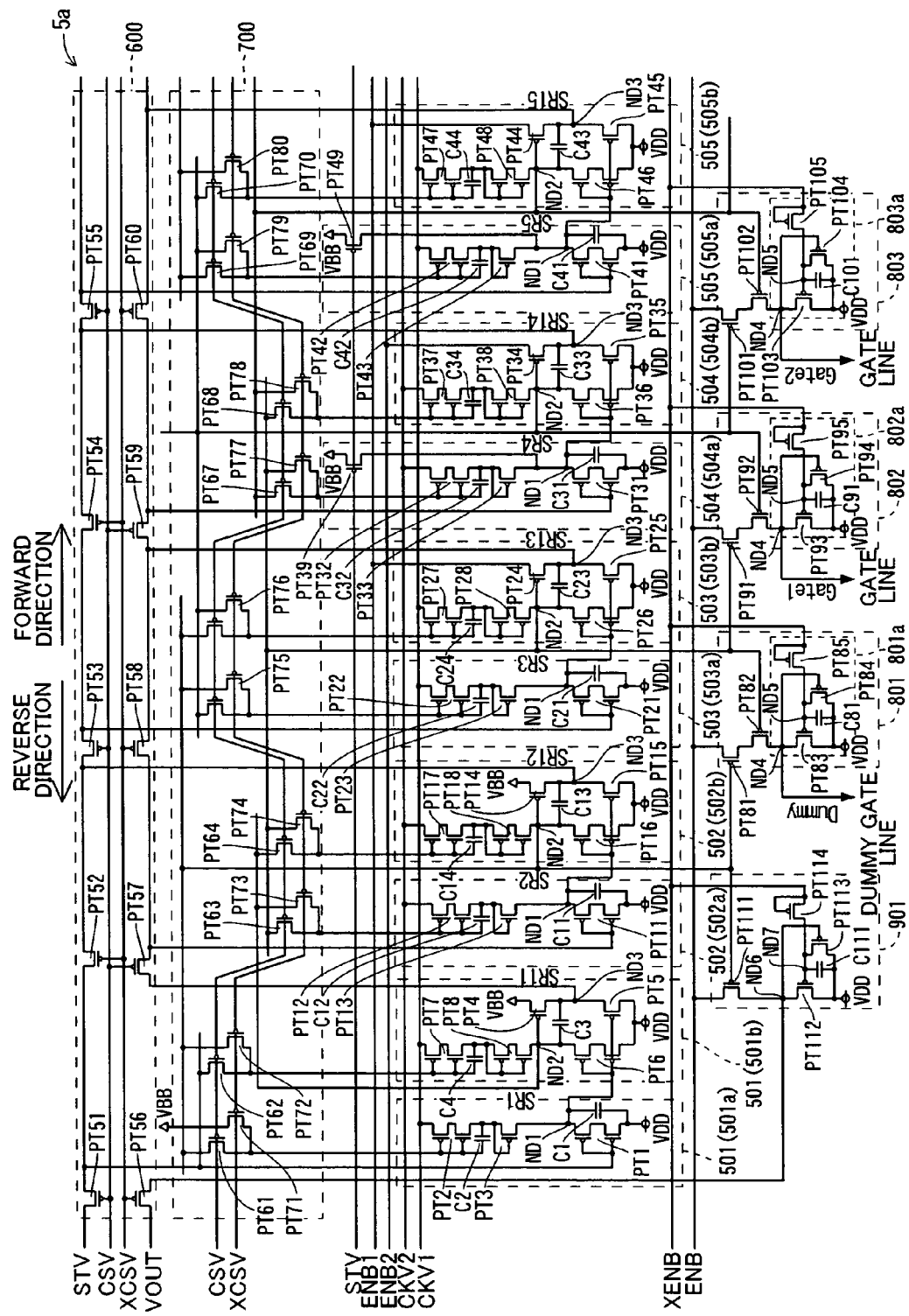
FIG. 5 is a circuit diagram in a V driver of the liquid crystal display according to the second embodiment shown in FIG. 4.

Referring to FIGS. 4 and 5, a V driver 5a similar to the V driver 5 according to the aforementioned first embodiment is constituted of p-channel transistors in a liquid crystal display according to a second embodiment of the present invention.

Referring to FIG. 4, a display portion 2a is provided on a substrate 1a in the liquid crystal display according to the second embodiment. Pixels 20a are arranged on the display portion 2a in the form of a matrix. FIG. 4 shows only one of the pixels 20a, in order to simplify the illustration. Each pixel 20a is constituted of a p-channel transistor 21a (hereinafter referred to as a transistor 21a), a pixel electrode 22a, a common electrode 23a common to each pixel 20a opposed to the pixel electrode 22a, a liquid crystal 24a held between the pixel electrode 22a and the common electrode 23a and a subsidiary capacitor 25a. The source of the transistor 21a is connected to a drain line, while the drain thereof is connected to the pixel electrode 22a and the subsidiary capacitor 25a. The gate of the transistor 21a is connected to a gate line.

Horizontal switches (HSW) 3a and an H driver 4a for driving (scanning) drain lines of the display portion 2a are provided on the substrate 1a along one side of the display portion 2a. The V driver 5a for driving (scanning) gate lines of the display portion 2a is provided on the substrate 1a along another side of the display portion 2a. While FIG. 4 illustrates only two horizontal switches 3a, the horizontal switches 3a are arranged in a number responsive to the number of the pixels 20a in practice. While FIG. 4 illustrates only two shift register circuit portions in each of the H driver 4a and the V driver 5a, the shift register circuit portions are arranged in the number responsive to the number of the pixels 20a in each of the H driver 4a and the V driver 5a in practice. A driver IC 10 including a signal generation circuit 11 and a power supply circuit 12 is set outside the substrate 1a, similarly to the aforementioned first embodiment.

As shown in FIG. 5, a plurality of stages of shift register circuit portions 501 to 505, a scanning direction switching circuit portion 600, an input signal switching circuit portion 700 and a plurality of stages of logic composition circuit portions 801 to 803 are provided in the V driver 5a according to the second embodiment. The shift register circuit portions 502 to 505 are examples of the "first shift register circuit portion" or the "second shift register circuit portion" in the present invention. While FIG. 5 shows only five stages of shift register circuit portions 501 to 505 and three stages of logic composition circuit portions 801 to 803 in order to simplify the illustration, the shift register circuit portions and the logic composition circuit portions are provided in the numbers responsive to the number of the pixels 20a respectively in practice.

The first-stage shift register circuit portion 501 is constituted of a first circuit portion 501a and a second circuit portion 501b. The first circuit portion 501a includes p-channel transistors PT1 and PT2, a diode-connected p-channel transistor PT3 and capacitors C1 and C2. The second circuit portion 501b includes p-channel transistors PT4 to PT7, a diode-connected p-channel transistor PT8 and capacitors C3 and C4. The p-channel transistors PT1 to PT8 are hereinafter referred to as transistors PT1 to PT8 respectively.

The transistors PT1 to PT8 constituting the first-stage shift register circuit portion 501 are connected to positions corresponding to those of the transistors NT1 to NT8 of the first-stage shift register circuit portion 51 of the liquid crystal display according to the first embodiment shown in FIG. 2 respectively. However, the source of the transistor PT1 is connected to a higher voltage supply source VDD while the drain of the transistor PT4 is connected to a lower voltage supply source VBB, dissimilarly to the aforementioned first embodiment. The sources of the transistors PT5 and PT6 are connected to the higher voltage supply source VDD.

The second-stage shift register circuit portion 502 is constituted of a first circuit portion 502a and a second circuit portion 502b. The first circuit portion 502a includes p-channel transistors PT11 and PT12, a diode-connected p-channel transistor PT13 and capacitors C11 and C12. The second circuit portion 502b includes p-channel transistors PT14 to PT17, a diode-connected p-channel transistor PT18 and capacitors C13 and C14. The p-channel transistor PT14 is an example of the "fourth transistor" or the "fifth transistor" in the present invention, and the p-channel transistor PT16 is an example of the "first transistor" in the present invention. The p-channel transistors PT11 to PT18 are hereinafter referred to as transistors PT11 to PT18 respectively.

The transistors PT11 to PT18 constituting the second-stage shift register circuit portion 502 are connected to positions corresponding to those of the transistors NT11 to NT18 of the second-stage shift register circuit portion 52 of the liquid crystal display according to the first embodiment shown in FIG. 2 respectively. However, the source of the transistor PT11 is connected to the higher voltage supply source VDD while the drain of the transistor PT14 is connected to the lower voltage supply source VBB, dissimilarly to the aforementioned first embodiment. The sources of the transistors PT15 and PT16 are connected to the higher voltage supply source VDD.

The third-stage shift register circuit portion 503 is constituted of a first circuit portion 503a and a second circuit portion 503b. The first circuit portion 503a includes p-channel transistors PT21 and PT22, a diode-connected p-channel transistor PT23 and capacitors C21 and C22. The second circuit portion 503b includes p-channel transistors PT24 to PT27, a diode-connected p-channel transistor PT28 and capacitors C23 and C24. The p-channel transistor PT24 is an example of the "fourth transistor" or the "fifth transistor" in the present invention, and the p-channel transistor PT26 is an example of the "first transistor" in the present invention. The p-channel transistors PT21 to PT28 are hereinafter referred to as transistors PT21 to PT28 respectively.

The transistors PT21 to PT28 constituting the third-stage shift register circuit portion 503 are connected to positions corresponding to those of the transistors NT21 to NT28 of the third-stage shift register circuit portion 53 of the liquid crystal display according to the first embodiment shown in FIG. 2 respectively. However, the sources of the transistors PT21, PT25 and PT26 are connected to the higher voltage supply source VDD, dissimilarly to the aforementioned first embodiment.

The fourth-stage shift register circuit portion 504 is constituted of a first circuit portion 504a and a second circuit portion 504b. The first circuit portion 504a includes p-channel transistors PT31 and PT32, a diode-connected p-channel transistor PT33 and capacitors C31 and C32. The second circuit portion 504b includes p-channel transistors PT34 to PT37, a diode-connected p-channel transistor PT38 and capacitors C33 and C34. The p-channel transistor PT34 is an example of the "fourth transistor" or the "fifth transistor" in the present invention, and the p-channel transistor PT36 is an example of the "first transistor" in the present invention. The p-channel transistors PT31 to PT38 are hereinafter referred to as transistors PT31 to PT38 respectively.

The transistors PT31 to PT38 constituting the fourth-stage shift register circuit portion 504 are connected to positions corresponding to those of the transistors NT31 to NT38 of the fourth-stage shift register circuit portion 54 of the liquid crystal display according to the first embodiment shown in FIG. 2 respectively. However, the sources of the transistors PT31, PT35 and PT36 are connected to the higher voltage supply source VDD, dissimilarly to the aforementioned first embodiment.

The fifth-stage shift register circuit portion 505 is constituted of a first circuit portion 505a and a second circuit portion 505b. The first circuit portion 505a includes p-channel transistors PT41 and PT42, a diode-connected p-channel transistor PT43 and capacitors C41 and C42. The second circuit portion 505b includes p-channel transistors PT44 to PT47, a diode-connected p-channel transistor PT48 and capacitors C43 and C44. The p-channel transistor PT44 is an example of the "fourth transistor" or the "fifth transistor" in the present invention, and the p-channel transistor PT46 is an example of the "first transistor" in the present invention. The p-channel transistors PT41 to PT48 are hereinafter referred to as transistors PT41 to PT48 respectively.

The transistors PT41 to PT48 constituting the fifth-stage shift register circuit portion 505 are connected to positions corresponding to those of the transistors NT41 to NT48 of the fifth-stage shift register circuit portion 55 of the liquid crystal display according to the first embodiment shown in FIG. 2 respectively. However, the sources of the transistors PT41, PT45 and PT46 are connected to the higher voltage supply source VDD, dissimilarly to the aforementioned first embodiment.

According to the second embodiment, the first circuit portion 504a of the fourth-stage shift register circuit portion 504 includes a p-channel transistor PT39 for resetting the voltage supply source of a node ND2 outputting a shift signal SR4 to the higher voltage supply source VDD. Further, the first circuit portion 505a of the fifth-stage shift register circuit portion 505 includes a p-channel transistor PT49 for resetting the voltage supply source of a node ND2 outputting a shift signal SR5 to the higher voltage supply source VDD. The p-channel transistors PT39 and PT49 are hereinafter referred to as reset transistors PT39 and PT49 respectively.

The drain of the reset transistor PT39 is supplied with the lower voltage supply source VBB, while the source thereof is connected to a node ND1 serving as an output node of the first circuit portion 504a of the fourth-stage shift register circuit portion 504. A start signal line (STV) for supplying a start signal STV is connected to the gate of the reset transistor PT39. When turning on the reset transistor PT39 in response to a low-level start signal STV, therefore, the liquid crystal display sets the voltage supply source of the node ND1 of the first circuit portion 504a to the lower voltage supply source VBB (low level) by supplying the lower voltage supply source VBB through the reset transistor PT39. The liquid crystal display setting the voltage supply source of the node ND1 of the first circuit portion 504a to the lower voltage supply source VBB (low level) turns on the transistor PT36 of the second circuit portion 504b, for resetting the node ND2 of the second circuit portion 504b outputting the shift signal SR4 to the higher voltage supply source VDD by supplying the higher voltage supply source VDD through the PT36.

The drain of the reset transistor PT49 is supplied with the lower voltage supply source VBB, while the source thereof is connected to a node ND1 serving as an output node of the first circuit portion 505a of the fifth-stage shift register circuit portion 505. The start signal line (STV) for supplying the start signal STV is connected to the gate of the reset transistor PT49. Thus, the V driver 5a resets a node ND2 of the second circuit portion 505b outputting a shift signal SR5 to the higher voltage supply source VDD in the fifth-stage shift register circuit portion 505, similarly to the aforementioned operation on the fourth-stage shift register circuit portion 504.

All of the transistors PT1 to PT8, PT11 to PT18, PT21 to PT28, PT31 to PT38 and PT41 to PT48 and the reset transistors PT39 and PT49 provided on the shift register circuit portions 501 to 505 are constituted of TFTs formed by p-type MOS transistors. Each of the transistors PT1, PT2, PT6, PT7, PT8, PT11, PT12, PT16, PT17, PT18, PT21, PT22, PT26, PT27, PT28, PT31, PT32, PT36, PT37, PT38, PT41, PT42, PT46, PT47 and PT48 has two gate electrodes electrically connected with each other.

The scanning direction switching circuit portion 600 includes p-channel transistors PT51 to PT60. The p-channel transistors PT51 to PT60 are hereinafter referred to as transistors PT51 to PT60 respectively. All of the transistors PT51 to PT60 are constituted of TFTs formed by p-type MOS transistors. The transistors PT51 to PT60 constituting the scanning direction switching circuit portion 600 are connected to positions corresponding to those of the transistors NT51 to NT60 of the scanning direction switching circuit portion 60 according to the first embodiment shown in FIG. 2 respectively.

The input signal switching circuit portion 700 includes p-channel transistors PT61 to PT80. The p-channel transistors PT61 to PT80 are hereinafter referred to as transistors PT61 to PT80 respectively. All of the transistors PT61 to PT80 are constituted of TFTs formed by p-type MOS transistors. The transistors PT61 to PT80 constituting the input signal switching circuit portion 700 are connected to positions corresponding to those of the transistors NT61 to NT80 of the input signal switching circuit portion 70 according to the first embodiment shown in FIG. 2 respectively. However, either the drain or the source of the transistor PT71 is connected to the lower voltage supply source VBB, dissimilarly to the aforementioned first embodiment.

The logic composition circuit portions 801 to 803 are connected to a dummy gate line, a first-stage gate line and a second-stage gate line respectively. The logic composition circuit portion 801 connected to the dummy gate line includes p-channel transistors PT81 to PT84, a diode-connected p-channel transistor PT85 and a capacitor C81. The p-channel transistor PT81 is an example of the "second transistor" in the present invention, and the p-channel transistor PT82 is an example of the "third transistor" in the present invention. The p-channel transistors PT81 to PT85 are hereinafter referred to as transistors PT81 to PT85 respectively. The transistors PT83 to PT85 and the capacitor C81 constitute a voltage supply source fixing circuit portion 801a. The transistors PT81 to PT85 constituting the logic composition circuit portion 801 connected to the dummy gate line are connected to positions corresponding to those of the transistors NT81 to NT85 of the logic composition circuit portion 81 connected to the dummy gate line according to the first embodiment shown in FIG. 2 respectively. However, the source of the transistor PT83 is connected to the higher voltage supply source VDD.

The logic composition circuit portion 802 connected to the first-stage gate line includes p-channel transistors PT91 to PT94, a diode-connected p-channel transistor PT95 and a capacitor C91. The p-channel transistor PT91 is an example of the "second transistor" in the present invention, and the p-channel transistor PT92 is an example of the "third transistor" in the present invention. The p-channel transistors PT91 to PT95 are hereinafter referred to as transistors PT91 to PT95 respectively. The transistors PT93 to PT95 and the capacitor C91 constitute a voltage supply source fixing circuit portion 802a. The transistors PT91 to PT95 constituting the logic composition circuit portion 802 connected to the first-stage gate line are connected to positions corresponding to those of the transistors NT91 to NT95 of the logic composition circuit portion 82 connected to the first-stage gate line according to the first embodiment shown in FIG. 2 respectively. However, the source of the transistor PT93 is connected to the higher voltage supply source VDD.

The logic composition circuit portion 803 connected to the second-stage gate line includes p-channel transistors PT101 to PT104, a diode-connected p-channel transistor PT105 and a capacitor C101. The p-channel transistor PT101 is an example of the "second transistor" in the present invention, and the p-channel transistor PT102 is an example of the "third transistor" in the present invention. The p-channel transistors PT101 to PT105 are hereinafter referred to as transistors PT101 to PT105 respectively. The transistors PT103 to PT105 and the capacitor C101 constitute a voltage supply source fixing circuit portion 803a. The transistors PT101 to PT105 constituting the logic composition circuit portion 803 connected to the second-stage gate line are connected to positions corresponding to those of the transistors NT101 to NT105 of the logic composition circuit portion 83 connected to the second-stage gate line according to the first embodiment shown in FIG. 2 respectively. However, the source of the transistor PT103 is connected to the higher voltage supply source VDD. All of the transistors PT81 to PT85, PT91 to PT95 and PT101 to PT105 provided on the aforementioned logic composition circuit portions 801 to 803 are constituted of TFTs formed by p-type MOS transistors.

A circuit portion 901 has p-channel transistors PT111 to PT113, a diode-connected p-channel transistor PT114 and a capacitor C111. The p-channel transistors PT111 to PT114 are hereinafter referred to as transistors PT111 to PT114 respectively. The transistors PT111 to PT114 constituting the circuit portion 901 are connected to positions corresponding to those of the transistors NT111 to NT114 of the circuit portion 91 according to the first embodiment shown in FIG. 2 respectively. However, the source of the transistor PT112 is connected to the higher voltage supply source VDD.

Figure 6:
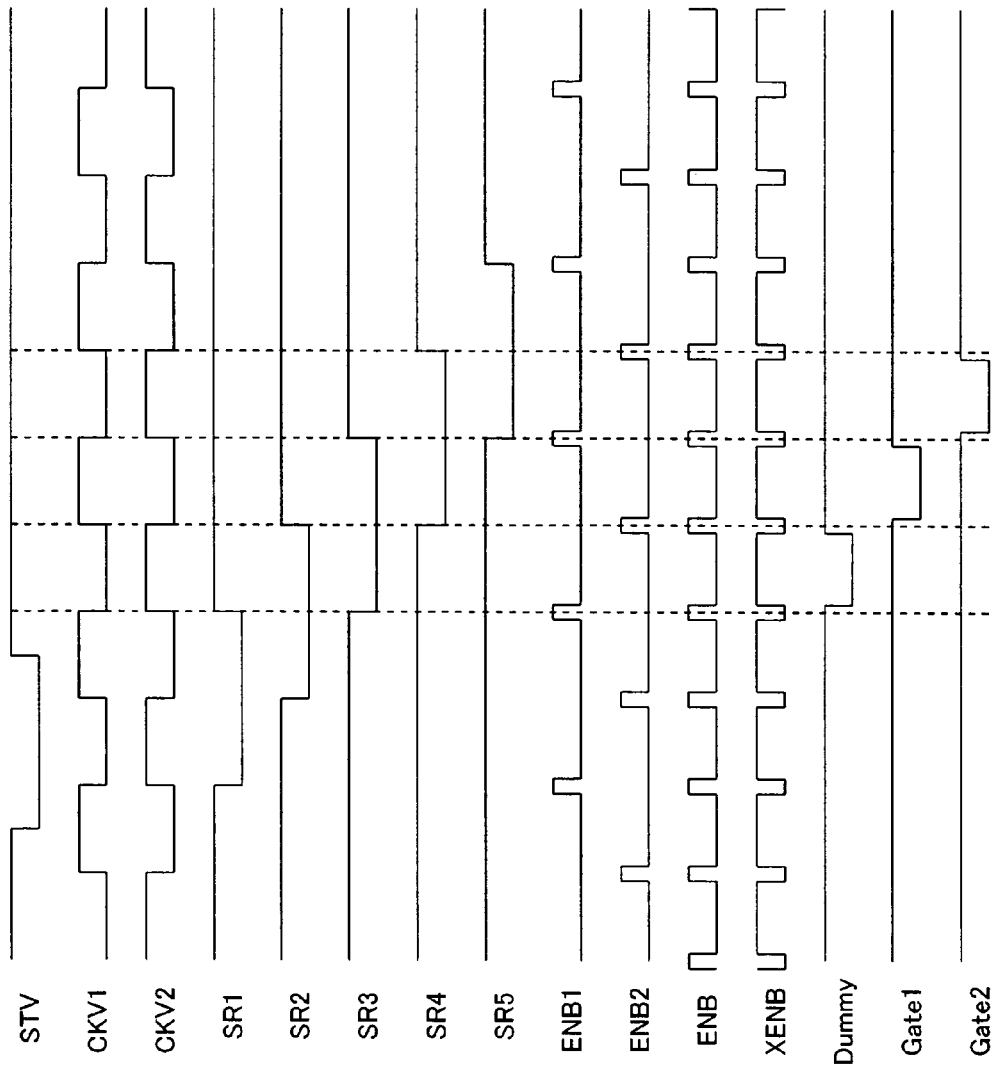
FIG. 6 is a voltage waveform diagram for illustrating operations of the V driver of the liquid crystal display according to the second embodiment of the present invention.

Operations of the V driver 5a according to the second embodiment are now described with reference to FIGS. 5 and 6. According to the second embodiment, the V driver 5a inputs signals having waveforms obtained by inverting the high and low levels of the start signal STV, the clock signals CKV1 and CKV2, the enables signals ENB, ENB1 and ENB2 and the inverted enable signal XENB according to the first embodiment shown in FIG. 3 respectively as a start signal STV, clock signals CKV1 and CKV2, enable signals ENB, ENB1 and ENB2 and a inverted enable signal XENB respectively. Thus, the shift register circuit portions 501 to 505 according to the second embodiment output signals having waveforms obtained by inverting the high and low levels of the shift signals SR1 to SR5 and the output signals SR11 to SR15 output from the shift register circuit portions 51 to 55 according to the first embodiment shown in FIG. 2 respectively. According to the second embodiment, further, the logic composition circuit portions 801 to 803 output signals having waveforms obtained by inverting the high and low levels of the shift output signals Dummy, Gate1 and Gate2 output from the logic composition circuit portions 81 to 83 according to the first embodiment shown in FIG. 2 respectively. The remaining operations of the V driver 5a according to the second embodiment are similar to those of the V driver 5 according to the aforementioned first embodiment shown in FIG. 2.

According to the second embodiment, the V driver 5a alternately supplies the clock signals CKV1 and CKV2 to the gates of the transistors PT24, PT34 and PT44 of the shift register circuit portions 503 to 505 while alternately supplying the enable signals ENB1 and ENB2 different in timing from each other to the drains thereof, thereby operating as follows: After the transistor PT24 enters an ON-state through the clock signal CKV1 in the third-stage shift register circuit portion 503, for example, the source voltage supply source of the transistor PT24 goes down from VDD to VBB through the enable signal ENB1, whereby the gate voltage supply source of the transistor PT24 goes down by this reduction (Vi) of the voltage supply source. After the transistor PT34 enters an ON-state through the clock signal CKV2 in the fourth-stage shift register circuit portion 504, the source voltage supply source of the transistor PT34 goes down from VDD to VBB through the enable signal ENB2, whereby the gate voltage supply source of the transistor PT34 goes down by this reduction (Vβ) of the voltage supply source. Thus, the V driver 5a, capable of further lowering the voltage supply source (VBB−Vβ<VBB−Vt) of the shift signals SR3 and SR4 as compared with a case of connecting the drains of the transistors PT24 and PT34 to a fixed lower voltage supply source VBB, can more easily set the voltage supply sources of the shift signals SR3 and SR4 to a level lower than VBB by at least the threshold voltage (Vt). Therefore, the V driver 5a can more easily supply the shift signals SR3 and SR4 having the voltage supply source (VBB−Vβ) not more than VBB−Vt to the gates of the transistors PT91 and PT92 of the logic composition circuit portion 802 linked to the first-stage gate line respectively. Thus, the V driver 5a can inhibit the voltage supply source of a shift output signal Gate1 output to the first-stage gate line through the transistors PT91 and PT92 of the logic composition circuit portion 802 from going up by the threshold voltage (Vt).

According to the second embodiment, as hereinabove described, the liquid crystal display is provided with the reset transistors PT39 and PT49 and turns on the transistors PT39 and PT49 in response to the start signal STV, whereby the liquid crystal display including the V driver 5a can attain effects similar to those of the first embodiment such that the same can inhibit the logic composition circuit portions from outputting shift output signals to the corresponding gate lines at unintentional timing.

Third Embodiment

Figure 7:
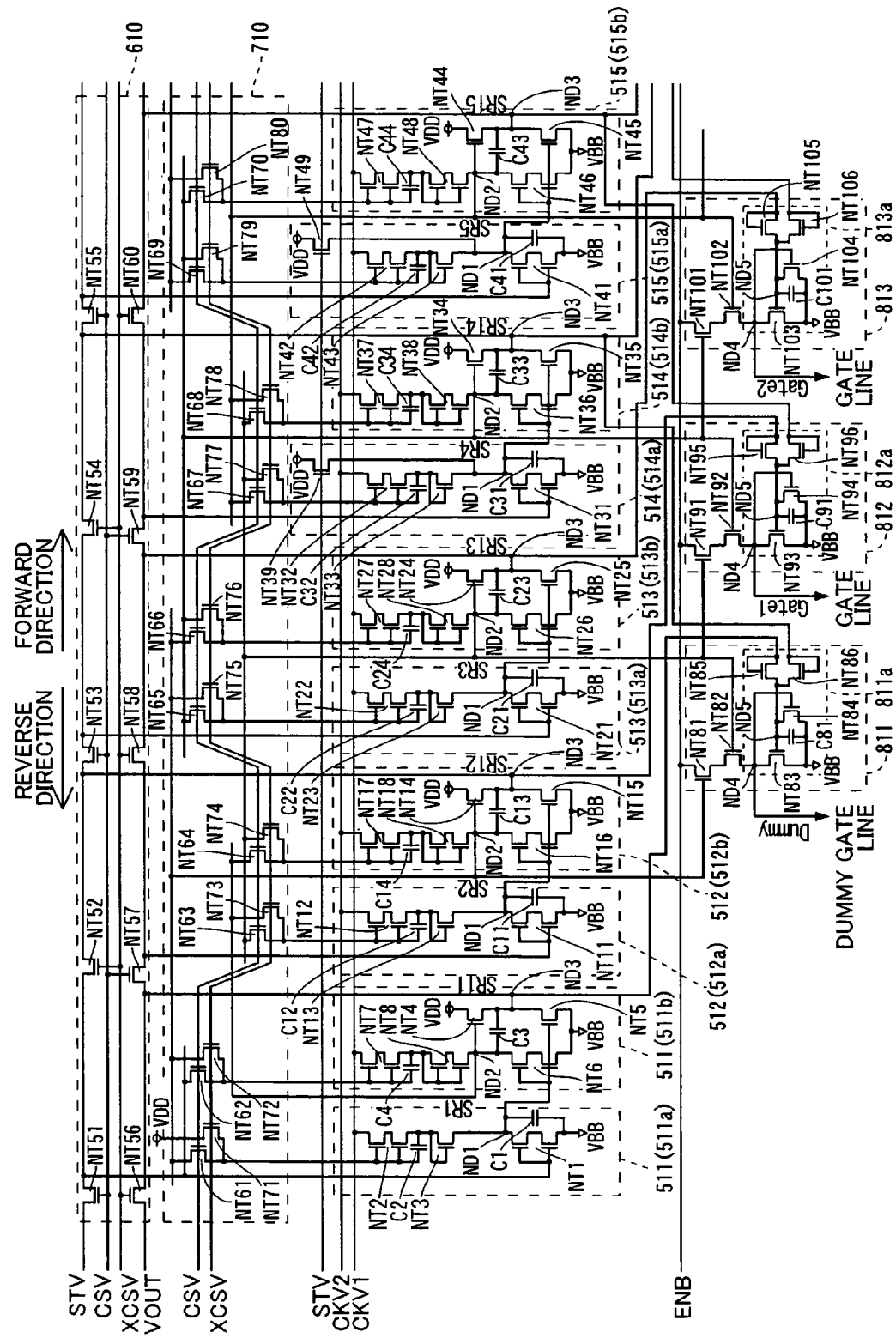
FIG. 7 is a circuit diagram in a V driver of a liquid crystal display according to a third embodiment of the present invention.

Referring to FIG. 7, a liquid crystal display according to a third embodiment of the present invention supplies a higher voltage supply source VDD to the drains of transistors connected to nodes outputting output signals also in third-stage and subsequent shift register circuit portions similarly to first- and second-stage shift register circuit portions while holding shift output signals output from logic composition circuit portions in states fixed to low levels through the output signals from the shift register circuit portions in a structure similar to that of the aforementioned first embodiment.

As shown in FIG. 7, a V driver of the liquid crystal display according to the third embodiment is provided with a plurality of stages of shift register circuit portions 511 to 515, a scanning direction switching circuit portion 610, an input signal switching circuit portion 710 and a plurality of stages of logic composition circuit portions 811 to 813. The shift register circuit portions 512 to 515 are examples of the "first shift register circuit portion" or the "second shift register circuit portion" in the present invention. While FIG. 7 shows only five stages of shift register circuit portions 511 to 515 and three stages of logic composition circuit portions 811 to 813 in order to simplify the illustration, the shift register circuit portions and the logic composition circuit portions are provided in numbers responsive to the number of pixels respectively in practice.

The first-stage shift register circuit portion 511 is constituted of first and second circuit portions 511a and 511b having circuit structures similar to those of the first and second circuit portions 51a and 51b of the first-stage shift register circuit portion 51 according to the first embodiment shown in FIG. 2 respectively. The second shift register circuit portion 512 is constituted of first and second circuit portions 512a and 512b having circuit structures similar to those of the first and second circuit portions 52a and 52b of the second-stage shift register circuit portion 52 according to the first embodiment shown in FIG. 2 respectively.

According to the third embodiment, the third-stage shift register circuit portion 513 includes first and second circuit portions 513a and 513b having circuit structures similar to those of the first and second circuit portions 53a and 53b of the third-stage shift register circuit portion 53 according to the first embodiment shown in FIG. 2 respectively, except that a transistor NT24 having the source connected to a node ND3 outputting an output signal SR13 is supplied with the higher voltage supply source VDD on the drain thereof. The fourth-stage shift register circuit portion 514 includes first and second circuit portions 514a and 514b having circuit structures similar to those of the first and second circuit portions 54a and 54b of the fourth-stage shift register circuit portion 54 according to the first embodiment shown in FIG. 2 respectively, except that a transistor NT34 having the source connected to a node ND3 outputting an output signal SR14 is supplied with the higher voltage supply source VDD on the drain thereof.

Further, the fifth-stage shift register circuit portion 515 includes first and second circuit portions 515a and 515b having circuit structures similar to those of the first and second circuit portions 55a and 55b of the fifth-stage shift register circuit portion 55 according to the first embodiment shown in FIG. 2 respectively, except that a transistor NT44 having the source connected to a node ND3 outputting an output signal SR15 is supplied with the higher voltage supply source VDD on the drain thereof.

The scanning direction switching circuit portion 610 has a circuit structure similar to that of the scanning direction switching circuit portion 60 according to the first embodiment shown in FIG. 2. According to the third embodiment, however, either the drain or the source of a transistor NT56 and either the source or the drain of another transistor NT57 are connected with each other. The input signal switching circuit portion 710 according to the third embodiment has a circuit structure similar to that of the input signal switching circuit portion 70 according to the first embodiment shown in FIG. 2.

The logic composition circuit portion 811 connected to a dummy gate line includes transistors NT81 to NT84, diode-connected transistors NT85 and NT86 and a capacitor C81. In other words, the logic composition circuit portion 811 according to the third embodiment has a circuit structure obtained by adding the diode-connected transistor NT86 to the circuit structure of the logic composition circuit portion 81 according to the first embodiment shown in FIG. 2. The transistors NT83 to NT86 and the capacitor C81 constitute a voltage supply source fixing circuit portion 811a. According to the third embodiment, the source of the transistor NT85 is connected to a node ND3 of the first-stage shift register circuit portion 511 outputting an output signal SR11. The source of the transistor NT86 is connected to the node ND3 of the fourth-stage shift register circuit portion 514 outputting the output signal SR14, while the drain thereof is connected to a node ND5 of the logic composition circuit portion 811.

The logic composition circuit portion 812 connected to a first-stage gate line includes transistors NT91 to NT94, diode-connected transistors NT95 and NT96 and a capacitor C91. In other words, the logic composition circuit portion 812 according to the third embodiment has a circuit structure obtained by adding the diode-connected transistor NT96 to the circuit structure of the logic composition circuit portion 82 according to the first embodiment shown in FIG. 2. The transistors NT93 to NT96 and the capacitor C91 constitute a voltage supply source fixing circuit portion 812a. According to the third embodiment, the source of the transistor NT95 is connected to a node ND3 of the second-stage shift register circuit portion 512 outputting an output signal SR12. The source of the transistor NT96 is connected to the node ND3 of the fifth-stage shift register circuit portion 515 outputting the output signal SR15, while the drain thereof is connected to a node ND5 of the logic composition circuit portion 812.

The logic composition circuit portion 813 connected to a second-stage gate line includes transistors NT101 to NT104, diode-connected transistors NT105 and NT106 and a capacitor C101. In other words, the logic composition circuit portion 813 according to the third embodiment has a circuit structure obtained by adding the diode-connected transistor NT106 to the circuit structure of the logic composition circuit portion 83 according to the first embodiment shown in FIG. 2.

The transistors NT103 to NT106 and the capacitor C101 constitute a voltage supply source fixing circuit portion 813a. According to the third embodiment, the source of the transistor NT105 is connected to the node ND3 of the third-stage shift register circuit portion 513 outputting the output signal SR13. The source of the transistor NT106 is connected to a node of a sixth-stage shift register circuit portion (not shown) outputting a shift signal, while the drain thereof is connected to the node ND5 of the logic composition circuit portion 813.

Figure 8:
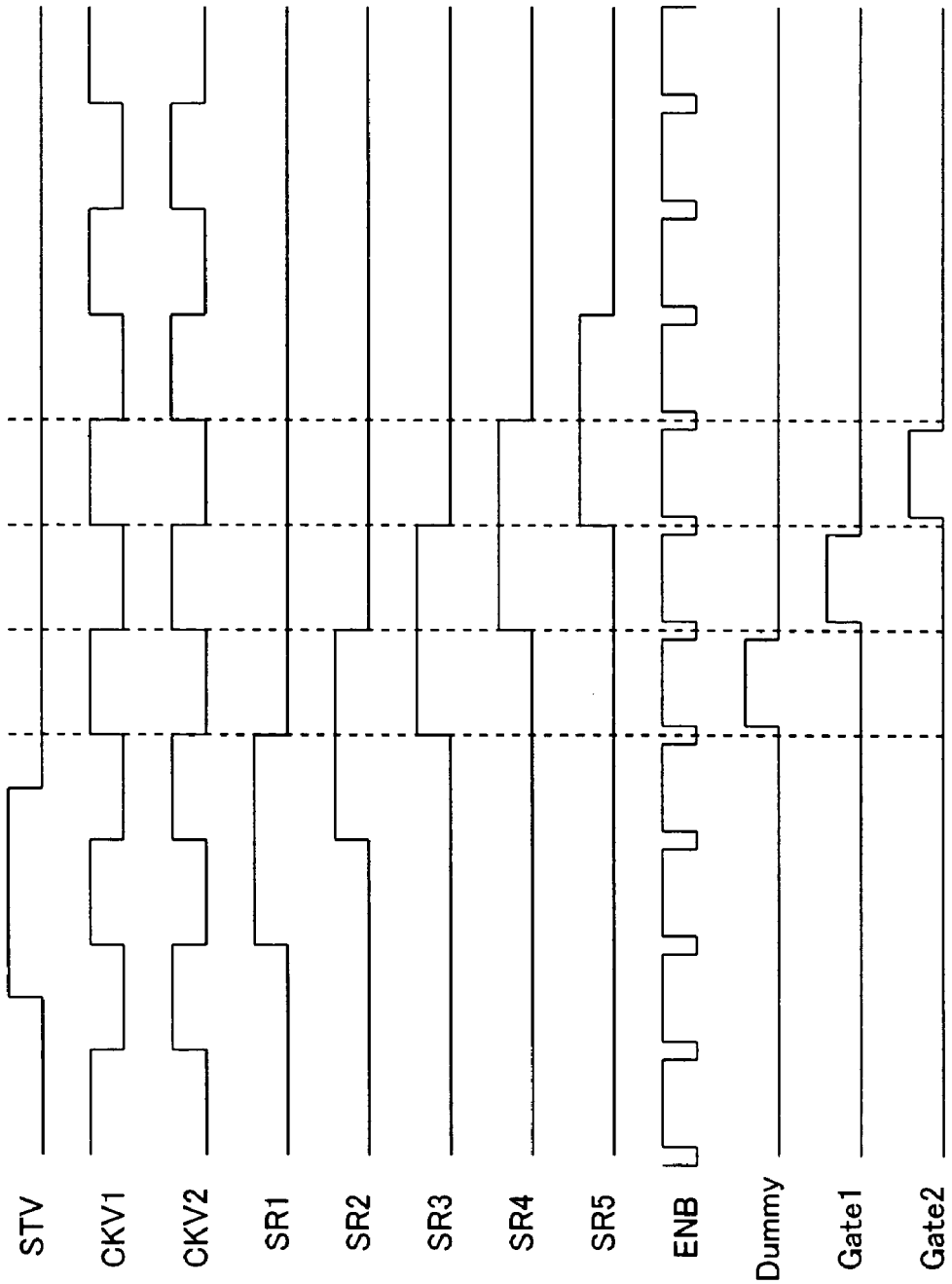
FIG. 8 is a voltage waveform diagram for illustrating operations of the V driver of the liquid crystal display according to the third embodiment of the present invention.

Operations of the V driver according to the third embodiment are now described with reference to FIGS. 7 and 8.

The V driver according to the third embodiment operates basically similarly to the V driver 5 according to the aforementioned first embodiment. According to the third embodiment, however, the V driver supplies the higher voltage supply source VDD to the drains of the transistors NT24 to NT44 connected to the nodes ND3 of the third- to fifth-stage shift register circuit portions 513 to 515 outputting the output signals SR13 to SR15 respectively. In other words, the V driver according to the third embodiment operates on the third- to fifth-stage shift register circuit portions 513 to 515 similarly to the V driver 5 according to the first embodiment operating on the first- and second-stage shift register circuit portions 51 and 52.

According to the third embodiment, the V driver fixes the voltage supply sources of shift output signals Dummy, Gate1 and Gate2 output from the logic composition circuit portions 811 to 813 to the corresponding gate lines respectively to low levels with the output signals from the shift register circuit portions. In the logic composition circuit portion 812 linked to the first-stage gate line, for example, the shift output signal Gate1 output to the first-stage gate line is at a high level due to a high-level enable signal ENB supplied through the transistors NT91 and NT92 both in ON-states. Thereafter the voltage supply source of the enable signal ENB goes down to a low level. Thus, the voltage supply source of the shift output signal Gate1 output to the first-stage gate line goes down to a low level due to the low-level enable signal ENB supplied through the transistors NT91 and NT92.

Thereafter the V driver according to the third embodiment inputs a high-level output signal SR15 (VDD) in the gate of the transistor NT93 of the logic composition circuit portion 812 linked to the first-stage gate line through the diode-connected transistor NT96. Thus, the transistor NT93 enters an ON-state. Therefore, the V driver fixes the voltage supply source of the node ND4 of the logic composition circuit portion 812 linked to the first-stage gate line to a low level by supplying a low-level voltage supply source from a lower voltage supply source VBB through the transistor NT93. Thus, the V driver fixes the voltage supply source of the shift output signal Gate1 output from the logic composition circuit portion 812 to the first-stage gate line to the low level. According to the third embodiment, the V driver charges the capacitor C91 when inputting the high-level output signal SR15 (VDD) in the gate of the transistor NT93. Thus, the V driver holds the voltage supply source of the node ND5 (gate voltage supply source of the transistor NT93) at a high level until the transistor NT94 subsequently enters an ON-state and the V driver supplies a low-level voltage supply source from the lower voltage supply source VBB through the transistor NT94. Therefore, the V driver holds the transistor NT93 in the ON-state until the transistor NT94 subsequently enters an ON-state, thereby holding the voltage supply source of the shift output signal Gate1 output from the logic composition circuit portion 812 to the first-stage gate line in the state fixed to the low level.

In each logic composition circuit portion, the V driver fixes the voltage supply source of the shift output signal through the output signal from the corresponding shift register circuit portion similarly to the aforementioned operation on the logic composition circuit portion 812 linked to the first-stage gate line. The remaining operations of the V driver according to the third embodiment are similar to those of the V driver 5 according to the first embodiment.

According to the third embodiment, capacitors C3, C13, C23, C33 and C43 are connected between the gates and the sources of transistors NT4, NT14, NT24, NT34 and NT44 respectively, and the V driver supplies the higher voltage supply source VDD to the drains of the transistors NT4, NT14, NT24, NT34 and NT44, thereby operating as follows:

In the second-stage shift register circuit portion 512, for example, the V driver raises the gate voltage supply source of the transistor NT14 (voltage supply source of a shift signal SR2) following rise of the source voltage supply source of the transistor NT14 when turning on the transistor NT14 in response to a clock signal CKV2, in order to maintain the gate-to-source voltage of the transistor NT14 connected with the capacitor C13. In the third-stage shift register circuit portion 513, the V driver raises the gate voltage supply source of the transistor NT24 (voltage supply source of a shift signal SR3) following rise of the source voltage supply source of the transistor NT24 when turning on the transistor NT24 in response to a clock signal CKV1, in order to maintain the gate-to-source voltage of the transistor NT24 connected with the capacitor C23. Thus, the gate voltage supply sources of the transistors NT14 and NT24 (voltage supply sources of the shift signals SR2 and SR3) go down to a level higher than VDD by a prescribed voltage (Vα) of at least the threshold voltage (Vt), whereby the V driver supplies the shift signals SR2 and SR3 having the voltage supply source (VDD+Vα) higher than VDD+Vt to the gates of the transistors NT81 and NT82 of the logic composition circuit portion 811 linked to the dummy gate line respectively. Thus, the V driver inhibits the voltage supply source of the shift output signal Dummy output to the dummy gate line through the transistors NT81 and NT82 of the logic composition circuit portion 811 from going down from VDD by the threshold voltage (Vt) of the transistors NT81 and NT82.

When provided with reset transistors PT39 and PT49 for turning on the transistors PT39 and PT49 in response to a start signal STV, the liquid crystal display according to the third embodiment can attain effects similar to those of the first embodiment such that the same can inhibit the logic composition circuit portions from outputting shift output signals to the corresponding gate lines at unintentional timing.

Fourth Embodiment

Figure 9:
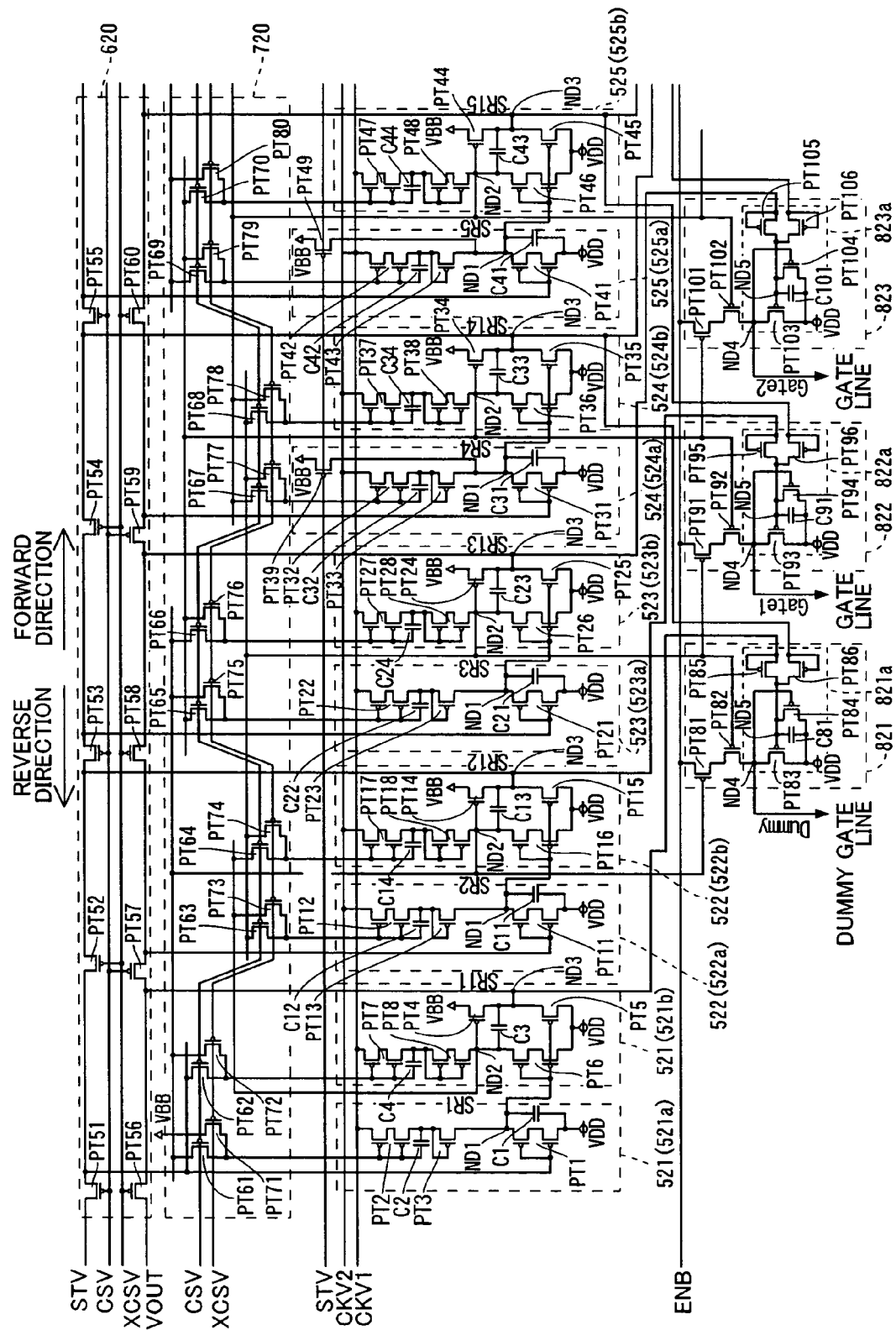
FIG. 9 is a circuit diagram in a V driver of a liquid crystal display according to a fourth embodiment of the present invention.

Referring to FIG. 9, a liquid crystal display according to a fourth embodiment of the present invention has a V driver, similar to that according to the aforementioned third embodiment, constituted of p-channel transistors.

As shown in FIG. 9, the V driver of the liquid crystal display according to the fourth embodiment is provided with a plurality of stages of shift register circuit portions 521 to 525, a scanning direction switching circuit portion 620, an input signal switching circuit portion 720 and a plurality of stages of logic composition circuit portions 821 to 823. The shift register circuit portions 522 to 525 are examples of the "first shift register circuit portion" or the "second shift register circuit portion" in the present invention. While FIG. 9 shows only five stages of shift register circuit portions 521 to 525 and three stages of logic composition circuit portions 821 to 823 in order to simplify the illustration, the shift register circuit portions and the logic composition circuit portions are provided in numbers responsive to the number of pixels respectively in practice.

The first shift register circuit portion 521 is constituted of first and second circuit portions 521a and 521b having circuit structures similar to those of the first and second circuit portions 501a and 501b of the first-stage shift register circuit portion 501 according to the second embodiment shown in FIG. 5 respectively. The second shift register circuit portion 522 is constituted of first and second circuit portions 522a and 522b having circuit structures similar to those of the first and second circuit portions 502a and 502b of the second-stage shift register circuit portion 502 according to the second embodiment shown in FIG. 5 respectively.

According to the fourth embodiment, the liquid crystal display supplies a lower voltage supply source VBB to the drains of transistors PT24 to PT44 of the third- to fifth-stage shift register circuit portions 523 to 525 having the sources connected to nodes ND3 outputting output signals SR13 to SR15 respectively. In other words, the third- to fifth-stage shift register circuit portions 523 to 525 are entirely identical in circuit structure to each other. More specifically, the third- to fifth-stage shift register circuit portions 523 to 525 include first and second circuit portions having circuit structures similar to those of the first and second circuit portions of the corresponding shift register circuit portions according to the second embodiment respectively.

The scanning direction switching circuit portion 620 basically has a circuit structure similar to that of the scanning direction switching circuit portion 600 according to the second embodiment shown in FIG. 5. In the scanning direction switching circuit portion 620 according to the fourth embodiment, however, either the drain or the source of a transistor PT56 and either the source or the drain of another transistor PT57 are connected with each other. The input signal switching circuit portion 720 has a circuit structure similar to that of the input signal switching circuit portion 700 according to the second embodiment shown in FIG. 5.

The logic composition circuit portions 821 to 823 have structures obtained by replacing the n-channel transistors constituting the logic composition circuit portions 811 to 813 according to the third embodiment shown in FIG. 7 with p-channel transistors respectively. More specifically, the logic composition circuit portion 821 linked to a dummy gate line according to the fourth embodiment has a circuit structure obtained by replacing the transistors NT81 to NT86 of the logic composition circuit portion 811 according to the third embodiment shown in FIG. 7 with transistors PT81 to PT86 respectively. The logic composition circuit portion 822 linked to a first-stage gate line according to the fourth embodiment has a circuit structure obtained by replacing the transistors NT91 to NT96 of the logic composition circuit portion 812 according to the third embodiment shown in FIG. 7 with transistors PT91 to PT96 respectively. Further, the logic composition circuit portion 823 linked to a second-stage gate line according to the fourth embodiment has a circuit structure obtained by replacing the transistors NT101 to NT106 of the logic composition circuit portion 813 according to the third embodiment shown in FIG. 7 with transistors PT101 to PT106 respectively. According to the fourth embodiment, the sources of the transistors PT83, PT93 and PT103 of the logic composition circuit portions 821 to 823 are connected to a higher voltage supply source VDD.

Figure 10:
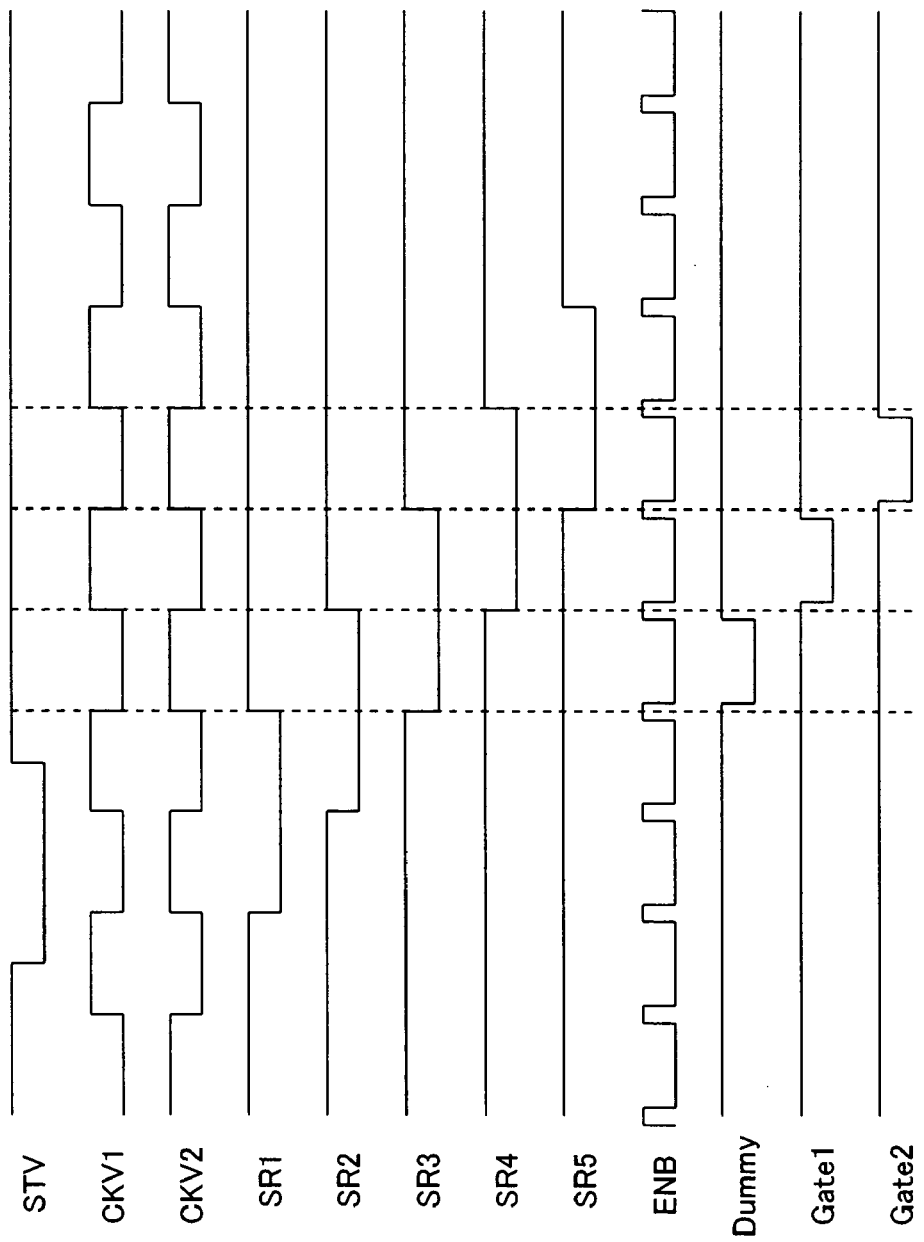
FIG. 10 is a voltage waveform diagram for illustrating operations of the V driver of the liquid crystal display according to the fourth embodiment of the present invention.

Operations of the V driver according to the fourth embodiment are now described with reference to FIGS. 9 and 10. The V driver according to the fourth embodiment inputs signals having waveforms obtained by inverting the high and low levels of the start signal STV, the clock signals CKV1 and CKV2 and the enable signal ENB according to the third embodiment shown in FIG. 8 as a start signal STV, clock signals CKV1 and CKV2 and an enable signal ENB respectively. Thus, the shift register circuit portions 521 to 525 according to the fourth embodiment output signals having waveforms obtained by inverting the high and low levels of shift signals SR1 to SR5 and the output signals SR11 to SR15 output from the shift register circuit portions 511 to 515 according to the third embodiment shown in FIG. 7 respectively. Further, the logic composition circuit portions 821 to 823 according to the fourth embodiment output signals having waveforms obtained by inverting the high and low levels of the shift output signals Dummy, Gate1 and Gate2 output from the logic composition circuit portions 811 to 813 according to the third embodiment shown in FIG. 7 respectively. The remaining operations of the V driver according to the fourth embodiment are similar to those of the V driver according to the aforementioned third embodiment shown in FIG. 7.

According to the fourth embodiment, capacitors C3, C13, C23, C33 and C43 are connected between the gates and the sources of transistors PT4, PT14, PT24, PT34 and PT44 respectively, while the V driver supplies a lower voltage supply source VBB to the drains of the transistors PT4, PT14, PT24, PT34 and PT44, thereby operating as follows:

In the second-stage shift register circuit portion 522, for example, the V driver lowers the gate voltage supply source of the transistor PT14 (voltage supply source of a shift signal SR2) following fall of the source voltage supply source of the transistor PT14 when turning on the transistor PT14 in response to the clock signal CKV2, in order to maintain the gate-to-source voltage of the transistor PT14 connected with the capacitor C13. In the third-stage shift register circuit portion 523, the V driver lowers the gate voltage supply source of the transistor PT24 (voltage supply source of a shift signal SR3) following fall of the source voltage supply source of the transistor PT24 when turning on the transistor PT24 in response to the clock signal CKV1, in order to maintain the gate-to-source voltage of the transistor PT24 connected with the capacitor C24. Thus, the gate voltage supply sources of the transistors PT14 and PT24 (voltage supply sources of the shift signals SR2 and SR3) go down to a level lower than VBB by a prescribed voltage (V$\alpha$) of at least the threshold voltage (Vt), whereby the V driver supplies the shift signals SR2 and SR3 having the voltage supply source (VBB−V$\alpha$) lower than VBB−Vt to the gates of the transistors PT81 and PT82 of the logic composition circuit portion 821 linked to the dummy gate line respectively. Thus, the V driver inhibits the voltage supply source of a shift output signal Dummy output to the dummy gate line through the transistors PT81 and PT82 of the logic composition circuit portion 821 from going up from VBB by the threshold voltage (Vt) of the transistors PT81 and PT82.

When provided with reset transistors PT39 and PT49 for turning on the transistors PT39 and PT49 in response to the start signal STV, the liquid crystal display according to the fourth embodiment can attain effects similar to those of the third embodiment such that the same can inhibit the logic composition circuit portions from outputting shift output signals to the corresponding gate lines at unintentional timing.

Fifth Embodiment

Figure 11:
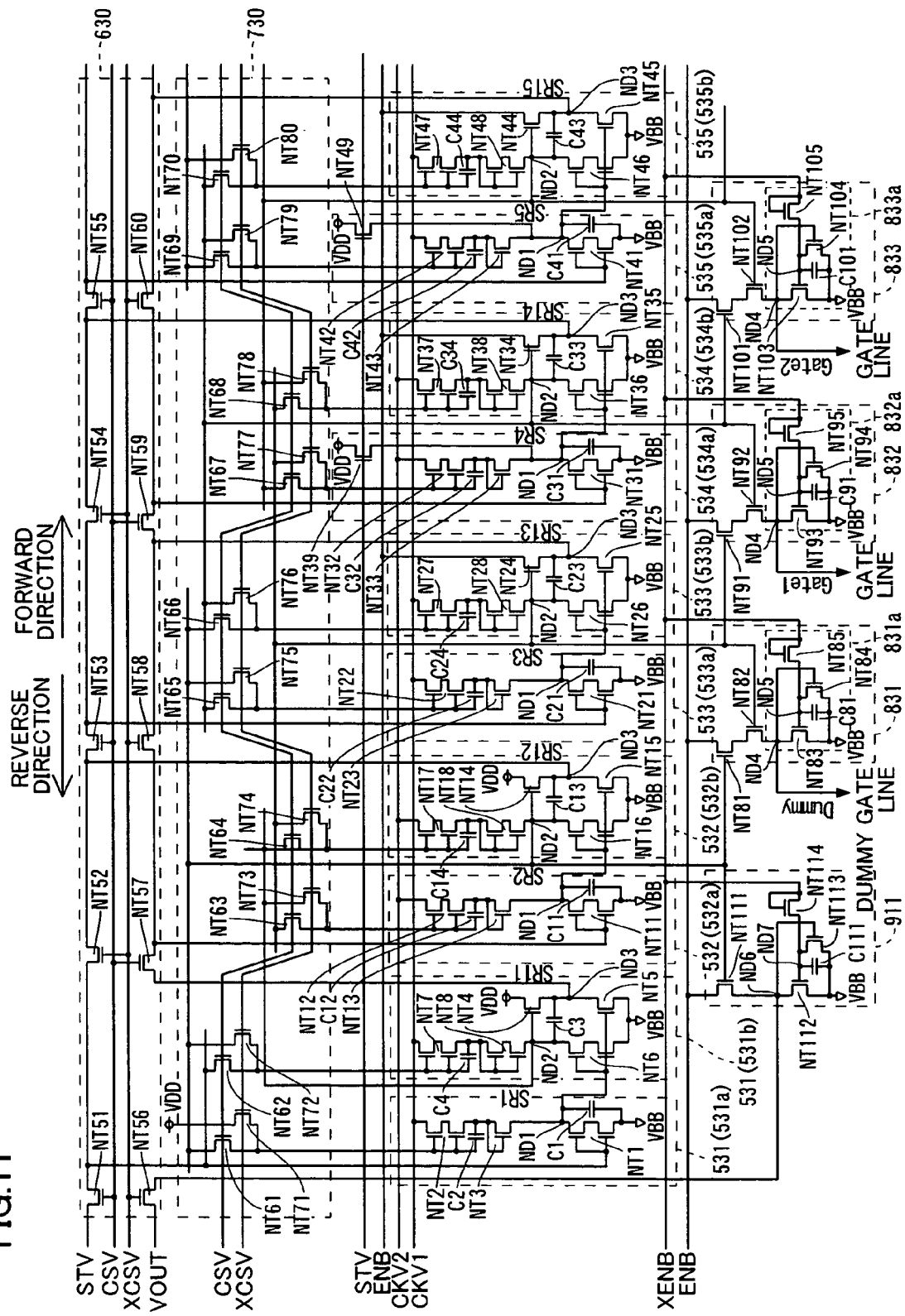
FIG. 11 is a circuit diagram in a V driver of a liquid crystal display according to a fifth embodiment of the present invention.

Referring to FIG. 11, a V driver of a liquid crystal display according to a fifth embodiment of the present invention supplies a common enable signal to the drains of transistors connected to nodes of third-stage and subsequent shift register circuit portions outputting output signals in a structure similar to that according to the aforementioned first embodiment.

As shown in FIG. 11, a plurality of stages of shift register circuit portions 531 to 535, a scanning direction switching circuit portion 630, an input signal switching circuit portion 730, a plurality of stages of logic composition circuit portions 831 to 833 and a circuit portion 911 are provided in the V driver according to the fifth embodiment. While FIG. 11 shows only five stages of shift register circuit portions 531 to 535 and three stages of logic composition circuit portions 831 to 833 in order to simplify the illustration, the shift register circuit portions and the logic composition circuit portions are provided in numbers responsive to the number of pixels respectively in practice.

The first-stage shift register circuit portion 531 is constituted of first and second circuit portions 531a and 531b having circuit structures similar to those of the first and second circuit portions 51a and 51b of the first-stage shift register circuit portion 51 according to the first embodiment shown in FIG. 2 respectively. Further, the second-stage shift register circuit portion 532 is constituted of first and second circuit portions 532a and 532b having circuit structures similar to those of the first and second circuit portions 52a and 52b of the second-stage shift register circuit portion 52 according to the first embodiment shown in FIG. 2 respectively.

According to the fifth embodiment, an enable signal line (ENB) is connected to the third-, fourth- and fifth-stage shift register circuit portions 533, 534 and 535 respectively. More specifically, the third-stage shift register circuit portion 533 is constituted of first and second circuit portions 533a and 533b. The first and second circuit portions 533a and 533b have circuit structures similar to those of the first and second circuit portions 53a and 53b of the third-stage shift register circuit portion 53 according to the first embodiment shown in FIG. 2 respectively. According to the fifth embodiment, the enable signal line (ENB) is connected to the drain of a transistor NT24.

The fourth-stage shift register circuit portion 534 is constituted of first and second circuit portions 534a and 534b. The first and second circuit portions 534a and 534b have circuit structures similar to those of the first and second circuit portions 54a and 54b of the fourth-stage shift register circuit portion 54 according to the first embodiment shown in FIG. 2 respectively. According to the fifth embodiment, the enable signal line (ENB) is connected to the drain of a transistor NT34. The fifth-stage shift register circuit portion 535 is constituted of first and second circuit portions 535a and 535b. The first and second circuit portions 535a and 535b have circuit structures similar to those of the first and second circuit portions 55a and 55b of the fifth-stage shift register circuit portion 55 according to the first embodiment shown in FIG. 2 respectively. According to the fifth embodiment, the enable signal line (ENB) is connected to the drain of a transistor NT44.

The scanning direction switching circuit portion 630 has a circuit structure similar to that of the scanning direction switching circuit portion 60 according to the first embodiment shown in FIG. 2. The input signal switching circuit portion 730 according to the fifth embodiment has a circuit structure similar to that of the input signal switching circuit portion 70 according to the first embodiment shown in FIG. 2. The logic composition circuit portions 831 to 833 according to the fifth embodiment have circuit structures similar to those of the logic composition circuit portions 81 to 83 according to the first embodiment shown in FIG. 2 respectively. The logic composition circuit portions 831 to 833 include voltage supply source fixing circuit portions 831a to 833a having circuit structures similar to those of the voltage supply source fixing circuit portions 81a to 83a according to the first embodiment shown in FIG. 2 respectively. The circuit portion 911 has a circuit structure similar to that of the circuit portion 91 according to the first embodiment shown in FIG. 2.

Figure 12:
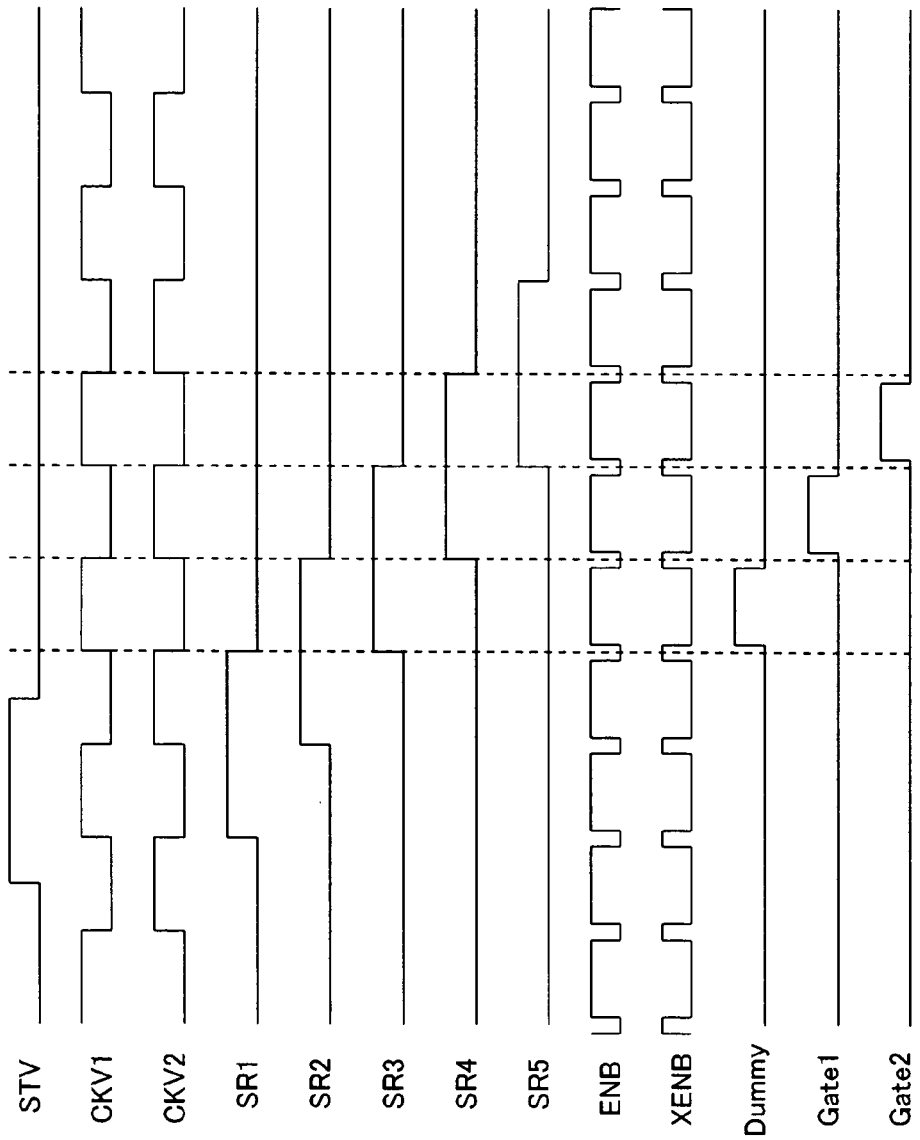
FIG. 12 is a voltage waveform diagram for illustrating operations of the V driver of the liquid crystal display according to the fifth embodiment of the present invention.

Operations of the V driver according to the fifth embodiment are now described with reference to FIGS. 11 and 12.

The V driver according to the fifth embodiment basically operates similarly to the V driver 5 according to the aforementioned first embodiment. However, the V driver according to the fifth embodiment supplies a common enable signal ENB in the drains of transistors NT24 to NT44 connected to nodes ND3 of the third- to fifth-stage shift register circuit portions 533 to 535 outputting output signals SR13 to SR15 respectively, dissimilarly to the aforementioned first embodiment.

More specifically, the V driver operates in the first- and second-stage shift register circuit portions 531 and 532 similarly to the V driver 5 according to the first embodiment operating on the first- and second-stage shift register circuit portions 51 and 52 respectively. Then, the V driver inputs a high-level shift signal SR2 (VDD+Vα) from the second-stage shift register circuit portion 532 in the drain of a transistor NT66. Thus, the source voltage supply source of the transistor NT66 turned on through a scanning direction switching signal CSV of a voltage supply source VDD received in the gate thereof reaches a level (VDD−Vt). Therefore, the V driver inputs the voltage supply source (VDD−Vt) in the gate of a transistor NT27 of the third-stage shift register circuit portion 533.

The V driver inputs a high-level output signal SR12 (VDD) in the gate of a transistor NT21. The V driver inputs a low-level shift signal SR4 in the gate of a transistor NT22 from the fourth-stage shift register circuit portion 534. Thus, the transistors NT21 and NT27 enter ON-states, while the transistor NT22 enters an OFF-state. Therefore, the voltage supply source of a node ND1 of the third-stage shift register circuit portion 533 goes down to a low level due to a low-level voltage supply source supplied from a lower voltage supply source VBB through the transistor NT21. Thus, the transistors NT25 and NT26 enter OFF-states. In this state, a clock signal CKV1 input in the drain of the transistor NT27 goes up from a low level to a high level. Thus, the voltage supply source of a node ND2 of the third-stage shift register circuit portion 533 goes up to a high level, thereby turning on the transistor NT24. At this time, the V driver supplying a low-level enable signal ENB to the drain of the transistor 24 holds the source voltage supply source of the transistor NT24 (voltage supply source of a node ND3) at a low level.

Thereafter the voltage supply source of the enable signal ENB goes up from the low level to a high level according to the fifth embodiment. Thus, the voltage supply source of the node ND3 of the third-stage shift register circuit portion 533 goes up to a high level. At this time, the V driver boots the voltage supply source of the node ND2 of the third-stage shift register circuit portion 533 following rise of the voltage supply source of the node ND3 in order to maintain the gate-to-source voltage of the transistor NT24 with the capacitor C23, thereby raising the same. Thus, the voltage supply source of the node ND2 of the third-stage shift register circuit portion 533 goes up to a level (VDD+Vβ>VDD+Vt) higher than VDD by a prescribed voltage (Vβ) of at least the threshold voltage (Vt). At this time, the voltage supply source (VDD+ VP) of the node ND2 is higher than a raised voltage supply source (VDD+Vα) of nodes ND2 of the first- and second-stage shift register circuit portions 531 and 532. Then, the third-stage shift register circuit portion 533 outputs a high-level shift signal SR3 having the voltage supply source (VDD+VP) of at least VDD+Vt from the node ND2. The fourth- and fifth-stage shift register circuit portions 534 and 535 also output high-level shift signals SR4 and SR5 having the voltage supply source (VDD+Vβ) of at least VDD+Vt further higher than the high-level shift signals (VDD+Vα) output from the shift register circuit portions according to the first embodiment through operations similar to that in the aforementioned third-stage shift register circuit portion 533.

The V driver inputs the high-level shift signal SR3 (VDD+Vβ>VDD+Vt) from the third-stage shift register circuit portion 533 in the drains of transistors NT63 and NT68 respectively. Thus, both of the source voltage supply sources of the transistors NT63 and NT68 turned on through the scanning direction switching signal CSV of the voltage supply source VDD received in the gates thereof reach a level (VDD−Vt). Therefore, the V driver inputs the voltage supply source (VDD−Vt) in the gates of transistors NT12 and NT37 of the second- and fourth-stage shift register circuit portions 532 and 534. In this state, a clock signal CKV2 rises from a low level (VBB) to a high level (VDD), whereby the gate voltage supply source of the transistor NT12 of the second-stage shift register circuit portion 532 goes up from (VDD−Vt) by the difference between VDD and VBB while the gate-to-source voltage is held through a capacitor C12. Thus, the V driver inhibits a voltage supply source generated on a node ND1 of the transistor NT12 from going down from VDD by the threshold voltage (Vt) of the transistor NT12. Therefore, the V driver inhibits a high-level voltage supply source generated on the node ND1 of the second-stage shift register circuit portion 532 from going down. The clock signal CKV2 rises from the low level (VBB) to the high level (VDD) while the V driver inputs the voltage supply source (VDD−Vt) in the gate of the transistor NT37 of the fourth-stage shift register circuit portion 534, whereby the gate voltage supply source of the transistor NT37 goes up from (VDD−Vt) by the difference between VDD and VBB while the gate-to-source voltage is held through a capacitor C34. Thus, the V driver inhibits a voltage supply source generated on a node ND2 of the transistor NT37 from going down from VDD by the threshold voltage (Vt) of the transistor NT37. Therefore, the V driver inhibits a high-level voltage supply source generated on the node ND2 of the fourth-stage shift register circuit portion 534 from going down. Thus, the V driver inhibits high-level voltage supply sources generated on the nodes ND1 and ND2 from going down when the voltage supply source of the node ND1 or ND2 goes up following the rise of the voltage supply source of the clock signal CKV1 or CKV2 to the high level (VDD) in each shift register circuit portion.

The V driver also inputs the high-level shift signal SR3 (VDD+Vβ) from the third-stage shift register circuit portion 533 in the gate of a transistor NT91 of the logic composition circuit portion 832 linked to a first-stage gate line. Further, the V driver inputs a high-level shift signal SR4 (VDD+Vβ) from the fourth-stage shift register circuit portion 534 in the gate of a transistor NT92 of the logic composition circuit portion 832 linked to the first-stage gate line. Thus, the V driver inhibits a voltage supply source generated on a node ND4 from going down from VDD by the threshold voltage (Vt) of the transistors NT91 and NT92 when the voltage supply source of the enable signal ENB input in the drain of the transistor NT91 goes up to the high level (VDD) in the logic composition circuit portion 832 linked to the first-stage gate line. The V driver inhibits a high-level voltage supply source generated on a node ND4 from going down when the voltage supply source of the node ND4 goes up following rise of the voltage supply source of the enable signal ENB to the high level (VDD) also in each of logic composition circuit portions linked to second-stage and subsequent gate lines in this manner. Thus, the V driver inhibits high-level voltage supply sources of shift output signals Gate1 and Gate2 output to the gate lines from going down.

The remaining operations of the V driver according to the fifth embodiment are similar to those of the V driver 5 according to the aforementioned first embodiment.

According to the fifth embodiment, as hereinabove described, the drains of the transistors NT24, NT34 and NT44 of the shift register circuit portions 533 to 535 are connected with the enable signal line (ENB) while the gates thereof are supplied with the clock signal CKV1 (CKV2) and the enable signal ENB is switched from the low level to the high level after the clock signal CKV1 (CKV2) goes up from the low level to the high level, whereby the V driver can raise the source voltage supply source of the transistor NT24 from a low level (VBB) to a high level (VDD) with the enable signal ENB after turning on the transistor NT24 while raising the gate voltage supply source of the transistor NT24 from the low level (VBB) to the high level (VDD) with the clock signal CKV1 in the third-stage shift register circuit portion 533, for example. Thus, the V driver can raise the gate voltage supply source of the transistor NT24 by the current rise (Vβ) of the source voltage supply source of the transistor NT24. Further, the V driver can raise the source voltage supply source of the transistor NT34 from the low level (VBB) to the high level (VDD) with the enable signal ENB after turning on the transistor NT34 while raising the gate voltage supply source of the transistor NT34 from the low level (VBB) to the high level (VDD) with the clock signal CKV2 in the fourth-stage shift register circuit portion 534. Thus, the V driver can raise the gate voltage supply source of the transistor NT34 by the current rise (Vβ) of the source voltage supply source of the transistor NT34. Thus, the V driver, capable of further raising the voltage supply source (VDD+Vβ>VDD+Vt) of the shift signals SR3 and SR4 as compared with a case of connecting the drains of the transistors NT24 and NT34 to a fixed higher voltage supply source VDD, can more easily set the voltage supply sources of the shift signals SR3 and SR4 to the level higher than VDD by at least the threshold voltage (Vt). Therefore, the V driver can more easily supply the shift signals SR3 and SR4 having voltage supply sources of at least VDD+Vt to the gates of the transistors NT91 and NT92 of the logic composition circuit portion 832 linked to the first-stage gate line respectively. Thus, the V driver can further inhibit the voltage supply source of the shift output signal Gate1 output to the first-stage gate line through the transistors NT91 and NT92 of the logic composition circuit portion 832 from going down by the threshold voltage (Vt).

When provided with reset transistors NT39 and NT49 for turning on the transistors NT39 and NT49 in response to a start signal STV, the liquid crystal display according to the fifth embodiment can attain effects similar to those of the aforementioned first embodiment such that the same can inhibit the logic composition circuit portions from outputting shift output signals to the corresponding gate lines at unintentional timing in addition to the aforementioned effects.

Sixth Embodiment

Figure 13:
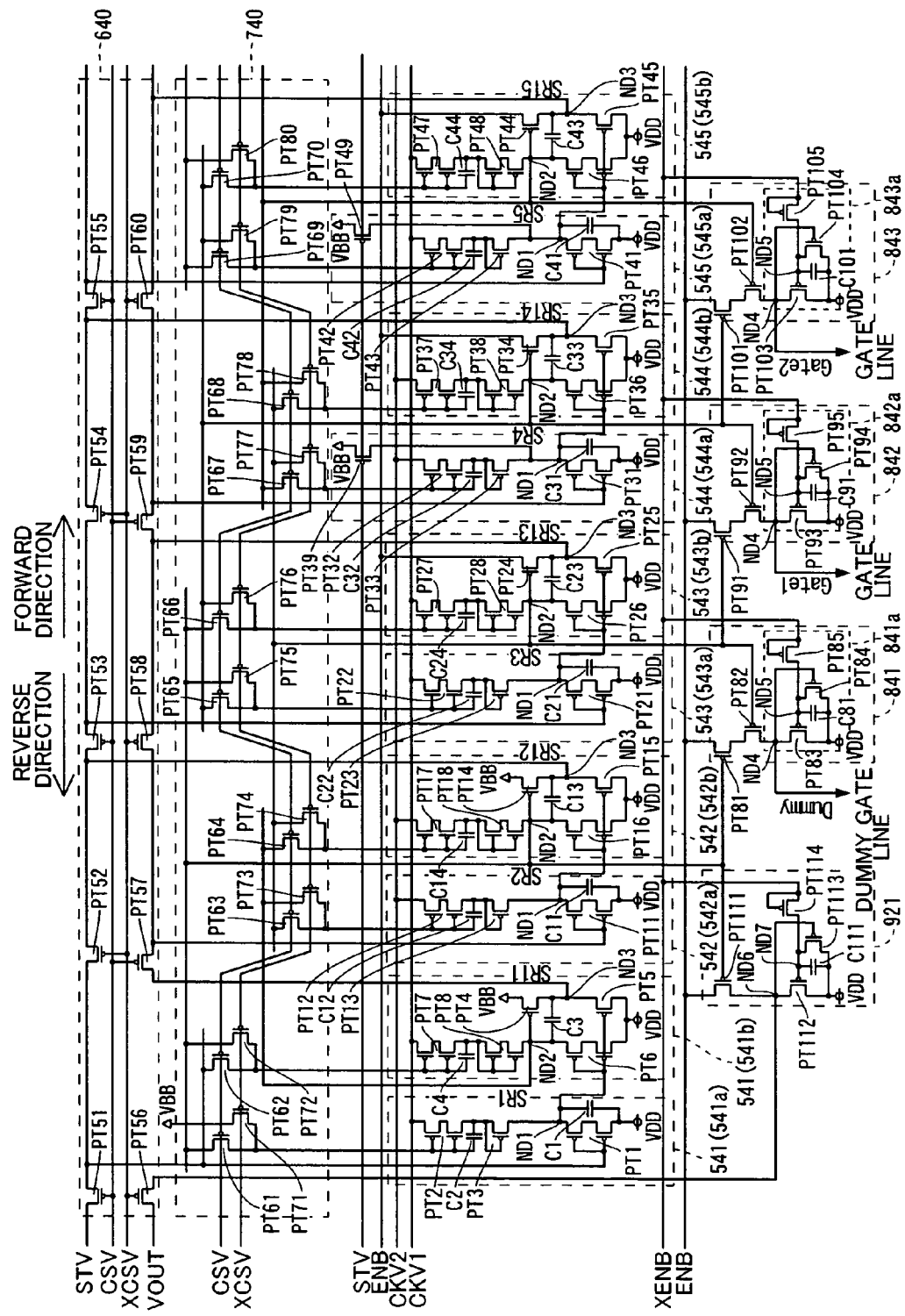
FIG. 13 is a circuit diagram in a V driver of a liquid crystal display according to a sixth embodiment of the present invention.

Referring to FIG. 13, a V driver similar to the V driver 5 according to the aforementioned fifth embodiment is constituted of p-channel transistors in a liquid crystal display according to a sixth embodiment of the present invention.

As shown in FIG. 13, a plurality of stages of shift register circuit portions 541 to 545, a scanning direction switching circuit portion 640, an input signal switching circuit portion 740, a plurality of stages of logic composition circuit portions 841 to 843 and a circuit portion 921 are provided in the V driver according to the sixth embodiment. While FIG. 13 shows only five stages of shift register circuit portions 541 to 545 and three stages of logic composition circuit portions 841 to 843 in order to simplify the illustration, the shift register circuit portions and the logic composition circuit portions are provided in numbers responsive to the number of pixels respectively in practice.

The first-stage shift register circuit portion 541 is constituted of first and second circuit portions 541a and 541b having circuit structures similar to those of the first and second circuit portions 501a and 501b of the first-stage shift register circuit portion 501 according to the second embodiment shown in FIG. 5 respectively. Further, the second-stage shift register circuit portion 542 is constituted of first and second circuit portions 542a and 542b having circuit structures similar to those of the first and second circuit portions 502a and 502b of the second-stage shift register circuit portion 502 according to the second embodiment shown in FIG. 5 respectively.

According to the sixth embodiment, an enable signal line (ENB) is connected to the third-, fourth- and fifth-stage shift register circuit portions 543, 544 and 545 respectively. More specifically, the third-stage shift register circuit portion 543 is constituted of first and second circuit portions 543a and 543b. The first and second circuit portions 543a and 543b have circuit structures similar to those of the first and second circuit portions 503a and 503b of the third-stage shift register circuit portion 503 according to the second embodiment shown in FIG. 5 respectively. According to the sixth embodiment, the enable signal line (ENB) is connected to the drain of a transistor PT24.

The fourth-stage shift register circuit portion 544 is constituted of first and second circuit portions 544a and 544b. The first and second circuit portions 544a and 544b have circuit structures similar to those of the first and second circuit portions 504a and 504b of the fourth-stage shift register circuit portion 504 according to the second embodiment shown in FIG. 5 respectively. According to the sixth embodiment, the enable signal line (ENB) is connected to the drain of a transistor PT34. The fifth-stage shift register circuit portion 545 is constituted of first and second circuit portions 545a and 545b. The first and second circuit portions 545a and 545b have circuit structures similar to those of the first and second circuit portions 505a and 505b of the fifth-stage shift register circuit portion 505 according to the second embodiment shown in FIG. 5 respectively. According to the sixth embodiment, the enable signal line (ENB) is connected to the drain of a transistor PT44.

The scanning direction switching circuit portion 640 has a circuit structure similar to that of the scanning direction switching circuit portion 600 according to the second embodiment shown in FIG. 5. The input signal switching circuit portion 740 has a circuit structure similar to that of the input signal switching circuit portion 700 according to the second embodiment shown in FIG. 5. The logic composition circuit portions 841 to 843 have circuit structures similar to those of the logic composition circuit portions 801 to 803 according to the second embodiment shown in FIG. 5 respectively. The logic composition circuit portions 841 to 843 include voltage supply source fixing circuit portions 841a to 843a having circuit structures similar to those of the voltage supply source fixing circuit portions 801a to 803a according to the second embodiment shown in FIG. 5 respectively. The circuit portion 921 has a circuit structure similar to that of the circuit portion 901 according to the second embodiment shown in FIG. 5.

Figure 14:
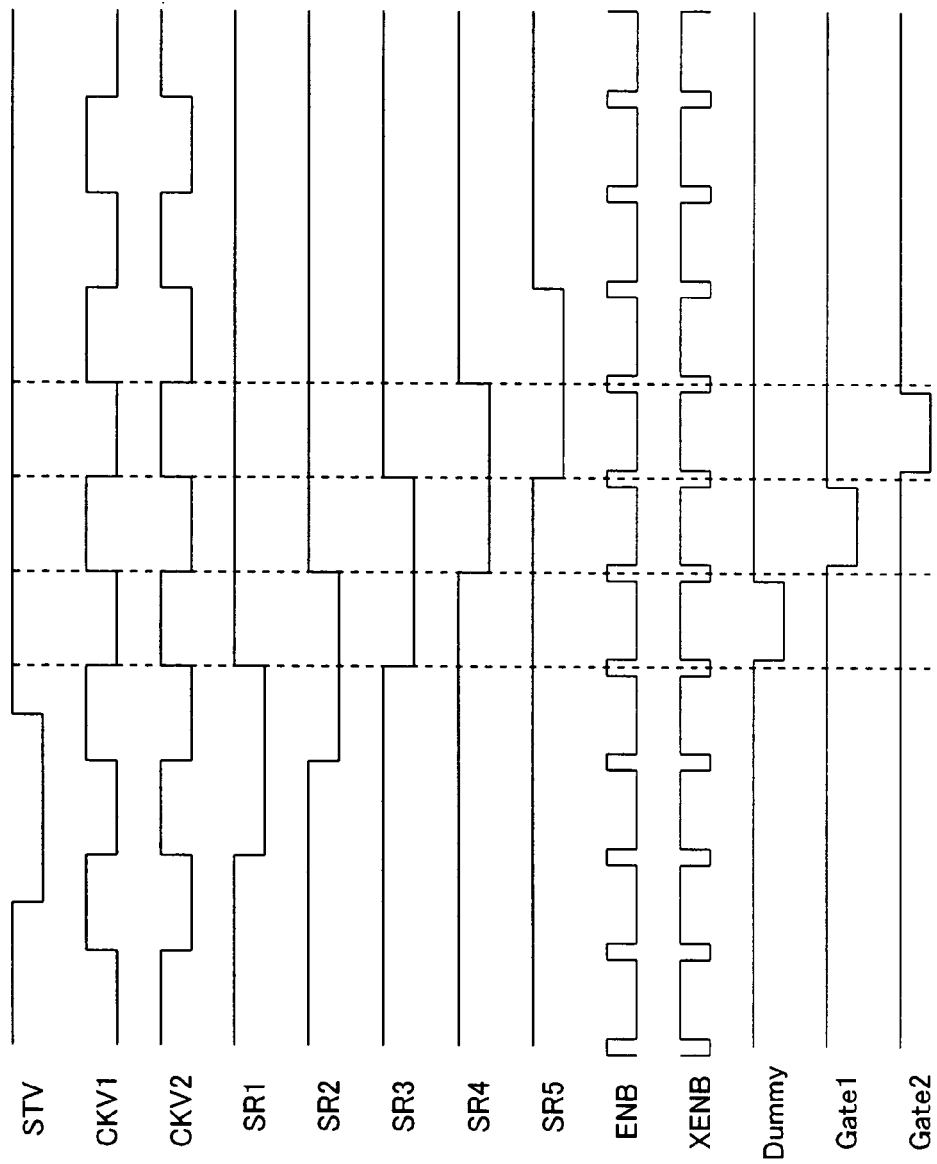
FIG. 14 is a voltage waveform diagram for illustrating operations of the V driver of the liquid crystal display according to the sixth embodiment of the present invention.

FIG. 14 is a voltage waveform diagram for illustrating operations of the V driver of the liquid crystal display according to the sixth embodiment of the present invention. The operations of the V driver of the liquid crystal display according to the sixth embodiment are now described with reference to FIGS. 13 and 14. According to the sixth embodiment, the V driver inputs signals having waveforms obtained by inverting the high and low levels of the start signal STV, the clock signals CKV1 and CKV2, the enable signal ENB and the inverted enable signal XENB according to the fifth embodiment shown in FIG. 12 as a start signal STV, clock signals CKV1 and CKV2, an enable signal ENB and an inverted enable signal XENB respectively. Thus, the shift register circuit portions 541 to 545 according to the sixth embodiment output signals having waveforms obtained by inverting the high and low levels of the shift signals SR1 to SR5 output from the shift register circuit portions 531 to 535 according to the fifth embodiment shown in FIG. 11 respectively. Further, the logic composition circuit portions 841 to 843 according to the sixth embodiment output signals having waveforms obtained by inverting the high and low levels of the shift output signals Dummy, Gate1 and Gate2 output from the logic composition circuit portions 831 to 833 according to the fifth embodiment shown in FIG. 11 respectively. The remaining operations of the V driver according to the sixth embodiment are similar to those of the V driver according to the aforementioned fifth embodiment shown in FIG. 11.

When provided with reset transistors PT39 and PT49 for turning on the transistors PT39 and PT49 in response to the start signal STV, the liquid crystal display according to the sixth embodiment can attain effects similar to those of the fifth embodiment such that the same can inhibit the logic composition circuit portions from outputting shift output signals to corresponding gate lines at unintentional timing.

According to the sixth embodiment, the V driver supplies the clock signal CKV1 (CKV2) to the gates of transistors PT24, PT34 and PT44 of the shift register circuit portions 543 to 545 while supplying the enable signal ENB switched between high and low levels (VDD and VBB) to the drains thereof, thereby operating as follows: In the third-stage shift register circuit portion 543, for example, the source voltage supply source of the transistor PT24 goes down from VDD to VBB through the enable signal ENB after the transistor PT24 enters an ON-state through the clock signal CKV1, whereby the gate voltage supply source of the transistor PT24 goes down by the fall (Vβ) of the voltage supply source. In the fourth-stage shift register circuit portion 544, the source voltage supply source of the transistor PT34 goes down from VDD to VBB through the enable signal ENB after the transistor PT34 enters an ON-state through the clock signal CKV2, whereby the gate voltage supply source of the transistor PT34 goes down by the fall (Vβ) of the voltage supply source. Thus, the V driver, capable of further lowering the voltage supply sources (VBB−Vβ<VBB−Vt) of the shift signals SR3 and SR4 as compared with a case of connecting the drains of the transistors PT24 and PT34 to a fixed lower voltage supply source VBB, can more easily set the voltage supply sources of the shift signals SR3 and SR4 to a level lower than VBB by at least the threshold voltage (Vt). Therefore, the V driver can more easily supply the shift signals SR3 and SR4 having the voltage supply source (VBB−Vβ) of not more than VBB−Vt to the gates of the transistors PT91 and PT92 of the logic composition circuit portion 842 linked to a first-stage gate line respectively. Thus, the V driver can further inhibit the voltage supply source of the shift output signal Gate1 output to the first-stage gate line through the transistors PT91 and PT92 of the logic composition circuit portion 842 from going up by the threshold voltage (Vt).

Seventh Embodiment

Figure 15:
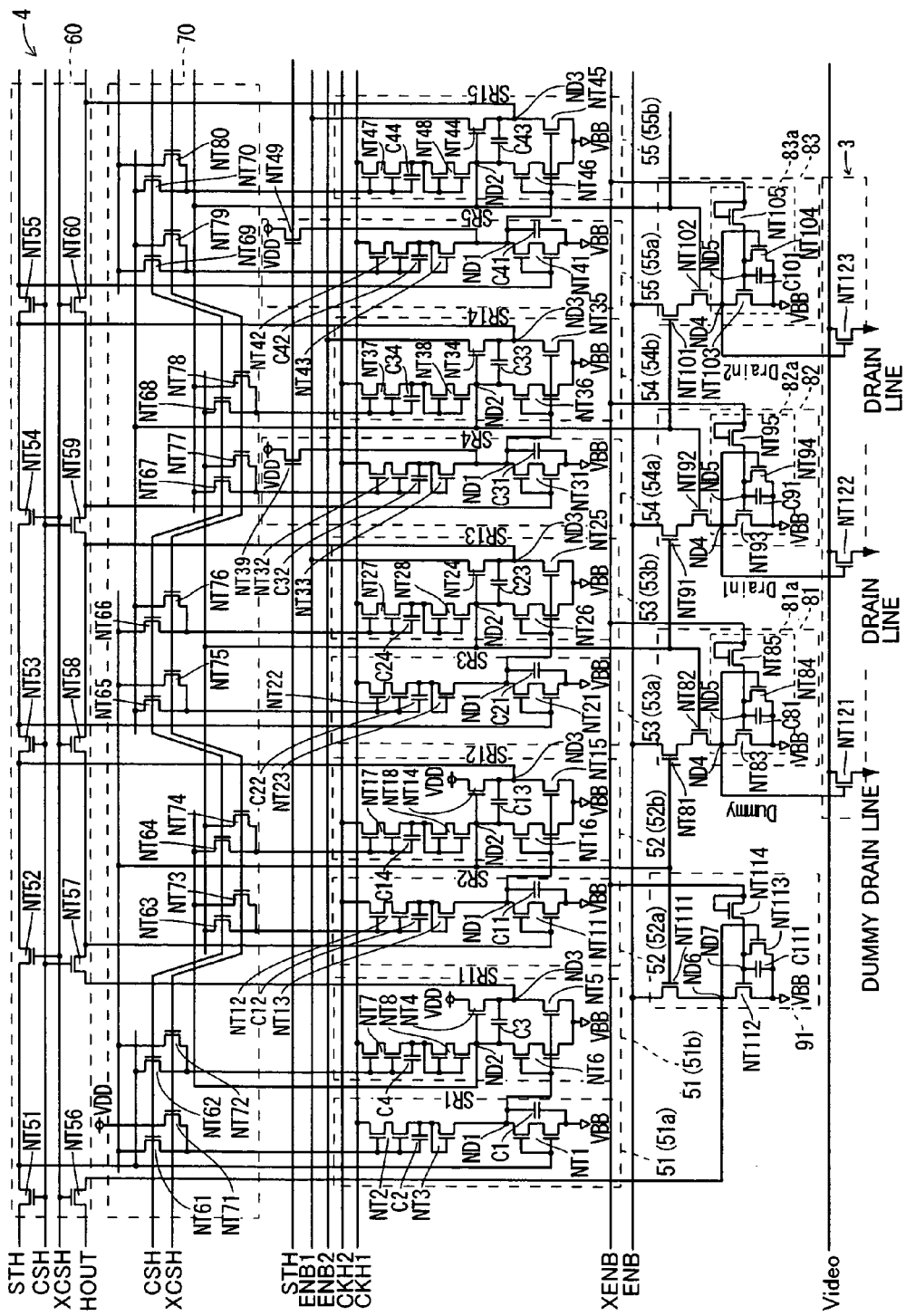
FIG. 15 is a circuit diagram in an H driver of a liquid crystal display according to a seventh embodiment of the present invention.

Referring to FIG. 15, the present invention is applied to an H driver 4 for driving (scanning) drain lines in a liquid crystal display according to a seventh embodiment of the present invention, in a structure similar to that of the liquid crystal display according to the first embodiment shown in FIG. 1.

As shown in FIG. 15, a plurality of stages of shift register circuit portions 51 to 55, a scanning direction switching circuit portion 60, an input signal switching circuit portion 70 and a plurality of stages of logic composition circuit portions 81 to 83 are provided in the H driver 4 of the liquid crystal display according to the seventh embodiment, similarly to the V driver 5 according to the first embodiment shown in FIG. 2. While FIG. 15 shows only five stages of shift register circuit portions 51 to 55 and three stages of logic composition circuit portions 81 to 83 in order to simplify the illustration, the shift register circuit portions and the logic composition circuit portions are provided in numbers responsive to the number of pixels respectively in practice. According to the seventh embodiment, the logic composition circuit portions 81 to 83 are connected with horizontal switches 3. More specifically, the horizontal switches 3 include n-channel transistors NT121 to NT123 in a number responsive to the number of the logic composition circuit portions 81 to 83. The n-channel transistors NT121 to NT123 are hereinafter referred to as transistors NT121 to NT123 respectively.

The source of the transistor NT121 is connected to a dummy drain line, while the drain thereof is connected to a video signal line (Video). The gate of this transistor NT121 is connected to a node ND4 of the logic composition circuit portion 81. The source of the transistor NT122 is connected to a first-stage drain line, while the drain thereof is connected to the video signal line (Video). The gate of this transistor NT122 is connected to a node ND4 of the logic composition circuit portion 82. The source of the transistor NT123 is connected to a second-stage drain line, while the drain thereof is connected to the video signal line (Video). The gate of this transistor NT123 is connected to a node ND4 of the logic composition circuit portion 83. The H driver 4 according to the seventh embodiment supplies a start signal STH, a scanning direction switching signal CSH, an inverted scanning direction switching signal XCSH and clock signals CKH1 and CKH2 in place of the start signal STV, the scanning direction switching signal CSV, the inverted scanning direction switching signal XCSV and the clock signals CKV1 and CKV2 supplied by the V driver 5 according to the first embodiment shown in FIG. 2 respectively. The start signal STH, the scanning direction switching signal CSH, the inverted scanning direction switching signal XCSH and the clock signals CKH1 and CKH2 have waveforms similar to those of the start signal STV, the scanning direction switching signal CSV, the inverted scanning direction switching signal XCSV and the clock signals CKV1 and CKV2 according to the aforementioned first embodiment respectively.

Operations of the H driver 4 according to the seventh embodiment are now described with reference to FIG. 15. In the H driver 4 according to the seventh embodiment, the logic composition circuit portions 81 to 83 sequentially output high-level shift output signals Dummy, Drain1 and Drain2 corresponding to the shift output signals Dummy, Gate1 and Gate2 according to the aforementioned first embodiment respectively. The H driver 4 inputs the shift output signals Dummy, Drain1 and Drain2 in the gates of the transistors NT121 to NT123 of the corresponding horizontal switches 3 respectively. Thus, the transistors NT121 to NT123 of the horizontal switches 3 sequentially enter ON-states. Therefore, the H driver 4 outputs video signals from the video signal line (Video) to the drain lines through the transistors NT121 to NT123 of the horizontal switches 3 respectively. The remaining operations of the H driver 4 according to the seventh embodiment are similar to those of the V driver 5 according to the aforementioned first embodiment shown in FIG. 2.

When provided with reset transistors NT39 and NT49 for turning on the transistors NT39 and NT49 in response to the start signal STH, the liquid crystal display according to the seventh embodiment can attain effects similar to those of the aforementioned first embodiment such that the same can inhibit the logic composition circuit portions from outputting shift output signals to the corresponding drain lines at unintentional timing in addition to the aforementioned effects.

Eighth Embodiment

Figure 16:
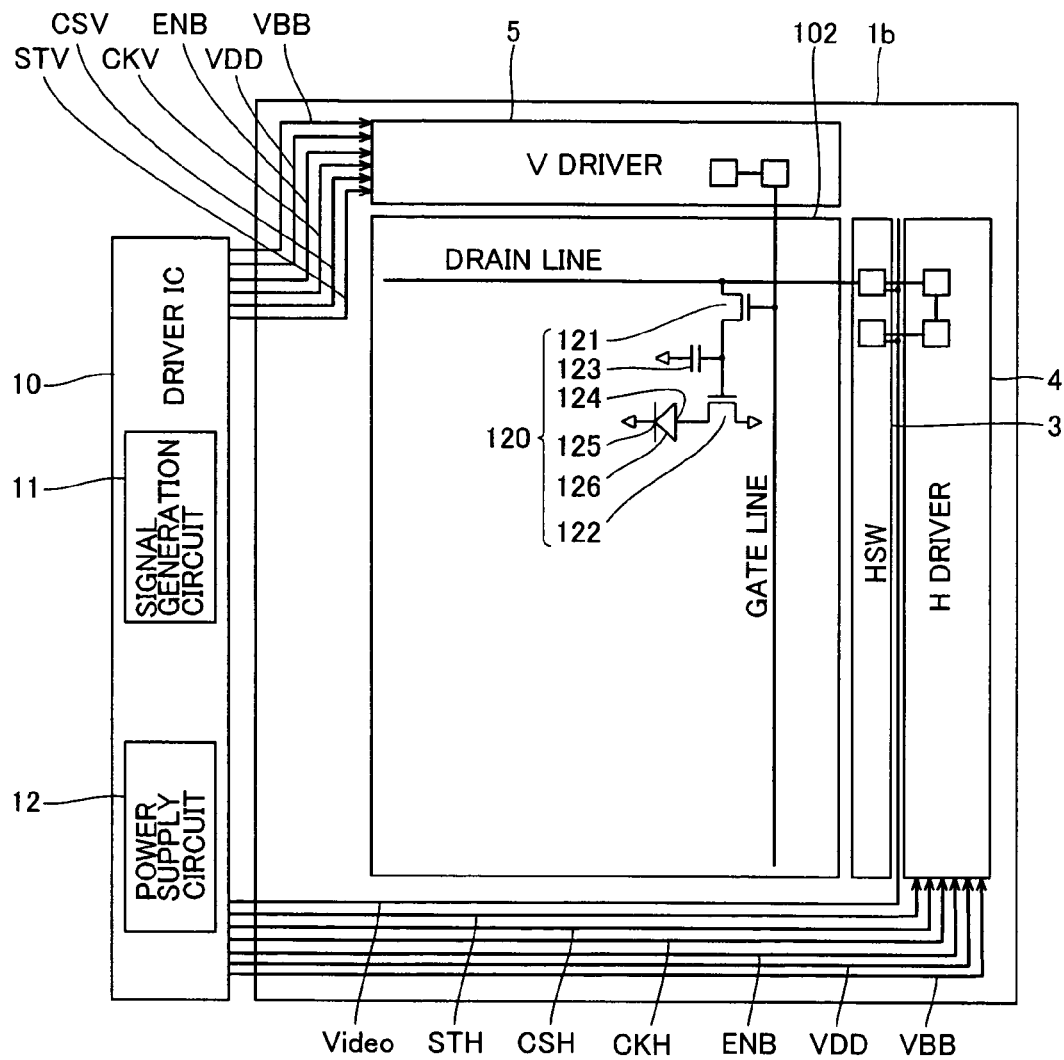
FIG. 16 is a plan view showing an organic EL display according to an eighth embodiment of the present invention.

Referring to FIG. 16, the present invention is applied to an organic EL display including pixels having n-channel transistors according to an eighth embodiment of the present invention.

In the organic EL display according to the eighth embodiment, a display portion 102 is formed on a substrate 1b, as shown in FIG. 16. Pixels 120 each including n-channel transistors 121 and 122 (hereinafter referred to as transistors 121 and 122), a subsidiary capacitor 123, an anode 124, a cathode 125 and an organic EL element 126 held between the anode 124 and the cathode 125 are arranged on the display portion 102 in the form of a matrix. FIG. 16 shows only one of the pixels 120 on the display portion 102. The source of the transistor 121 is connected to the gate of the transistor 122 and a first electrode of the subsidiary capacitor 123, while the drain thereof is connected to a drain line. The gate of this transistor 121 is connected to a gate line. The source of the transistor 122 is connected to the anode 124, while the drain thereof is connected to a current supply line (not shown).

The circuit structure of an H driver 4 is similar to that of the H driver 4 according to the seventh embodiment shown in FIG. 15. The circuit structure of a V driver 5 is similar to that of the V driver 5 according to the first embodiment shown in FIG. 2. The remaining structure of the organic EL display according to the eighth embodiment is similar to that of the liquid crystal display according to the first embodiment shown in FIG. 1.

According to the eighth embodiment, the organic EL display having the aforementioned structure can attain effects similar to those of the aforementioned first and seventh embodiments such that the same can inhibit logic composition circuit portions from outputting video signals and shift output signals to corresponding gate lines and corresponding drain lines at unintentional timing respectively.

Ninth Embodiment

Figure 17:
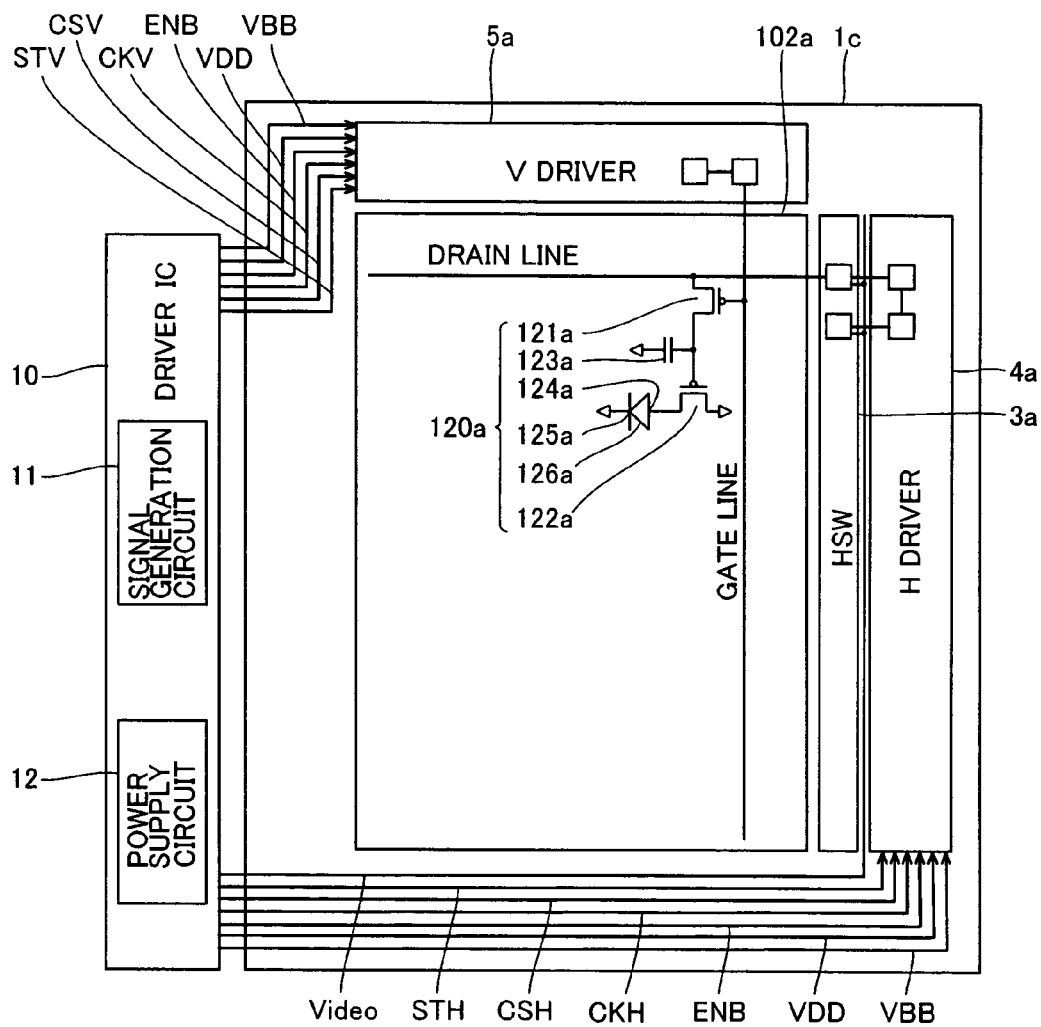
FIG. 17 is a plan view showing an organic EL display according to a ninth embodiment of the present invention.
Figure 18:
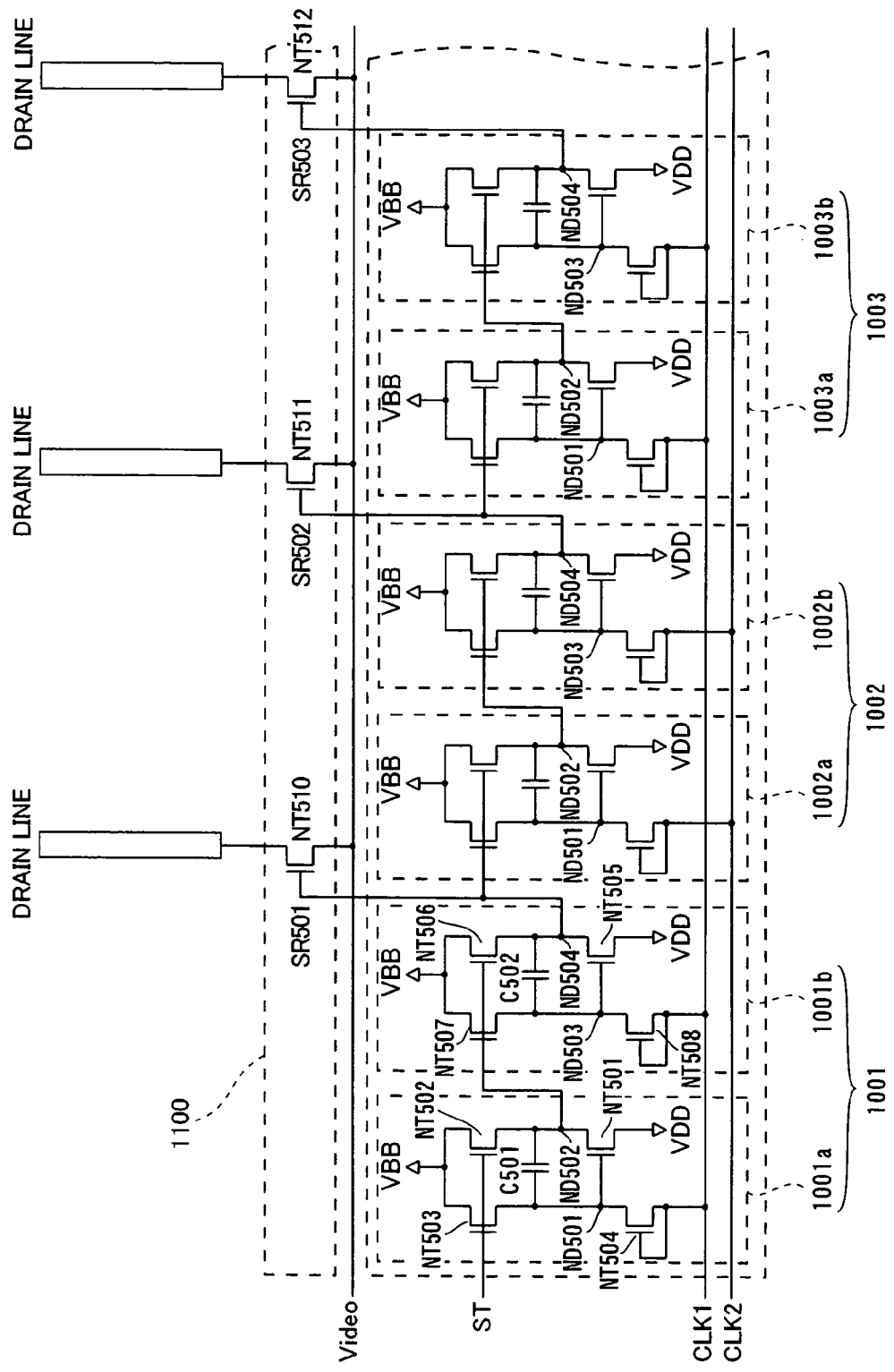
FIG. 18 is a circuit diagram for illustrating the circuit structure of a shift register circuit driving drain lines of an exemplary conventional display.

Referring to FIG. 17, the present invention is applied to an organic EL display including pixels having p-channel transistors according to a ninth embodiment of the present invention.

In the organic EL display according to the ninth embodiment, a display portion 102a is formed on a substrate 1c, as shown in FIG. 17. Pixels 120a each including p-channel transistors 121a and 122a (hereinafter referred to as transistors 121a and 122a), a subsidiary capacitor 123a, an anode 124a, a cathode 125a and an organic EL element 126a held between the anode 124a and the cathode 125a are arranged on the display portion 102a in the form of a matrix. FIG. 17 shows only one of the pixels 120a on the display portion 102a. The source of the transistor 121a is connected to a drain line, while the drain thereof is connected to the gate of the transistor 122a and a first electrode of the subsidiary capacitor 123a. The gate of this transistor 121a is connected to a gate line. The source of the transistor 122a is connected to a current supply line (not shown), while the drain thereof is connected to the anode 124a.

The circuit structure of a V driver 5a is similar to that of the V driver 5a according to the second embodiment shown in FIG. 5. The remaining structure of the organic EL display according to the ninth embodiment is similar to that of the liquid crystal display according to the second embodiment shown in FIG. 4.

According to the ninth embodiment, the organic EL display having the aforementioned structure can attain effects similar to those of the aforementioned second embodiment such that the same can inhibit logic composition circuit portions from outputting shift output signals to corresponding gate lines at unintentional timing.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a liquid crystal display or an organic EL display in each of the aforementioned first to ninth embodiments, the present invention is not restricted to this but is also applicable to a display other than the liquid crystal display and the organic EL display.

While the present invention is applied to only either a V driver or an H driver in each of the aforementioned first to seventh embodiments, the present invention is not restricted to this but may be applied to both of V and H drivers.

While all transistors employed for the inventive H driver are constituted of n-channel transistors in the aforementioned seventh embodiment, the present invention is not restricted to this but all transistors employed for the inventive H driver may alternatively be constituted of p-channel transistors.

In each of the first, third, fifth, seventh and eighth embodiments employing n-channel transistors, all capacitors may be constituted of n-channel transistors. In each of the second, fourth, sixth and ninth embodiments employing p-channel transistors, all capacitors may be constituted of p-channel transistors.

What is claimed is:

1. A display comprising a shift register circuit including:
   a first shift register circuit portion outputting a first shift signal;
   a second shift register circuit portion arranged subsequently to said first shift register circuit portion for outputting a second shift signal; and
   a logic composition circuit portion, constituted of a plurality of first conductive type transistors turned on with a first voltage supply source, receiving said first shift signal and said second shift signal and outputting a shift output signal by logically compositing said first shift signal and said second shift signal with each other, wherein
   at least either said first shift register circuit portion or said second shift register circuit portion includes a reset transistor for resetting the voltage supply source of a node outputting said first shift signal or said second shift signal to a second voltage supply source not turning on said transistors of said logic composition circuit portion in response to a prescribed drive signal
   wherein said prescribed drive signal is a start signal for starting scanning by said shift register circuit, and
   wherein said transistors of said logic composition circuit portion include:
   a second transistor having either the source or the drain connected to a first signal line supplying a first signal switched between said first voltage supply source and said second voltage supply source with the gate receiving said first shift signal, and
   a third transistor having either the source or the drain connected to either the drain or the source of said second transistor with the gate receiving said second shift signal,
   so that the display outputs said shift output signal of said first voltage supply source through said second transistor and said third transistor by turning on said second transistor and said third transistor and supplying said first signal of said first voltage supply source to either the source or the drain of said second transistor from said first signal line when said first shift signal and said second shift signal are at said first voltage supply source, and
   outputs said shift output signal of said second voltage supply source through said second transistor and said third transistor by supplying said first signal of said second voltage supply source to either the source or the drain of said second transistor from said first signal line when changing said first shift signal from said first voltage supply source to said second voltage supply source.

2. The display according to claim 1, wherein
   both of said first shift register circuit portion and said second shift register circuit portion include said reset transistors.

3. The display according to claim 1, wherein
   at least either said first shift register circuit portion or said second shift register circuit portion includes a precedent first circuit portion and a subsequent second circuit portion,
   said second circuit portion includes a first conductive type first transistor connected between said second voltage supply source and said node outputting said first shift signal or said second shift signal with the gate connected to an output node of said first circuit portion, and
   said reset transistor has a function of resetting said output node of said first circuit portion to said first voltage supply source in response to said prescribed drive signal,
   so that the display resets said node of said second circuit portion outputting said first shift signal or said second shift signal to said second voltage supply source by turning on said first transistor in response to an operation of said reset transistor resetting said output node of said first circuit portion to said first voltage supply source.

4. The display according to claim 3, wherein
   said reset transistor is connected between said first voltage supply source and said output node of said first circuit portion with the gate connected to a first drive signal line supplying said prescribed drive signal.

5. The display according to claim 4, wherein
said first drive signal line is a start signal line supplying said start signal for starting scanning by said shift register circuit as said prescribed drive signal.

6. The display according to claim 1, forcibly holding said shift output signal at said second voltage supply source while said first signal is at said second voltage supply source.

7. The display according to claim 1, wherein
said logic composition circuit portion includes a voltage supply source fixing circuit portion for fixing said shift output signal to said second voltage supply source after changing said first shift signal from said first voltage supply source to said second voltage supply source.

8. The display according to claim 1, wherein
said first shift register circuit portion includes a fourth transistor having the drain supplied with at least said first voltage supply source with the gate connected to said node outputting said first shift signal and a first capacitor connected between the gate and the source of said fourth transistor, and
said second shift register circuit portion includes a fifth transistor having the drain supplied with at least said first voltage supply source with the gate connected to said node outputting said second shift signal and a second capacitor connected between the gate and the source of said fifth transistor.

9. The display according to claim 8, connecting said first signal line supplying said first signal switched between said first voltage supply source and said second voltage supply source to the drain of said fourth transistor and supplying a first clock signal to the gate of said fourth transistor,
connecting said first signal line supplying said first signal to the drain of said fifth transistor and supplying a second clock signal to the gate of said fifth transistor, and
switching said first signal from said second voltage supply source to said first voltage supply source after changing said first clock signal from said second voltage supply source to said first voltage supply source and after changing said second clock signal from said second voltage supply source to said first voltage supply source respectively.

10. The display according to claim 8, connecting a second signal line supplying a second signal switched between said first voltage supply source and said second voltage supply source to the drain of said fourth transistor and supplying a first clock signal to the gate of said fourth transistor,
connecting a third signal line supplying a third signal switched between said first voltage supply source and said second voltage supply source to the drain of said fifth transistor and supplying a second clock signal to the gate of said fifth transistor,
switching said second signal from said second voltage supply source to said first voltage supply source after changing said first clock signal from said second voltage supply source to said first voltage supply source, and
switching said third signal from said second voltage supply source to said first voltage supply source after changing said second clock signal from said second voltage supply source to said first voltage supply source.

11. The display according to claim 8, wherein
said reset transistor also has a function of resetting the voltage supply source of the source of said fourth transistor or said fifth transistor to said second voltage supply source in response to said prescribed drive signal.

12. The display according to claim 1, applying said shift register circuit to at least either a shift register circuit for driving a gate line or a shift register circuit for driving a drain line.

13. The display according to claim 1, wherein
transistors constituting said first shift register circuit portion and said second shift register circuit portion and said transistors constituting said logic composition circuit portion as well as said reset transistor are of a first conductive type.

14. The display according to claim 1, formed by either a liquid crystal display or an EL display.

15. A display comprising a shift register circuit including:
a plurality of shift register circuit portion subsequently outputting a shift signal to a subsequent shift register circuit on the basis of a start signal;
a logic composition circuit portion, constituted of a plurality of first conductive type transistors turned on with a first voltage supply source, connected to a node outputting said shift signal, and outputting a shift output signal by logically compositing said output signals with each other, wherein
said shift register circuit portion includes a reset transistor for resetting the voltage supply source of said node outputting said shift signal to a second voltage supply source not turning on said transistors of said logic composition circuit portion in response to said start signal,
wherein said transistors of said logic composition circuit portion include:
a second transistor having either the source or the drain connected to a first signal line supplying a first signal switched between said first voltage supply source and said second voltage supply source with the gate receiving said first shift signal, and
a third transistor having either the source or the drain connected to either the drain or the source of said second transistor with the gate receiving said second shift signal,
so that the display outputs said shift output signal of said first voltage supply source through said second transistor and said third transistor by turning on said second transistor and said third transistor and supplying said first signal of said first voltage supply source to either the source or the drain of said second transistor from said first signal line when said first shift signal and said second shift signal are at said first voltage supply source, and
outputs said shift output signal of said second voltage supply source through said second transistor and said third transistor by supplying said first signal of said second voltage supply source to either the source or the drain of said second transistor from said first signal line when changing said first shift signal from said first voltage supply source to said second voltage supply source.

* * * * *